(12) United States Patent
Arigane et al.

(10) Patent No.: US 7,687,845 B2
(45) Date of Patent: Mar. 30, 2010

(54) NONVOLATILE SEMICONDUCTOR STORAGE DEVICE HAVING AN ELEMENT FORMATION REGION AND A PLURALITY OF ELEMENT ISOLATION REGIONS AND MANUFACTURING METHOD OF THE SAME

(75) Inventors: Tsuyoshi Arigane, Akishima (JP); Digh Hisamoto, Kokubunji (JP); Yasuhiro Shimamoto, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 42 days.

(21) Appl. No.: 11/943,909

(22) Filed: Nov. 21, 2007

(65) Prior Publication Data
US 2008/0142876 A1   Jun. 19, 2008

(30) Foreign Application Priority Data
Dec. 15, 2006   (JP)   ............................. 2006-338386

(51) Int. Cl.
*H01L 29/76* (2006.01)
*H01L 29/788* (2006.01)
*H01L 29/792* (2006.01)

(52) U.S. Cl. ...................... 257/314; 257/315; 257/324; 257/325; 257/326; 257/E29.309

(58) Field of Classification Search ......... 257/314–315, 257/324–326, E29.309
See application file for complete search history.

(56) References Cited

U.S. PATENT DOCUMENTS

| | | | | |
|---|---|---|---|---|
| 5,453,388 A | * | 9/1995 | Chen et al. .................. | 438/266 |
| 5,477,068 A | * | 12/1995 | Ozawa ......................... | 257/214 |
| 5,930,631 A | * | 7/1999 | Wang et al. .................. | 438/286 |
| 5,933,721 A | * | 8/1999 | Hause et al. ................. | 438/217 |
| 6,091,104 A | * | 7/2000 | Chen ............................ | 257/326 |
| 6,323,517 B1 | * | 11/2001 | Park et al. .................... | 257/326 |
| 6,791,139 B2 | * | 9/2004 | Noro et al. ................... | 257/314 |
| 6,800,901 B2 | * | 10/2004 | Moroni et al. ............... | 257/336 |
| 6,833,582 B2 | * | 12/2004 | Mine et al. ................... | 257/326 |
| 6,885,058 B2 | * | 4/2005 | Wils et al. .................... | 257/316 |
| 6,888,194 B2 | * | 5/2005 | Yoshino ....................... | 257/324 |
| 7,045,848 B2 | * | 5/2006 | Shukuri ....................... | 257/311 |
| 7,087,955 B2 | * | 8/2006 | Kawashima et al. ........ | 257/316 |
| 7,259,423 B2 | * | 8/2007 | Min et al. ..................... | 257/324 |
| 2002/0130350 A1 | | 9/2002 | Shin et al. .................... | 257/314 |
| 2005/0199940 A1 | | 9/2005 | Mine et al. | |
| 2005/0269663 A1 | * | 12/2005 | Minami et al. ............... | 257/510 |
| 2006/0028868 A1 | | 2/2006 | Okazaki et al. ......... | 365/185.05 |
| 2006/0033141 A1 | * | 2/2006 | Okazaki et al. ............. | 257/301 |

FOREIGN PATENT DOCUMENTS

| | | |
|---|---|---|
| JP | 2002-280467 | 9/2002 |
| JP | 2006-049737 | 2/2006 |

* cited by examiner

*Primary Examiner*—Ida M Soward
(74) *Attorney, Agent, or Firm*—Mattingly & Malur, P.C.

(57) ABSTRACT

A charge trapping layer in an element isolation region and that in an isolation region between a memory transistor and a selection transistor are removed so that the charges are not injected or trapped in the regions. Also, in an element isolation region, gate electrodes of each memory transistor are united at a position higher than a gate electrode of the selection transistor from a surface of a silicon substrate in an element isolation region, thereby reducing the capacitance between the memory transistor and the selection transistor.

13 Claims, 55 Drawing Sheets 00001      00002

A-A'

NONVOLATILE SEMICONDUCTOR STORAGE DEVICE HAVING AN ELEMENT FORMATION REGION AND A PLURALITY OF ELEMENT ISOLATION REGIONS AND MANUFACTURING METHOD OF THE SAME

CROSS-REFERENCE TO RELATED APPLICATION

The present application claims priority from Japanese Patent Application No. JP 2006-338386 filed on Dec. 15, 2006, the content of which is hereby incorporated by reference into this application.

TECHNICAL FIELD OF THE INVENTION

The present invention relates to a nonvolatile semiconductor storage device. More particularly, it relates to a technology effective for achieving the high reliability and the high-speed operation of a MONOS (metal oxide nitride oxide semiconductor) memory cell.

BACKGROUND OF THE INVENTION

A nonvolatile memory is known as one of the integrated semiconductor memories incorporated in an LSI. This is the element in which stored information is not lost even when the power of the LSI is turned off and is an extremely important element for using the LSI in the various applications. Information can be stored in the nonvolatile memory by various methods. As the nonvolatile memories in which information is stored by means of the amount of trapped charges of electrons and holes, for example, the so-called floating-gate memory in which charges are trapped in a conductive material and the so-called MONOS memory in which charges are trapped in an insulating material are known. Since the MONOS memory cell has the well-known transistor structure except for that of the gate insulating film, it has been known that the MONOS memory cell can be formed in a manner consistent with the CMOS LSI process.

Further, as the applications of the memory cell with the MONOS structure, the application to the large-capacity data storage having the structure in which a floating gate of a NAND flash memory cell is replaced with the MONOS structure is known (Japanese Patent Application Laid-Open Publication No. 2002-280467 (Patent Document 1)). In addition, the application to the embedded microcomputer capable of high-speed writing or erasing and having the structure in which a selection gate is disposed adjacent to a memory gate having the MONOS structure is also known (Japanese Patent Application Laid-Open Publication No. 2006-49737 (Patent Document 2)). Since each memory cell is constituted of one transistor in the former structure, it is possible to reduce the memory cell area. Further, since high-energy charges such as electrons and holes can be used owing to the selection gate disposed adjacent to the memory gate in the latter structure, the high-speed operations in writing or erasing can be achieved. The present invention particularly relates to a technology for achieving the high reliability and the high-speed operation of a memory cell to be applied to the embedded microcomputer described above.

As the writing/erasing operation of a memory cell applied to an embedded microcomputer, the operation in which the charges with different signs are injected instead of injecting and emitting the charges with the same sign, thereby rewriting the stored information has been known (Patent Document 2).

An equivalent circuit of the memory cell described in the Patent Document 2 is shown in FIG. 1, and a cross-sectional structure of the device is shown in FIG. 2 and FIG. 3. FIG. 2 is a cross-sectional view of the memory cell in a source-drain direction and FIG. 3 is a cross-sectional view taken along the line A-A' in FIG. 2, which shows a cross section in an extending direction of a memory gate. First, the description will be made with reference to FIG. 2. In FIG. 2, a part of the gate insulating film of a memory gate (00002) is a charge trapping layer (00004) and is made of, for example, a silicon nitride film. As an upper layer and a lower layer of the charge trapping layer, insulating films are disposed, and silicon oxide films are used for the insulating films. As described above, the so-called MONOS structure in which a silicon nitride film is sandwiched between silicon oxide films is formed. Next, the description will be made with reference to FIG. 3. In the cross-sectional view of FIG. 3, element isolation insulating films (00006) are formed in a semiconductor substrate (00005), by which the interference of current between adjacent memory cells is prevented and elements are isolated from each other. Further, the region where an element isolation insulating film is present serves as an element isolation region. In other words, the region between the element isolation insulating films serves as an element formation region. More specifically, the region where the element isolation insulating film is not present serves as the element formation region. Also, as is apparent from FIG. 2 and FIG. 3, the conventional memory cell has the structure in which a silicon nitride film to be a charge trapping layer is present also on the element isolation insulating film in the element isolation region.

Next, the operation of the memory cell will be described. As the basic operations of the memory cell, four states such as (1) writing; (2) erasing; (3) holding; and (4) reading are known. Note that the names for these four states are used by way of example, and writing and erasing may be called in an opposite way. Further, the operations will be described based on representative examples, but various different operations have been proposed. Although a memory cell formed of an n MOS will be described here as an example, the memory cell can be formed of a p MOS in the same manner in principle.

(1) The writing operation will be described below. In the writing operation, positive potential is applied to the diffusion layer on the memory gate side (00003), and ground potential equal to that of the semiconductor substrate is applied to the diffusion layer on the selection gate electrode side (00003). By applying the high gate overdrive voltage to the memory gate, the channel below the memory gate is put into an ON state. Then, the potential of the selection gate (00001) is set to the value higher than the threshold value by 0.1 to 0.2 V, thereby putting it into an ON state. At this time, since the strongest field occurs in the vicinity of the boundary of the two gates, many hot electrons are generated and injected into the memory gate side. This phenomenon is known as the source side injection (SSI). The hot electron injection by this writing method is characterized in that, since the field is concentrated around the boundary between the selection gate and the memory gate, the injection is concentrated on the end portion of the memory gate on the side of the selection gate. Further, different from the floating-gate type in which the charge trapping layer is formed of a conductive film, the charge trapping layer is formed of an insulating film, and therefore, the injected electrons are not freely moved in the insulating film and the electrons are held in an extremely narrow region.

The erasing operation will be described below. In the erasing operation, negative potential is applied to the memory gate, and positive potential is applied to the diffusion layer on the memory gate side, thereby generating the strong inversion in the region where the memory gate at the end portion of the diffusion layer and the diffusion layer are overlapped. By doing so, the band to band tunneling (BTBT) occurs, and the holes are generated. In this memory cell, the generated holes are accelerated in the channel direction, drawn by the bias of the memory gate, and injected into the ONO film. In this manner, the erasing operation is carried out. More specifically, the threshold value of the memory gate which has been increased by the charges of the electrons can be reduced by the charges of the injected holes.

(3) The holding operation will be described below. In the charge holding operation, charges are held as the charges of carriers injected into the ONO film serving as an insulating film. Since the movement of the carriers in the insulating film is extremely limited and slow, it is possible to appropriately hold the charges even if no voltage is applied to the electrode.

(4) The reading operation will be described below. In the reading operation, positive potential is applied to the diffusion layer on the selection gate side, and positive potential is applied to the selection gate. By doing so, the channel below the selection gate is put into an ON state. Then, an appropriate memory gate potential capable of distinguishing the difference in threshold values of the memory gate given by the writing state and the erasing state (that is, the intermediate potential between the threshold value in the writing state and the threshold value in the erasing state) is applied. By this means, the conduction and non-conduction of the current can be distinguished, and the held charge information can be read by the current amount.

SUMMARY OF THE INVENTION

However, in the memory cell array described in the Patent Document 2 in which a silicon nitride film to be the charge trapping layer is present in the element isolation region, the problems as follows may occur when miniaturization further progresses in the future.

(Problem 1)

The inventors of the present invention have found the following problem in the memory cell of the Patent Document 2. That is, since the hot electron injection by SSI is used as the memory writing method and the hot hole injection by the BTBT is used as the memory erasing method, the charges are injected also to the region other than the charge trapping layer in the element formation region where the charges should be injected, that is, to the charge trapping layer on the element isolation insulating film in the element isolation region (FIG. 55). This is because the hot electron has a kinetic energy other than the components in an in-plane direction of a semiconductor substrate and parallel to the channel direction, and the hot electron having such a kinetic energy is injected to the charge trapping layer by the electric field between the memory gate and the channel region. Also, this phenomenon occurs also in the erasing operation using the hot holes in the same manner.

(Problem 2)

Further, since the charge trapping layer is formed also in the element isolation region, charges such as electrons and holes held in the charge trapping layer in the element formation region are adversely diffused via the charge trapping layer in the element isolation region in the data holding operation. Consequently, due to the electric field from the charge present in the charge trapping layer in the element isolation region other than that just below the memory gate, the gate induced drain leakage (GIDL) is increased, and thus, the resistance to the error writing (disturbance) is deteriorated. Alternatively, it may cause the error reading.

(Problem 3)

Further, in the split-gate MONOS type, since the selection gate and the memory gate are disposed adjacent to each other, the capacitance between adjacent gates and the resistance of respective electrodes directly cause the operation delay. Further, in the case where a silicon nitride film to be the charge trapping layer is disposed just below the memory gate in the element isolation region, since a silicon nitride film has relative permittivity higher than that of a silicon oxide film, the capacitance between electrodes is high in comparison to the case where a silicon oxide film with the same thickness is disposed, which prevents the increase in the memory operation speed. This is because the capacitance of the capacitor constituted of a memory gate and a selection gate includes not only the capacitance between opposed surfaces but also the sum of the parallel capacitance with the capacitance formed by a lower surface and an upper surface. Therefore, it is required that the capacitance formed on the lower surface side of the memory gate is reduced.

(Problem 4)

Further, as described in the problem 3, the capacitance of the memory gate is determined also by the capacitance formed by the opposed surfaces. Also, since the opposed surfaces in the element isolation region are almost completely overlapped with respect to the horizontal direction in the conventional memory cell, the capacitance between electrodes in the memory gate and the selection gate is inevitably increased. In the future, the novel memory array structure capable of reducing the capacitance and achieving the high-speed operation is needed.

(Problem 5)

Further, when the memory cell is designed to have a multi-valued structure, since the intervals between the threshold distributions of the memory cells become narrower compared with the binary memory in general, the deterioration in the resistance to the error writing becomes a serious problem particularly in the case where the memory cell is designed to have a multi-valued structure.

(Problem 6)

Further, since the reduction in the number of process steps leads to the reduction in the number of masks and others, how to manufacture the elements having equivalent performance while reducing the number of masks is the important problem to be solved.

Note that Patent Document 1 discloses the solving method for the deterioration in the memory characteristics due to the charge diffusion in the NAND cell in the problem 2 described above.

However, the problem 1 in the NAND cell is not disclosed. This is because, in the F-N writing-erasing method frequently used in the NAND cell, the charges are not widely injected to reach the charge trapping layer in the element isolation region compared with the SSI writing and BTBT erasing methods. Therefore, the problem 1 is a problem unique to the memory cell employing the hot electron injection method or the hot hole injection method like the SSI writing method.

Further, since the NAND cell of the Patent Document 1 is not of the split-gate type, the technology for achieving the high-speed operation is not described.

Also, in the split-gate memory cell of the Patent Document 2, after embedding an element isolation insulating film, a selection gate is formed, and an ONO film is formed in a self-alignment manner with respect to the selection gate. Therefore, the charge trapping layer is left also in the element isolation region and it is difficult to remove only the charge trapping layer in the element isolation region.

An object of the present invention is to provide a technology capable of improving the reliability of a nonvolatile semiconductor storage device.

Further, another object of the present invention is to provide a technology capable of increasing the operation speed of a nonvolatile semiconductor storage device.

The above and other objects and novel characteristics of the present invention will be apparent from the description of this specification and the accompanying drawings.

The typical ones of the inventions disclosed in this application will be briefly described as follows.

In an aspect of the present invention, a nonvolatile semiconductor storage device comprises: a plurality of element isolation regions formed in a semiconductor substrate and extending in a first direction; an element formation region formed between the plurality of element isolation regions; a pair of semiconductor regions to be a source and a drain formed in the element formation region; a first gate electrode extending in a second direction which intersects with the first direction; a second gate electrode extending in the second direction; and a charge trapping layer formed between the semiconductor substrate and the first gate electrode, wherein the first gate electrode is adjacent to the second gate electrode in the first direction, the first gate electrode and the second gate electrode are formed between the pair of semiconductor regions, the charge tapping layer is formed only in a region where the element formation region and the first gate electrode intersect, and information is written or erased by injecting hot electrons or hot holes into the charge trapping layer.

Accordingly, even when the writing or the erasing of information is performed by injecting the hot electron or the hot hole, since the charge trapping layer is not present in the element isolation region, charges in the element isolation region are not held, and the various problems caused by the held charges can be suppressed. Further, since the charge trapping layer is not present in the element isolation region, the diffusion of the charges from the charge trapping layer in the element formation region to the element isolation region can be suppressed. Still further, since a silicon nitride film which is a material typical as the charge trapping layer and has a relative permittivity higher than that of a silicon oxide film is not present just below the memory gate electrode in the element isolation region, the capacitance between the memory gate electrode and the selection gate electrode can be reduced. In this manner, the reliability and the operation speed can be increased.

In another aspect of the present invention, a nonvolatile semiconductor storage device according to the present invention comprises: a plurality of element isolation regions formed in a semiconductor substrate and extending in a first direction; an element formation region formed between the plurality of element isolation regions; a pair of semiconductor regions to be a source and a drain formed in the element formation region; a first gate electrode extending in a second direction which intersects with the first direction; a second gate electrode extending in the second direction; and a charge trapping layer formed between the semiconductor substrate and the first gate electrode, wherein the first gate electrode is adjacent to the second gate electrode in the first direction, the first gate electrode and the second gate electrode are formed between the pair of semiconductor regions, the charge tapping layer is formed only in a region where the element formation region and the first gate electrode intersect, and a position of a bottom surface of the first gate electrode in the element isolation region is located at a position higher than that of a bottom surface of the second gate electrode in the element isolation region.

Accordingly, since the charge trapping layer is formed only in the region where the element formation region and the first gate electrode intersect, the effect of reducing the capacitance between the first gate electrode and the second gate electrode can be achieved, and further, since the position of the bottom surface of the first gate electrode in the element isolation region is located at the position higher than that of the bottom surface of the second gate electrode in the element isolation region, the overlapped area of the opposed surfaces of the first gate electrode and the second gate electrode in the element isolation region can be reduced or the overlap can be eliminated. Therefore, the substantial capacitance between the electrodes can be further reduced. In this manner, the operation speed can be increased.

In still another aspect of the present invention, a manufacturing method of a nonvolatile semiconductor storage device, comprises the steps of: (a) forming a first gate insulating film including a charge trapping layer on a semiconductor substrate; (b) forming a first conductive material film on the first gate insulating film; (c) removing the first conductive material film in regions to be a plurality of element isolation regions extending in a first direction; (d) removing the charge trapping layer in regions where the first conductive material film has been removed, with using at least a pattern of the first conductive material film as a mask; (e) forming a trench to be the element isolation region by etching a surface of the semiconductor substrate in the region where the first conductive material film has been removed; (f) embedding an element isolation insulating film in the trench; (g) forming a second conductive material film on the element isolation insulating film and the first conductive material film; (h) processing the second conductive material film, the first conductive material film and the first gate insulating film to have patterns extending in a second direction which intersects with the first direction; (i) forming a first insulating film on a sidewall of the first conductive material film; (j) forming a third conductive material film on the semiconductor substrate via the first insulating film; (k) processing the third conductive material film to have a pattern extending in the second direction; and (l) forming a pair of semiconductor regions so as to sandwich the first, second and third conductive material films.

Accordingly, since the charge trapping layer is removed and the surface of the semiconductor substrate in the element isolation region is etched using the first conductive material film to be the memory gate as a mask, the charge trapping layer can be left only in the element formation region without leaving the charge trapping layer in the element isolation region. In other words, the charge trapping layer can be left in the element formation region in a self-alignment manner. Further, since the element isolation region is required not only in the memory cell array region but also for the transistor in the peripheral circuit region, the step of forming the trenches for forming the element isolation insulating film of the transistor is performed simultaneously with the steps in the memory cell array region. By this means, the process steps can be simplified and the cost reduction can be achieved.

The effects obtained by typical aspects of the present invention will be briefly described below.

According to the invention disclosed in this application, the reliability and the operation speed of a nonvolatile semiconductor storage device, in particular, a MONOS memory cell can be increased.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that the same hatching is used for the same components in principle.

First Embodiment

Figure 1:
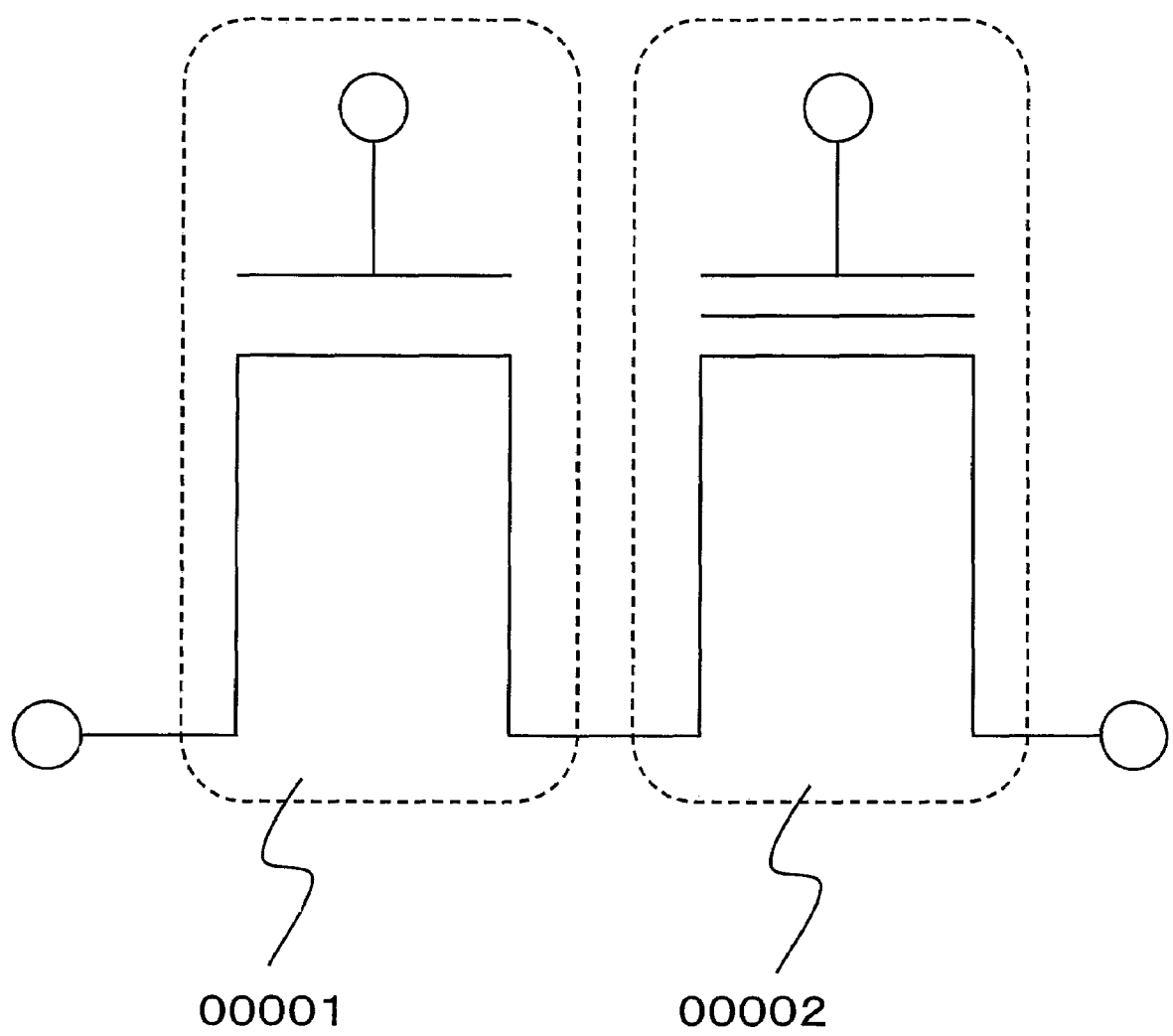
FIG. 1 is a circuit diagram showing a memory cell of a conventional nonvolatile semiconductor storage device.
Figure 2:
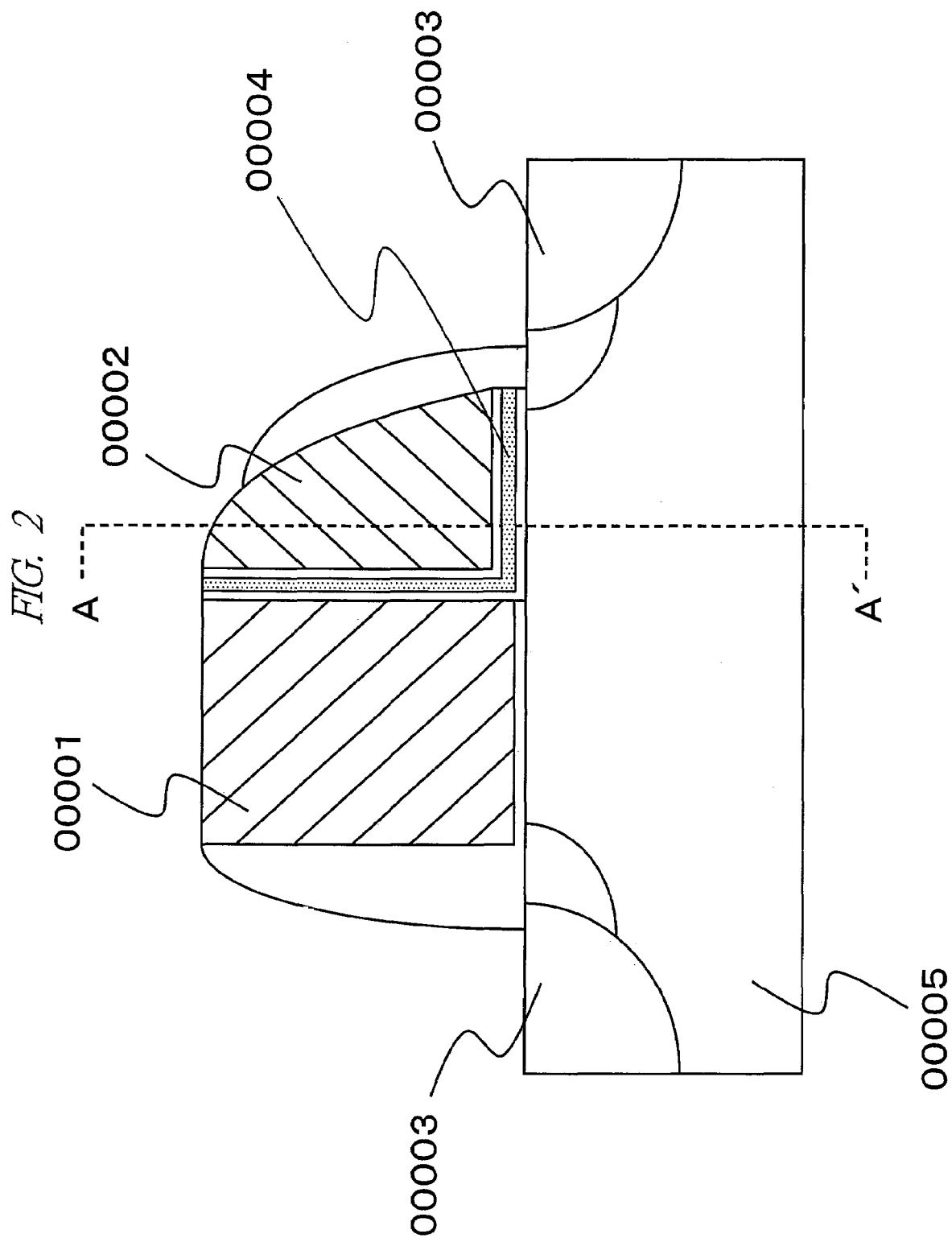
FIG. 2 is a cross-sectional view showing a memory cell of the conventional nonvolatile semiconductor storage device.
Figure 3:
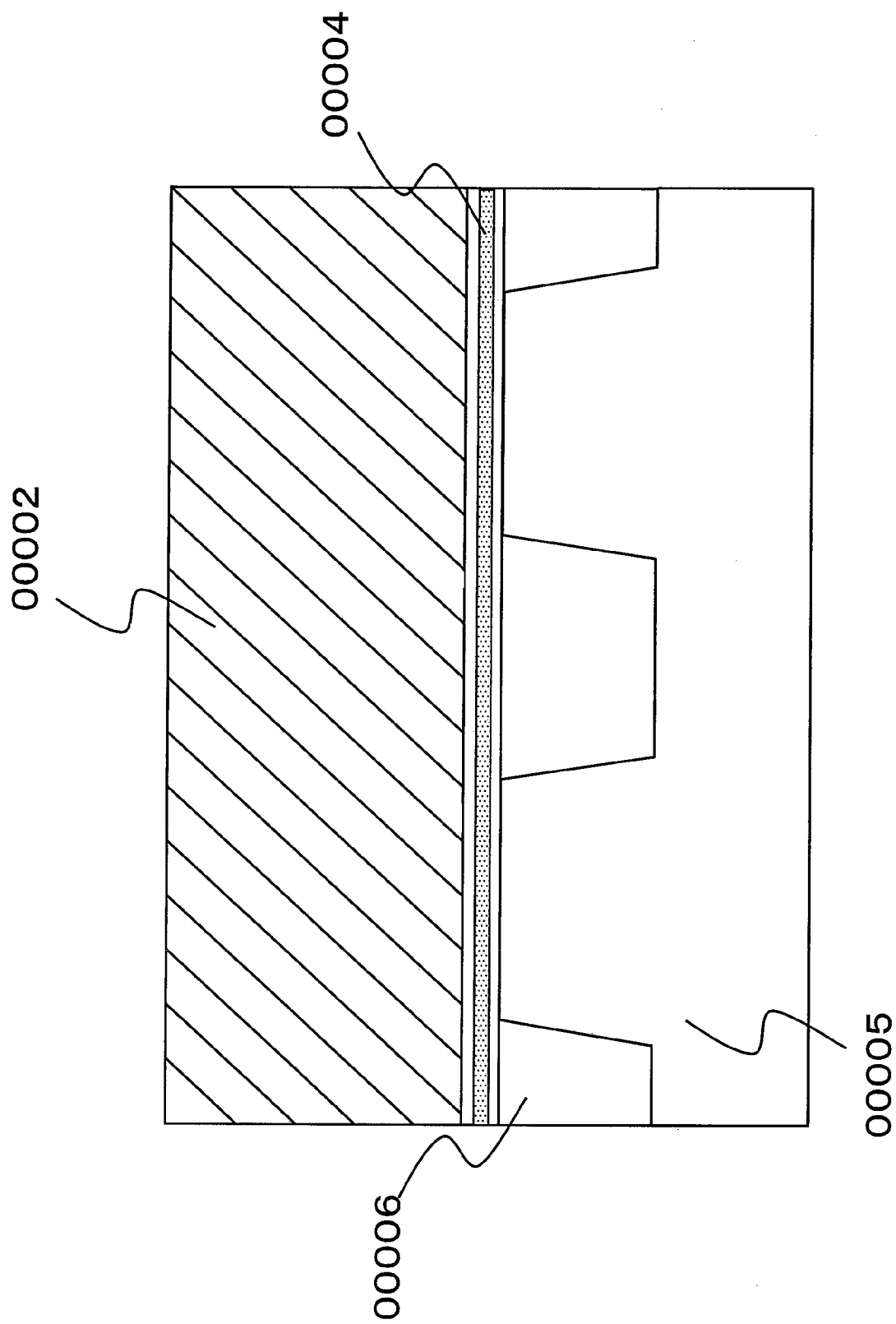
FIG. 3 is a cross-sectional view taken along the line A-A' in FIG. 2.
Figure 4:
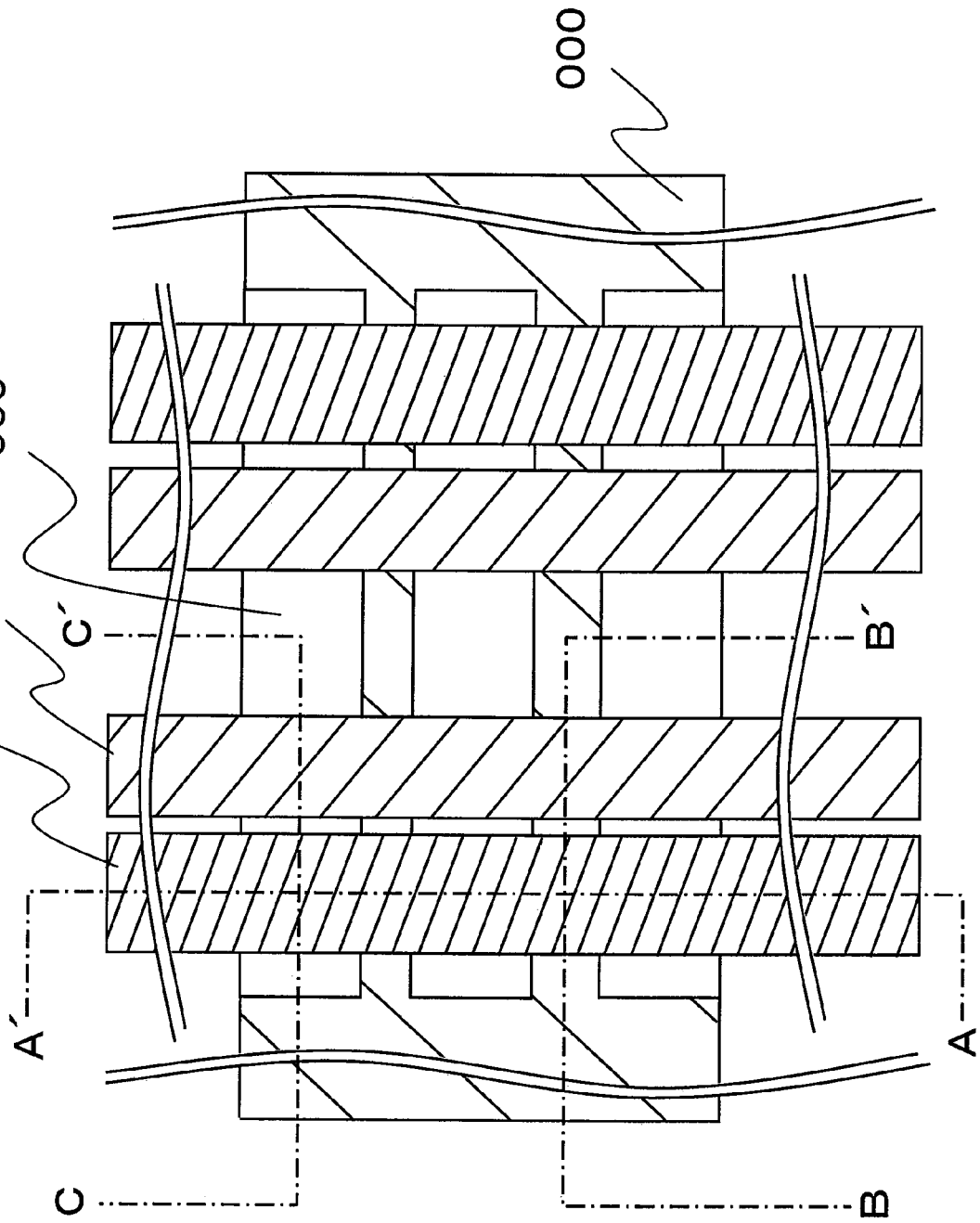
FIG. 4 is a plan view showing the principal part of a memory cell region of a nonvolatile semiconductor integrated storage device according to a first embodiment of the present invention.

FIG. 4 is a plan view of a part of a semiconductor substrate showing an example of a memory cell region in a nonvolatile semiconductor storage device according to the first embodiment. In an element isolation region extending in a lateral direction on surface of a silicon substrate (semiconductor substrate) 000, an element isolation insulating film 009 extending in the lateral direction is formed to prevent the current interference between memory cells adjacent in a longitudinal direction. Also, the region other than that is an element formation region, and a memory cell, a source line and a bit line are formed therein. Further, a gate electrode 010 of a memory transistor (hereinafter, referred to as memory gate or memory gate electrode) extends thereon in the longitudinal direction, and a gate electrode 016 of a selection transistor (hereinafter, referred to as selection gate or selection gate electrode) extends in the longitudinal direction so as to be adjacent to the memory gate electrode 010. In addition, the channel region controlled by the memory gate electrode 010 is formed in the region where the element formation region and the memory gate electrode 010 intersect, and the channel region controlled by the selection gate electrode 016 is formed in the region where the element formation region and the selection gate electrode 016 intersect. The regions other than those are a source region and a drain region, in which impurity regions functioning as wirings to connect the memory cells are formed. It can be understood that four memory cells are provided in this structure in FIG. 4. Also, the memory cells with the structure as described above are disposed in lateral and longitudinal directions so as to form one memory cell array.

Figure 5:
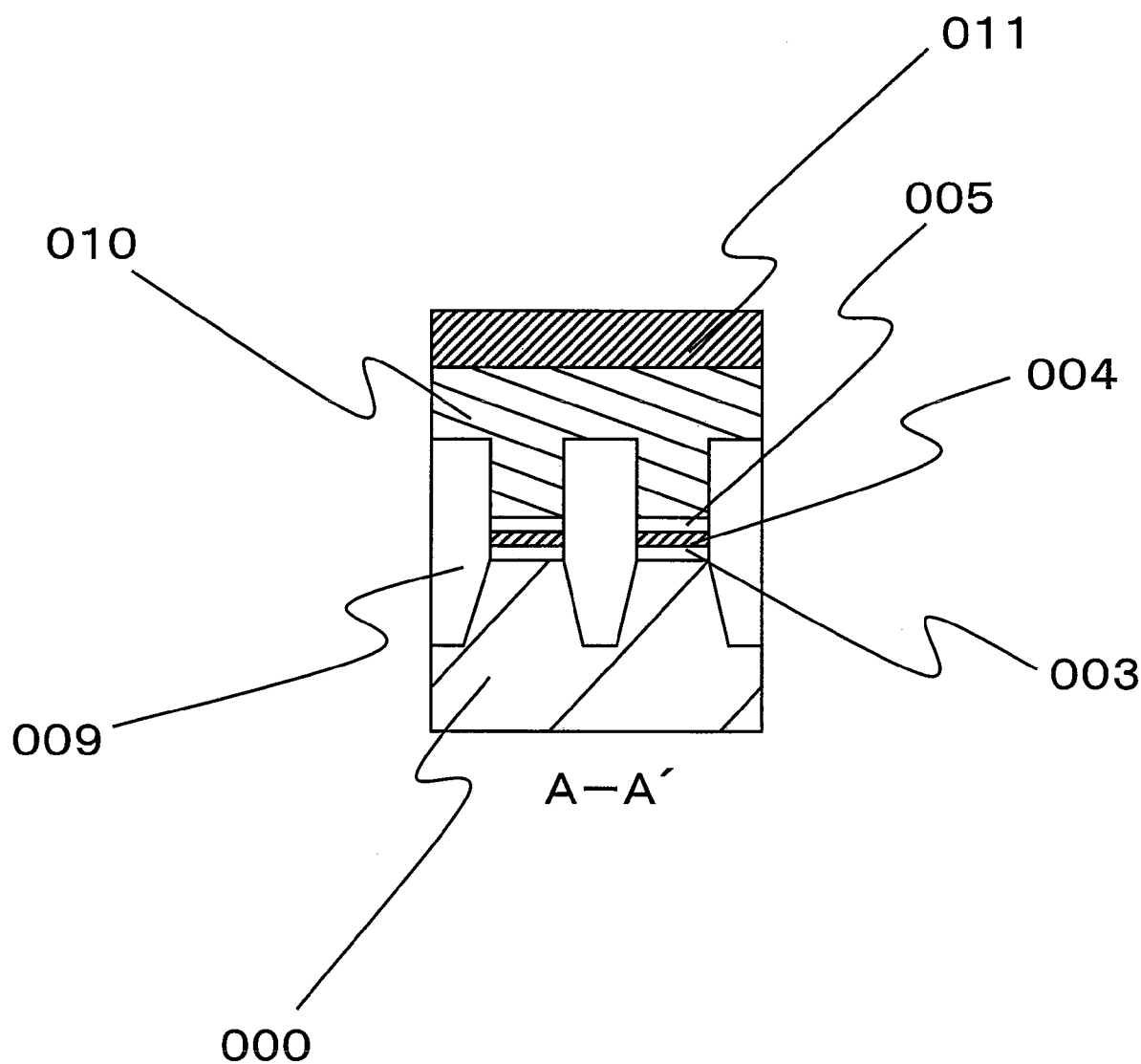
FIG. 5 is a cross-sectional view taken along the line A-A' in FIG. 4.
Figure 6:
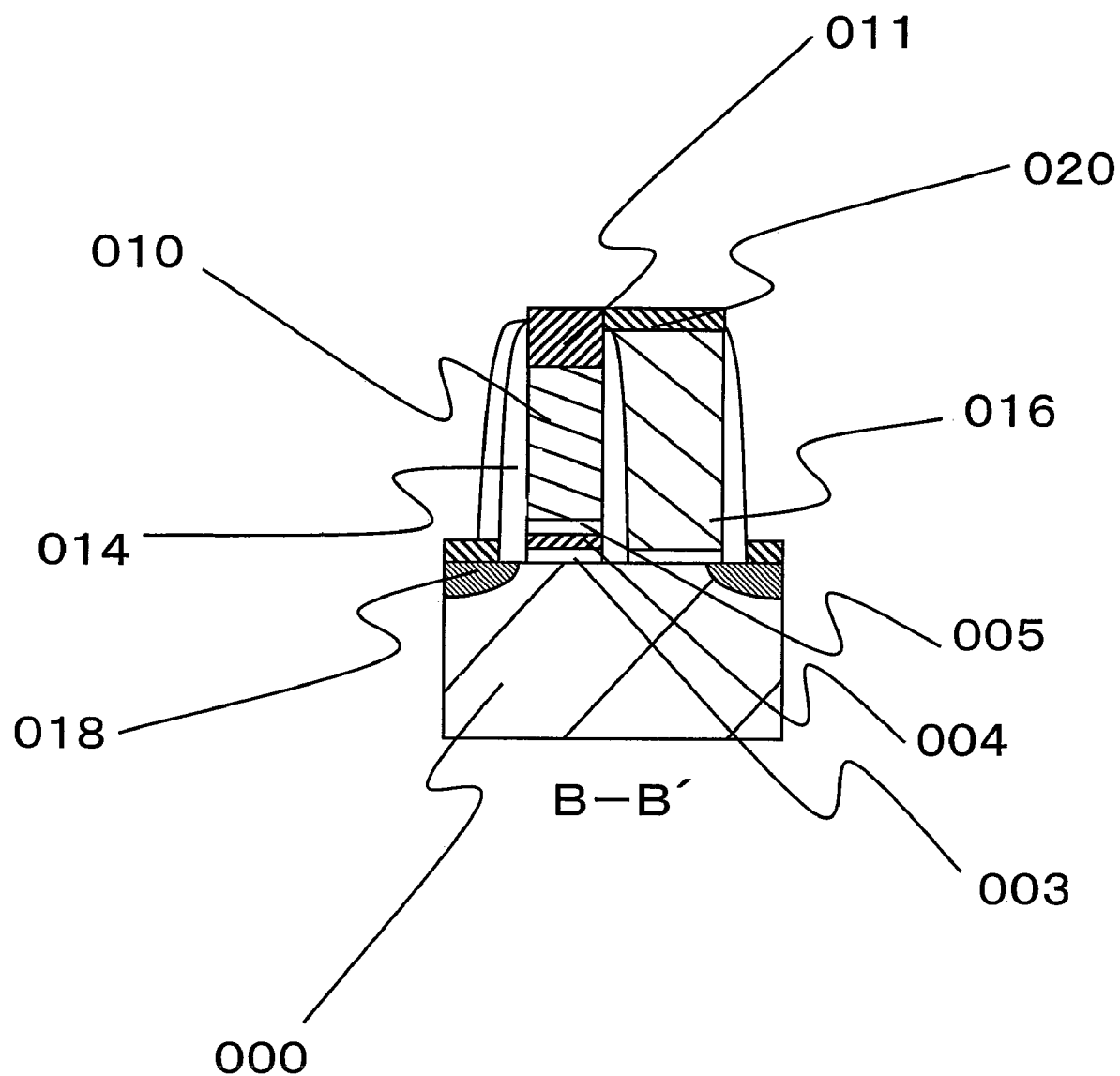
FIG. 6 is a cross-sectional view taken along the line B-B' in FIG. 4.
Figure 7:
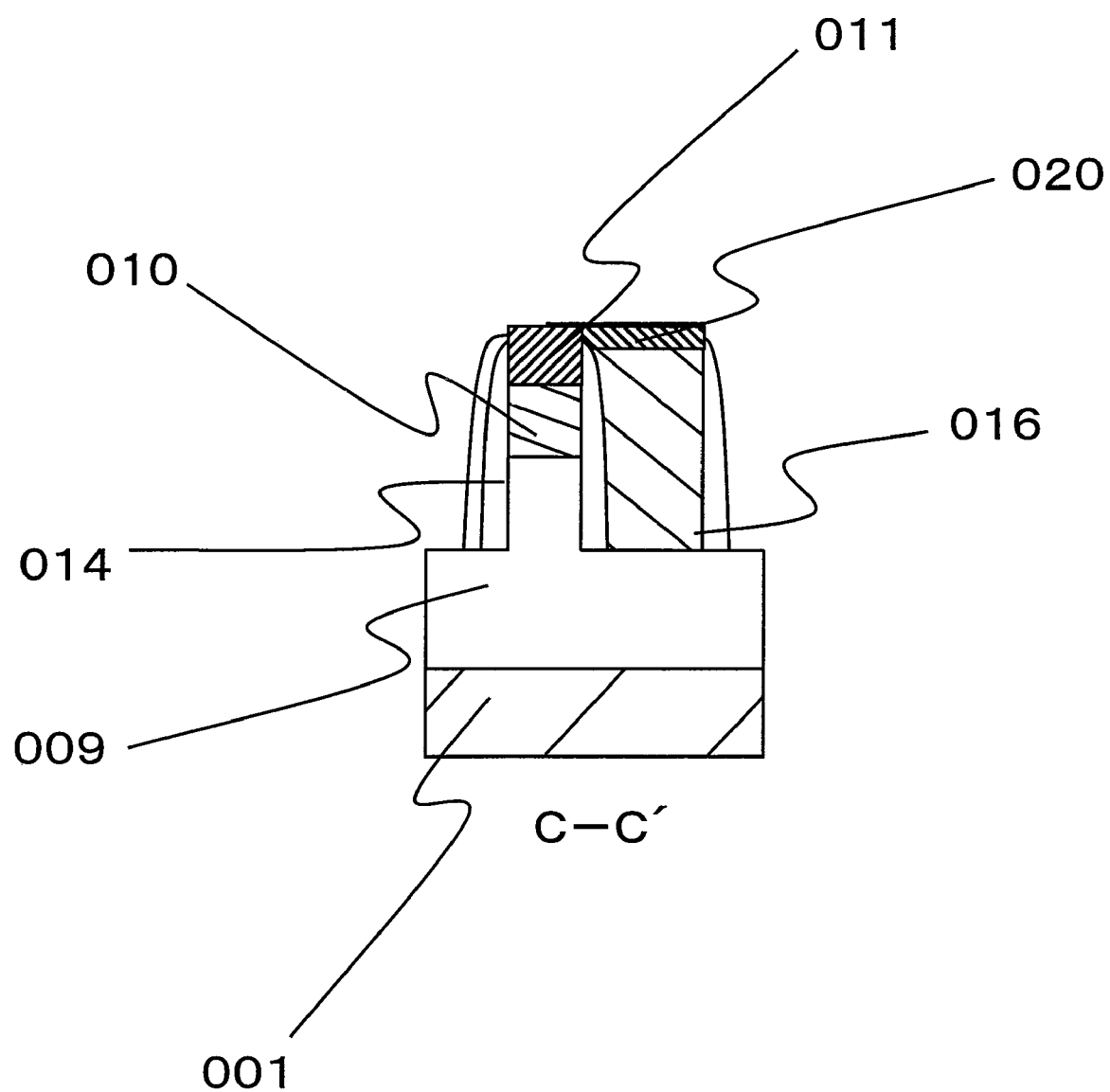
FIG. 7 is a cross-sectional view taken along the line C-C' in FIG. 4.

FIG. 5, FIG. 6 and FIG. 7 are cross-sectional views of the semiconductor substrate each taken along the lines A-A', B-B' and C-C' in FIG. 4. FIG. 5 is a cross-sectional view in the longitudinal direction of the memory gate electrode 010, and the description will be made with reference to FIG. 5. The element isolation insulating films 009 are formed on the silicon substrate 000. Then, the memory gate electrode 010 is formed between and on the element isolation insulating films 009. The memory gate electrode 010 shares an electrode with a memory cell in an extending direction of the memory gate electrode 010. Further, a gate insulating film (insulating film 003, charge trapping layer 004, and insulating film 005) of the memory transistor is formed between the memory gate electrode 010 and the surface of the silicon substrate 000. A part of the gate insulating film is formed of the charge trapping layer 004 and is made of, for example, a silicon nitride film. Further, the insulating films 003 and 005 are formed so as to sandwich the charge trapping layer 004. The insulating films 003 and 005 are, for example, silicon oxide films. By this structure, electrons are trapped in the charge trapping layer 004 and the leakage of the electros to the memory gate 010 side or to the silicon substrate 000 side is prevented. Also, one of the characteristics of the present invention lies in that the charge trapping layer 004 is not formed on the element isolation insulating film 009 formed in the element isolation region. In other words, the charge trapping layer 004 is formed only in the region where the region where the memory gate electrode 010 extends and the element formation region intersect. Accordingly, the problems caused due to that the unnecessary charges are injected to the element isolation region or are moved therein can be efficiently prevented as described above.

Next, the description will be made with reference to FIG. 6. FIG. 6 is a cross-sectional view of an element formation region in a direction vertical to an extending direction of the memory gate electrode 010 and the selection gate electrode 016 and it corresponds to a cross-sectional view showing one memory cell. Note that, in the present invention, the direction is not limited to that vertical to the extending direction, and any direction can be used as long as it intersects with the extending direction of the selection gate electrode 016. The selection transistor and the memory cell transistor are disposed adjacent to each other via an insulating film formed between their gate electrodes 010 and 016. Further, one pair of impurity regions are formed so as to sandwich the memory gate electrode 010 and the selection gate electrode 016 and they constitute a source and a drain of the memory cell. In addition, as described with reference to FIG. 5, the charge trapping layer 004 is disposed in the gate insulating film of the memory gate electrode 010. Note that, as will be apparent from the process flow described later, the charge trapping layer 004 is not formed between the selection gate electrode 016 and the surface of the silicon substrate 000.

Next, the description will be made with reference to FIG. 7. FIG. 7 is a cross-sectional view of an element isolation region in a direction vertical to the extending direction of the selection gate electrode 016. The element isolation insulating film 009 has a convex portion just below the memory gate electrode 010. This is because, when the element isolation insulating film 009 is to be formed, an insulating film is embedded up to above the surface of the silicon substrate 000 and the element isolation insulating film 009 in the region other than that where the memory gate electrode 010 is formed is etched back. Note that, in FIG. 7, only the conductive film for uniting each memory gate electrode 010 in the memory gate electrodes 010 is shown. Further, similar to the description made with reference to FIG. 5, it can be understood that the charge trapping layer 004 is not formed on the element isolation insulating film 009.

Figure 8:
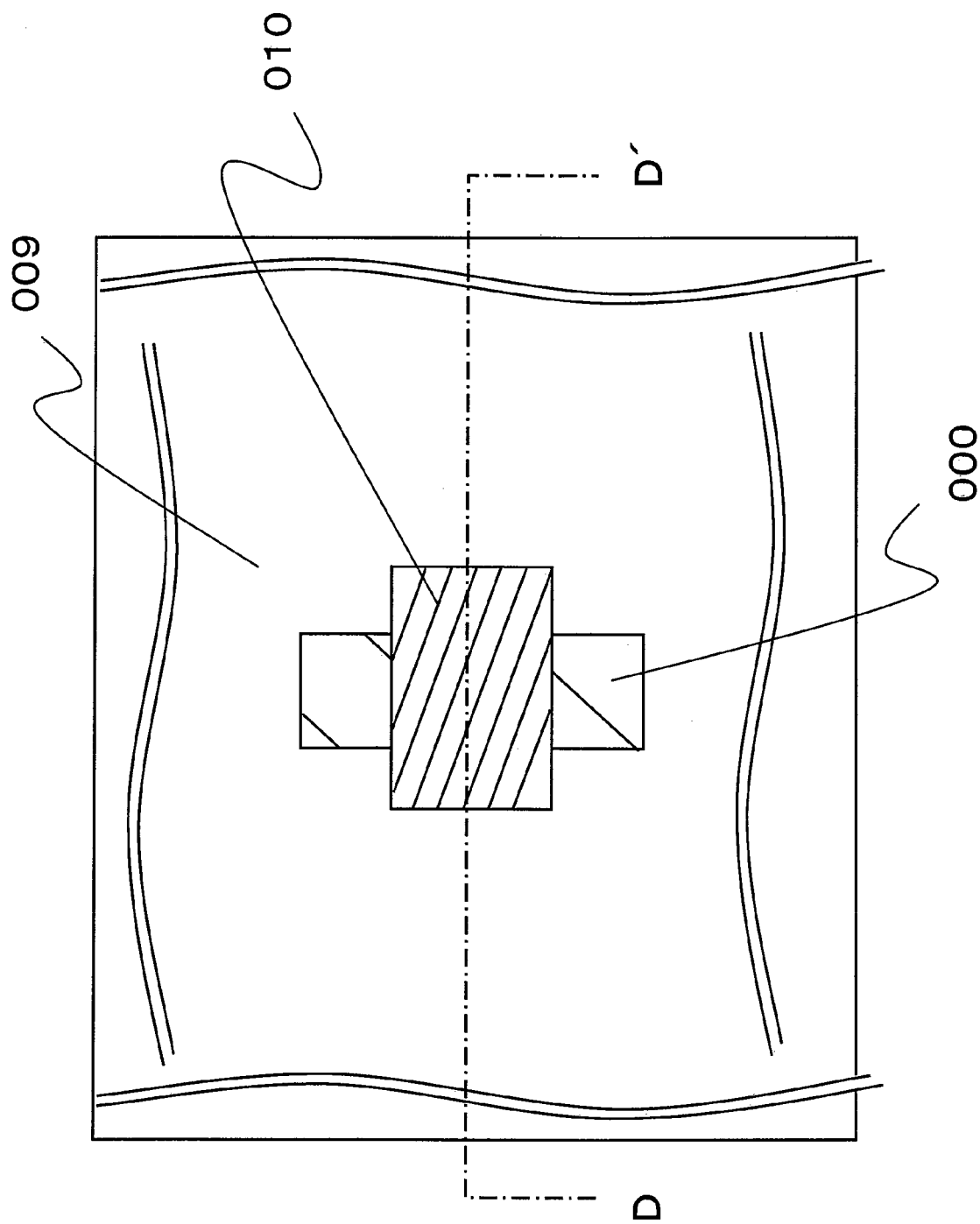
FIG. 8 is a plan view showing the principal part of a peripheral circuit region of the nonvolatile semiconductor integrated storage device according to the first embodiment of the present invention.
Figure 9:
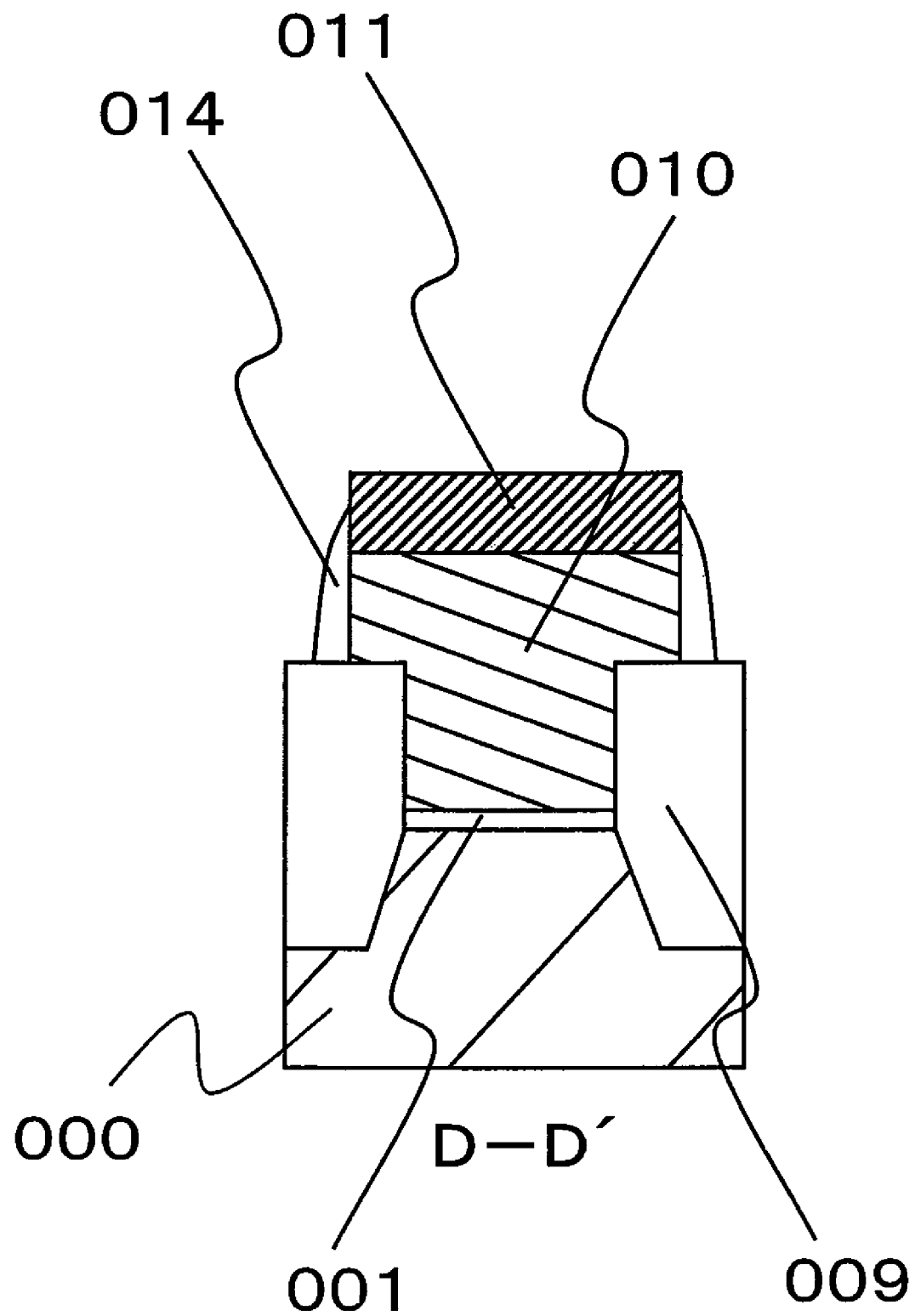
FIG. 9 is a cross-sectional view taken along the line D-D' in FIG. 8.

Next, FIG. 8 and FIG. 9 will be described. FIG. 8 is a plan view showing an example of the peripheral circuit region disposed in the periphery of the memory cell array of the same device, and FIG. 9 is a cross-sectional view taken along the line D-D' in FIG. 8.

First, the description will be made with reference to FIG. 8. Note that such components as the cap insulating film and the contact plug are not shown in the plan view. Although various circuits are disposed in the peripheral circuit region, these circuits are constituted of a plurality of transistors. FIG. 8 shows only one transistor. The transistor is formed in the element formation region and the element formation region is surrounded by the element isolation region having the element isolation insulating film 009 formed therein. Further, the gate electrode 010 of the transistor is formed across the element formation region and the element isolation region except for the regions to be a source electrode and a drain electrode in the element formation region.

Next, the description will be made with reference to FIG. 9. FIG. 9 is a cross-sectional view in a channel width direction. The silicon substrate 000 and the memory gate electrode 010 are opposed to each other via the gate insulating film 001. Also, the width between the element isolation insulating films 009 corresponds to the channel width. Further, the memory gate electrode 010 is formed so as to be overlapped with the element isolation insulating films 009. Although the region for electrically connecting the wiring layer is provided for the memory gate electrode 010 on the element isolation insulating film 009, the region is not shown in FIG. 9. Further, a silicon nitride film 011 functioning as a cap insulating film provided for patterning the memory gate electrode 010 is formed on the gate insulating film 001. In addition, sidewall insulating films made of an insulating film 014 such as a silicon oxide film are formed on the element isolation insulating films 009 and on both sidewalls of the memory gate electrode 010.

Figure 10:
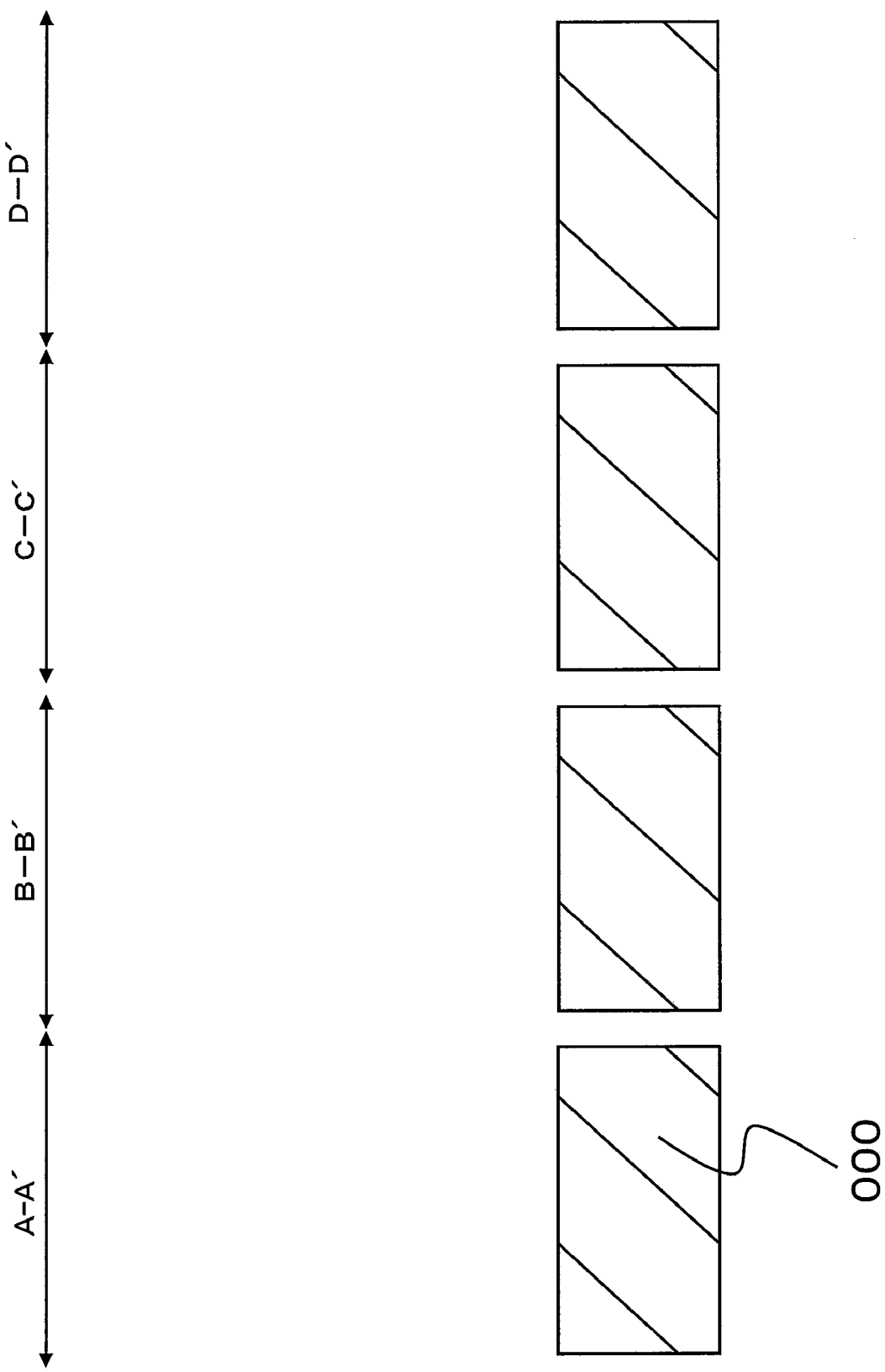
FIG. 10 is a cross-sectional view showing a manufacturing method in the regions including a memory cell and a peripheral circuit of the nonvolatile semiconductor integrated storage device according to the first embodiment of the present invention.

FIG. 10 to FIG. 26 are partial cross-sectional views of a semiconductor substrate showing a manufacturing method of a nonvolatile semiconductor storage device according to the first embodiment. In the figures showing the manufacturing method, the description will be made separately for each of the memory cell region and the peripheral circuit region. The lines A-A' to D-D' in FIG. 10 correspond to the lines A-A' to D-D' in FIG. 4 and FIG. 8. In other words, the region represented by the lines A-A' to C-C' correspond to the cross-sectional views of the memory cell region and the region represented by the line D-D' corresponds to the cross-sectional view of the peripheral circuit region (FIG. 10).

Figure 11:
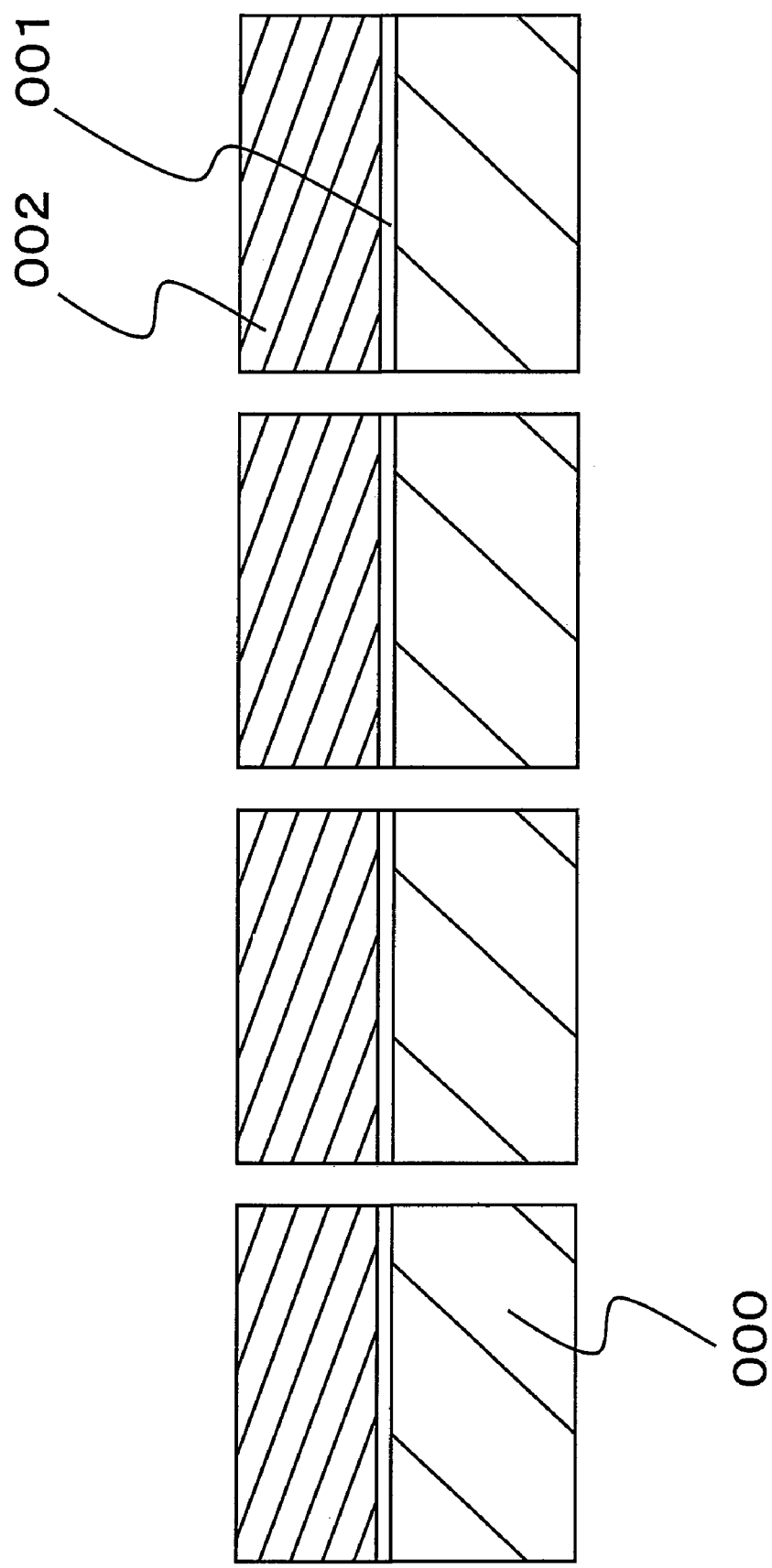
FIG. 11 is a cross-sectional view showing the manufacturing method of the nonvolatile semiconductor integrated storage device continued from FIG. 10.

First, after forming a p well and an n well on the silicon substrate 000, a silicon oxide film 001 to be the gate insulating film of the MOS transistor in the peripheral circuit region is formed by the thermal oxidation on the silicon substrate 000. Thereafter, a polysilicon film 002 to be the gate electrode of the peripheral MOS transistor is deposited by the chemical vapor deposition (CVD) (FIG. 11). At this time, the silicon oxide film 001 can be formed to have various levels of thickness by means of lithography and dry etching.

Figure 12:
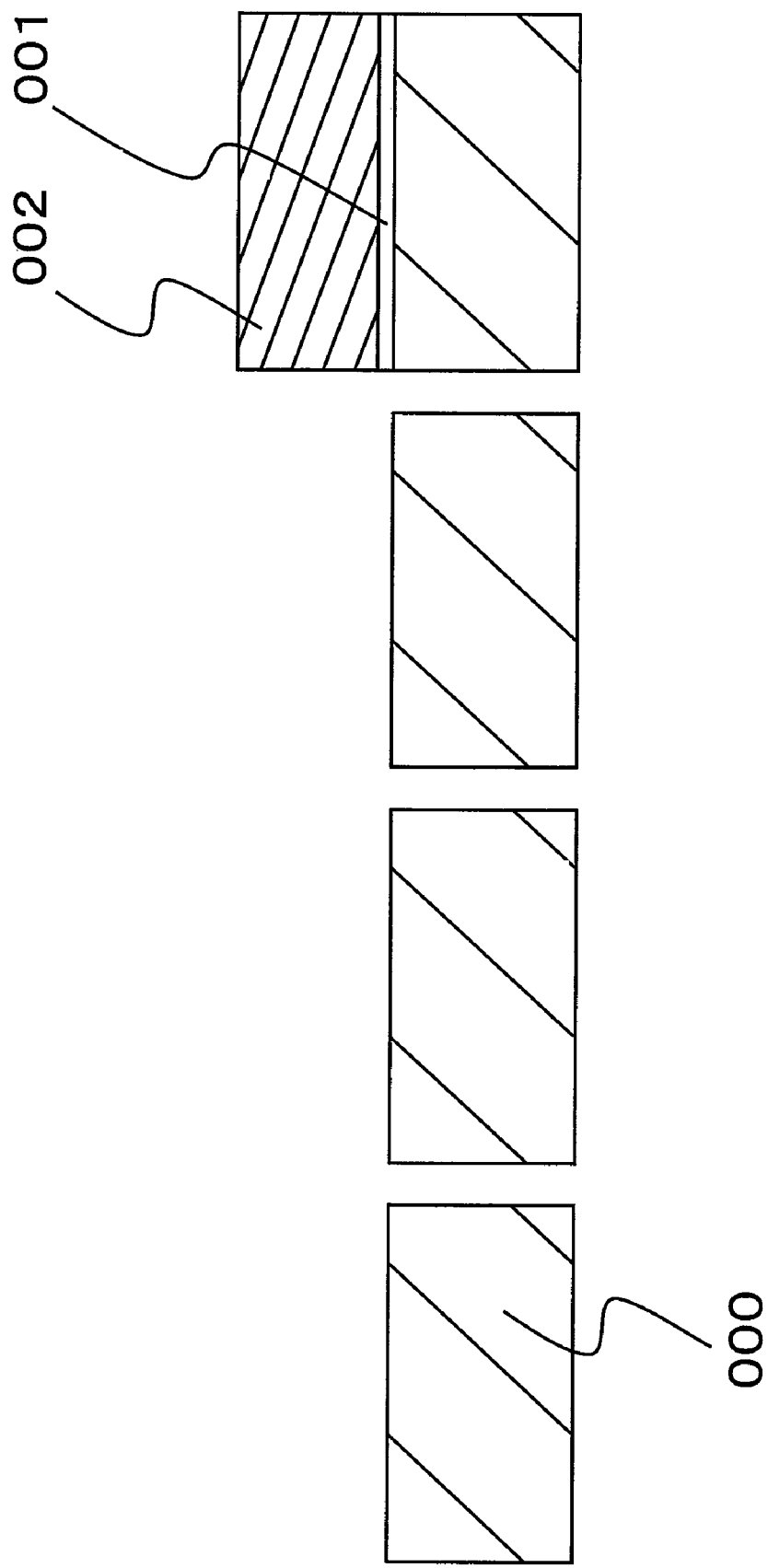
FIG. 12 is a cross-sectional view showing the manufacturing method of the nonvolatile semiconductor integrated storage device continued from FIG. 11.
Figure 13:
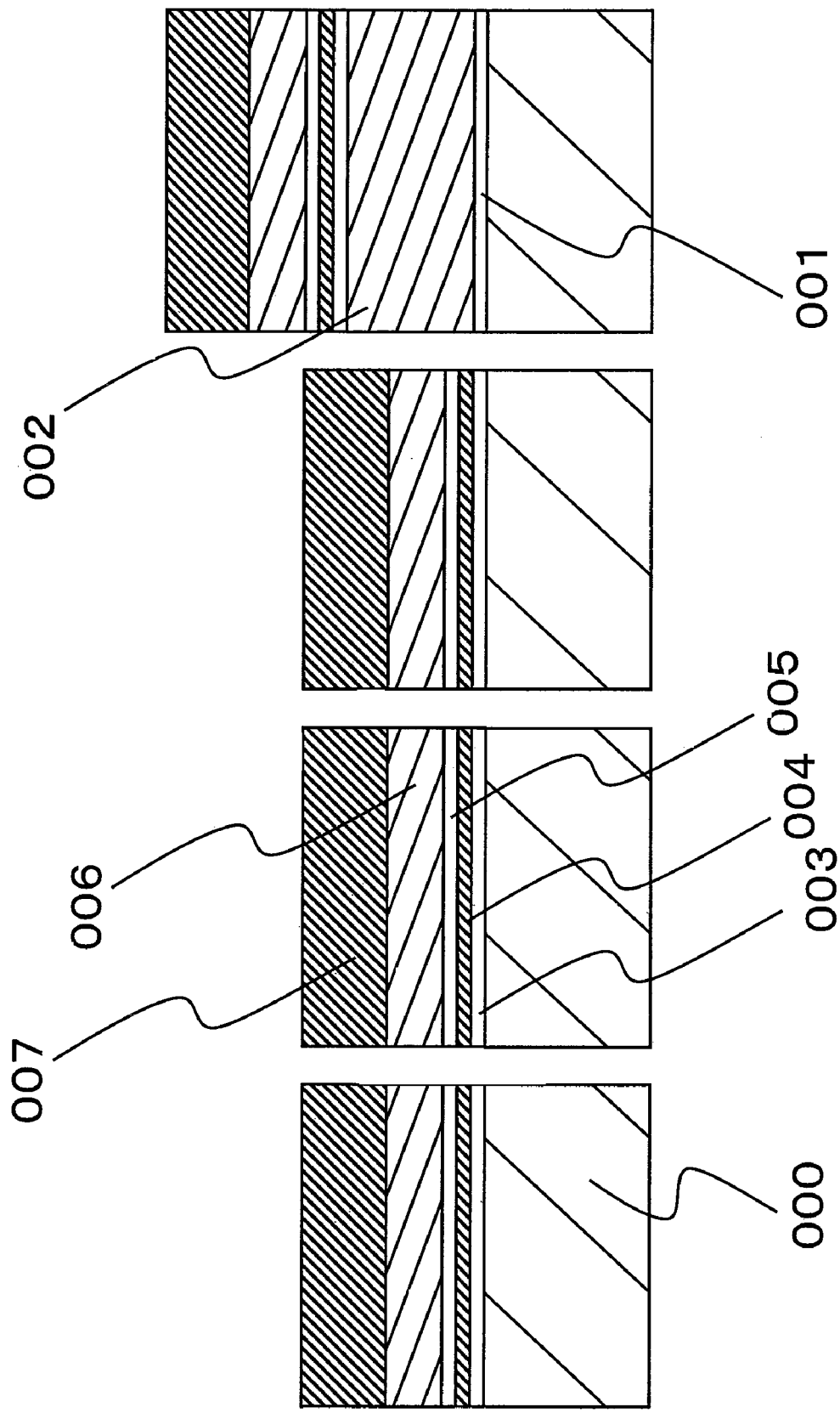
FIG. 13 is a cross-sectional view showing the manufacturing method of the nonvolatile semiconductor integrated storage device continued from FIG. 12.
Figure 14:
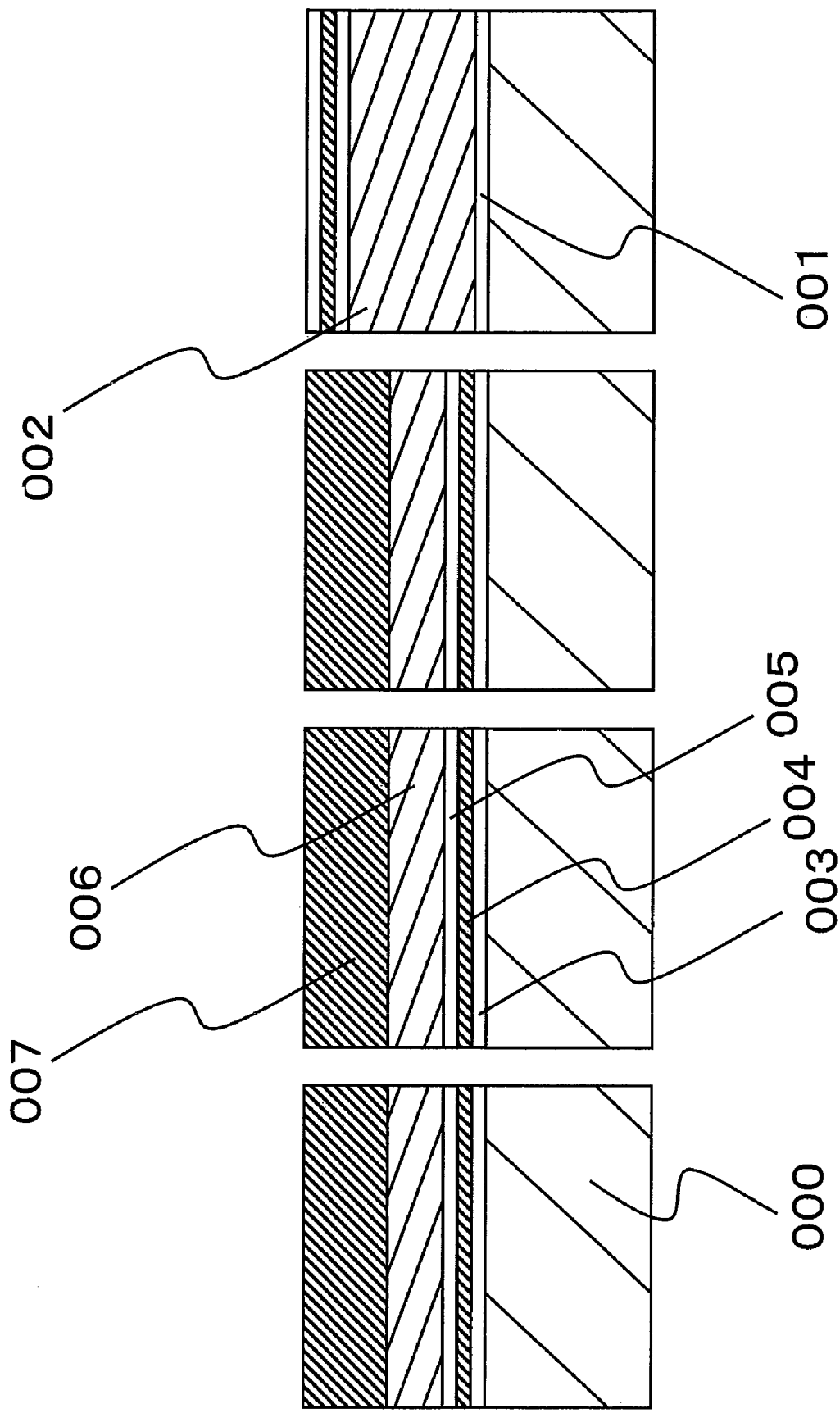
FIG. 14 is a cross-sectional view showing the manufacturing method of the nonvolatile semiconductor integrated storage device continued from FIG. 13.

Then, the polysilicon film 002 and the silicon oxide film 001 in the memory cell region are removed by lithography and dry etching and the ion implantation for controlling the threshold value of the memory cell is performed. By this step, the polysilicon film 002 is left only in the peripheral circuit region (FIG. 12). Subsequently, after forming a silicon oxide film 003 on the surface of the silicon substrate 000 by the thermal oxidation, a silicon nitride film 004 to be the charge trapping layer is deposited and the silicon nitride film 004 is subjected to the thermal oxidation to form a silicon oxide film 005. At this time, the silicon oxide film 005 can be formed by other method than the thermal oxidation of the silicon nitride film 004. For example, it can be formed by depositing a silicon oxide film by CVD. In this manner, the so-called ONO film which is a stacked film of the silicon oxide film 003, the silicon nitride film 004 and the silicon oxide film 005 is formed on the surface of the silicon substrate 000 in the memory cell region. Meanwhile, since the polysilicon film 002 is not removed in the peripheral circuit region, the ONO film is formed on the polysilicon film 002. Note that, in the first embodiment, the ONO film is formed so that the silicon oxide film 003 has the thickness of 5 nm, the silicon nitride film 004 has the thickness of 8 nm and the silicon oxide film 005 has the thickness of 5 nm. Thereafter, a polysilicon film 006 to be the memory gate electrode and a silicon nitride film 007 are sequentially deposited (FIG. 13). At this time, if the height from the surface of the silicon substrate 000 to the upper surface of the silicon nitride film 007 in the memory cell region is set to be approximately equal to the height from the surface of the silicon substrate 000 to the silicon oxide film/silicon nitride film/silicon oxide film on the polysilicon film 002 to be the gate electrode of the MOS transistor in the MOS transistor formation region in the peripheral circuit region, since the silicon nitride film 007 in the memory cell region and the silicon nitride film 004 in the peripheral circuit region can be made to function as an etching stopper, the flatness inside the wafer can be improved in the subsequent chemical mechanical polishing (CMP).

Figure 15:
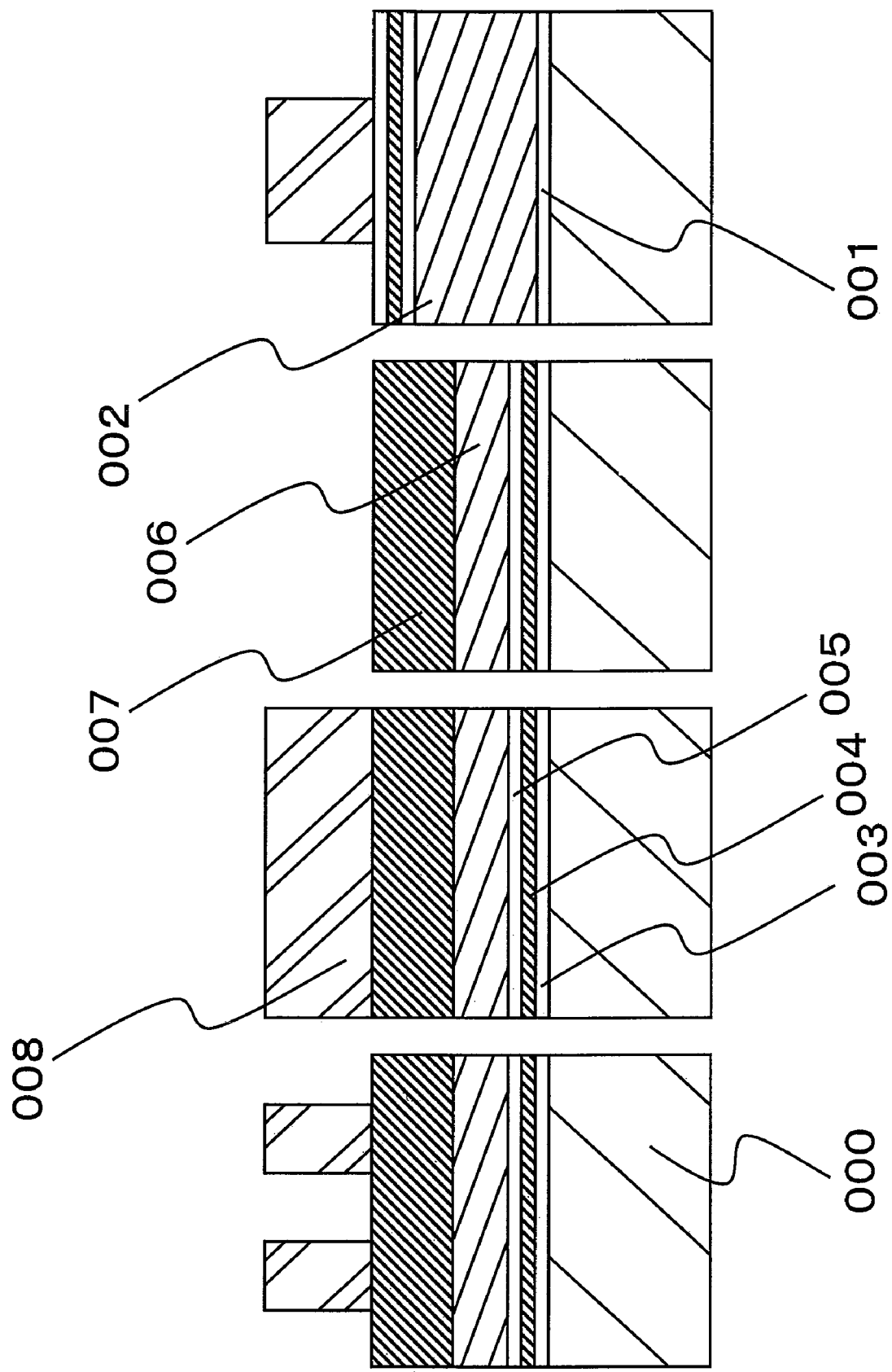
FIG. 15 is a cross-sectional view showing the manufacturing method of the nonvolatile semiconductor integrated storage device continued from FIG. 14.

Then, after removing the silicon nitride film 007 and the polysilicon film 006 in the peripheral circuit region by lithography and dry etching (FIG. 14), an organic material such as a photoresist 008 is patterned and left on a region to be the element formation region so that the region to be the element formation region is not etched in the subsequent process (FIG. 15).

Figure 16:
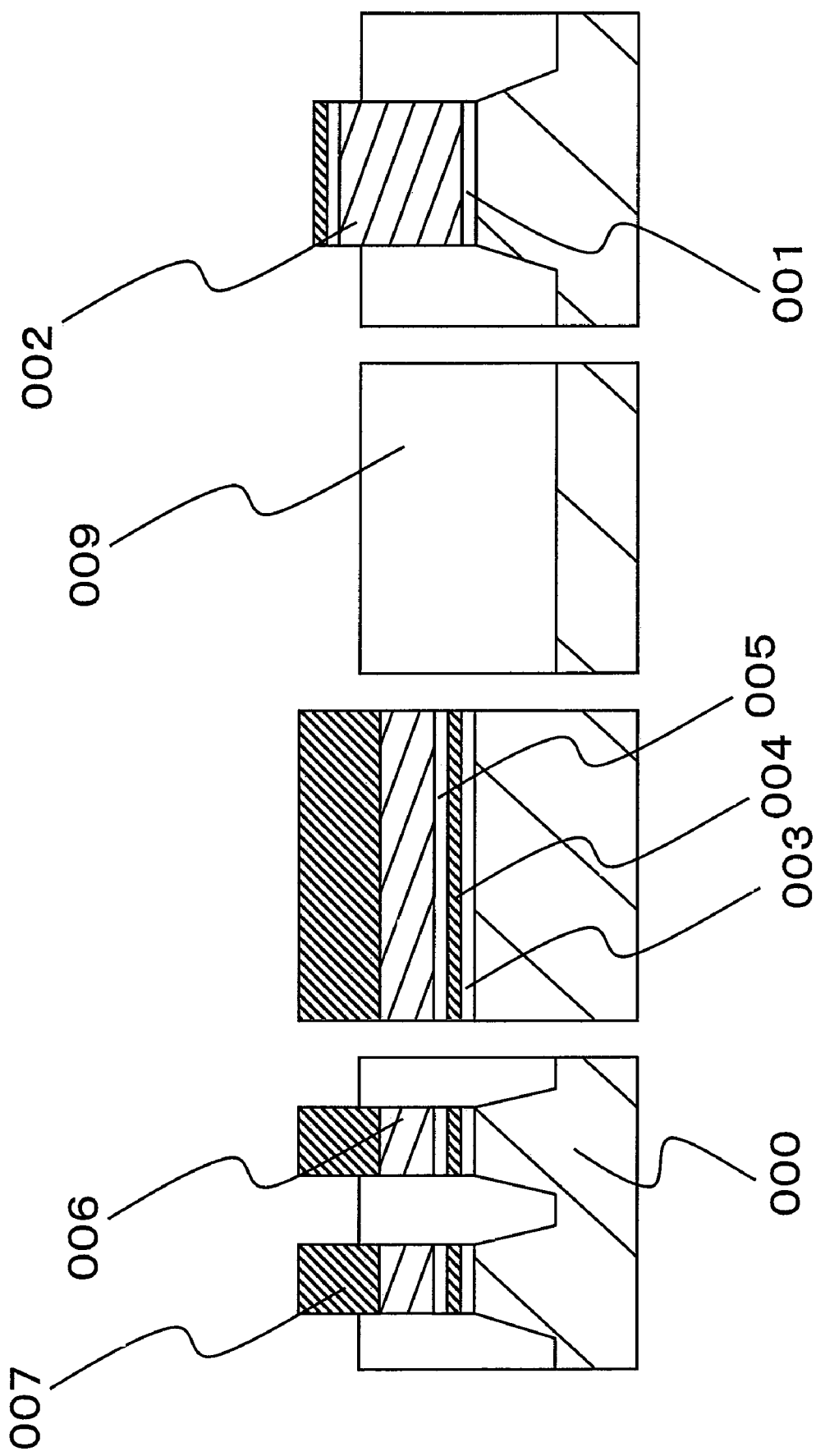
FIG. 16 is a cross-sectional view showing the manufacturing method of the nonvolatile semiconductor integrated storage device continued from FIG. 15.

Thereafter, for example, the silicon nitride film 007 is etched into a pattern formed by the photoresist 008 and the photoresist 008 is removed. Thereafter, in the memory cell region, the polysilicon film 006 and the ONO film (silicon oxide film 003, the silicon nitride film 004 and the polysilicon film 005) are etched using the silicon nitride film 007 as a mask, the region to be the element isolation region is etched to about 300 nm from the surface of the silicon substrate 000. Although the silicon nitride film 007 and the silicon nitride film 004 are common in their material, since the silicon nitride film 007 has a relatively large thickness compared with the silicon nitride film 004, it does not matter if the silicon nitride film 007 is removed to some extent when the silicon nitride film 004 is etched. On the other hand, in the peripheral circuit region, the polysilicon film 002, the gate insulating film 001 and the surface of the silicon substrate 000 are etched using the silicon nitride film 004 of the ONO film as a mask. Alternatively, it is also possible to perform the etching using only the photoresist 008 as a mask until it reaches the surface of the silicon substrate 000 in the memory cell region and the peripheral circuit region. Thus, the region in which the surface of the silicon substrate 000 is not etched becomes the element formation region. Subsequently, after depositing a silicon oxide film 009 to be the element isolation insulating film, the planarization by CMP is performed using the silicon nitride film 007 in the memory cell region and the silicon nitride film 004 in the peripheral circuit region as an etching stopper. Thus, the region in which the silicon oxide film 009 is formed becomes the element isolation region (FIG. 16).

Through the process as described above, the silicon nitride film 004 to be the charge trapping layer is formed in a self-alignment manner only in the element formation region in the memory cell region. On the other hand, the silicon nitride film 004 to be the charge trapping layer is not formed in the region to be the element isolation region in the memory cell region. Further, also in the peripheral circuit region, the element formation region and the element isolation region are formed. Note that, at this time, the element isolation insulating film is left so that the upper surface of the element isolation insulating film is located at a position higher than the upper surface of the polysilicon film 006.

Figure 17:
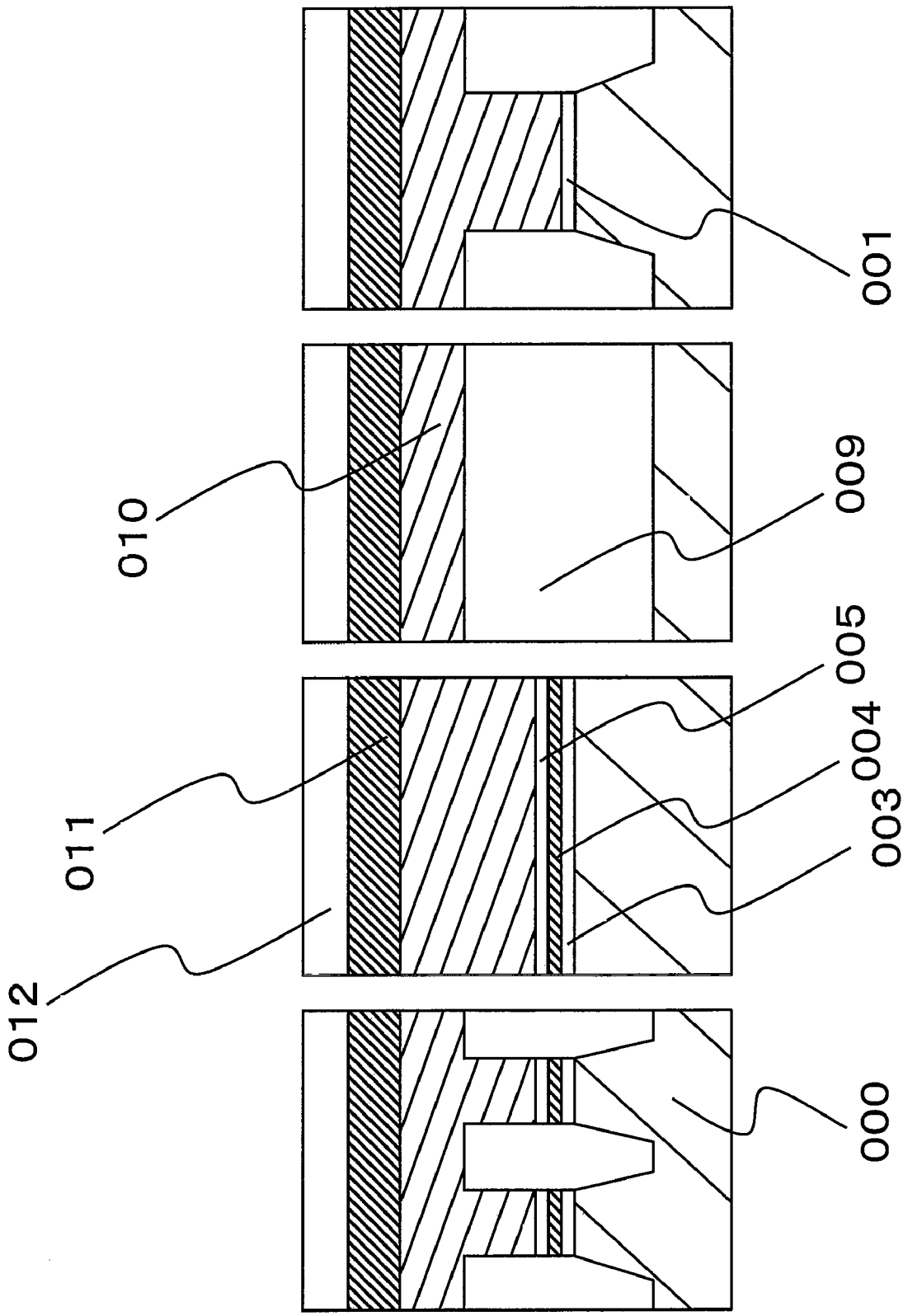
FIG. 17 is a cross-sectional view showing the manufacturing method of the nonvolatile semiconductor integrated storage device continued from FIG. 16.
Figure 18:
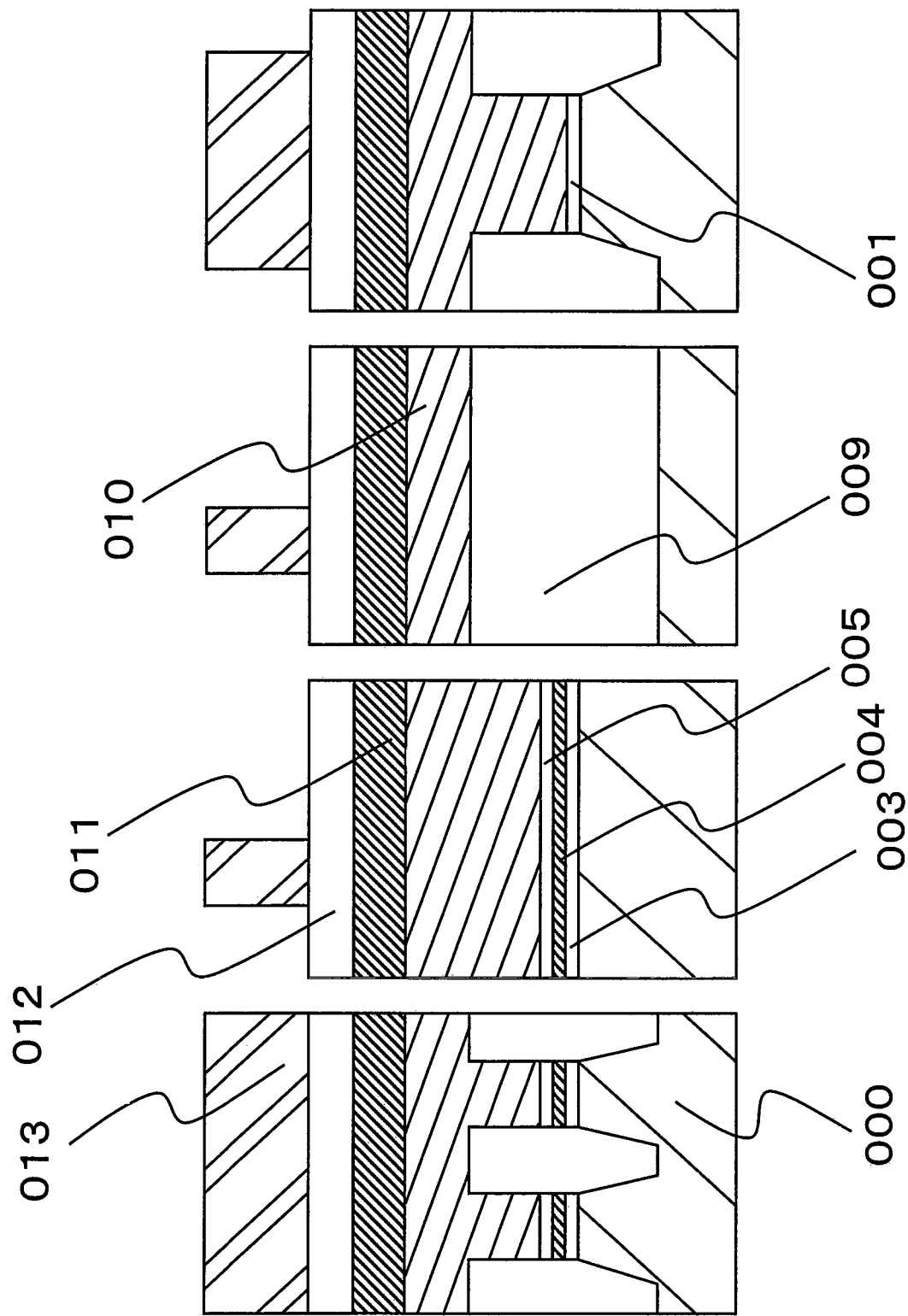
FIG. 18 is a cross-sectional view showing the manufacturing method of the nonvolatile semiconductor integrated storage device continued from FIG. 17.
Figure 19:
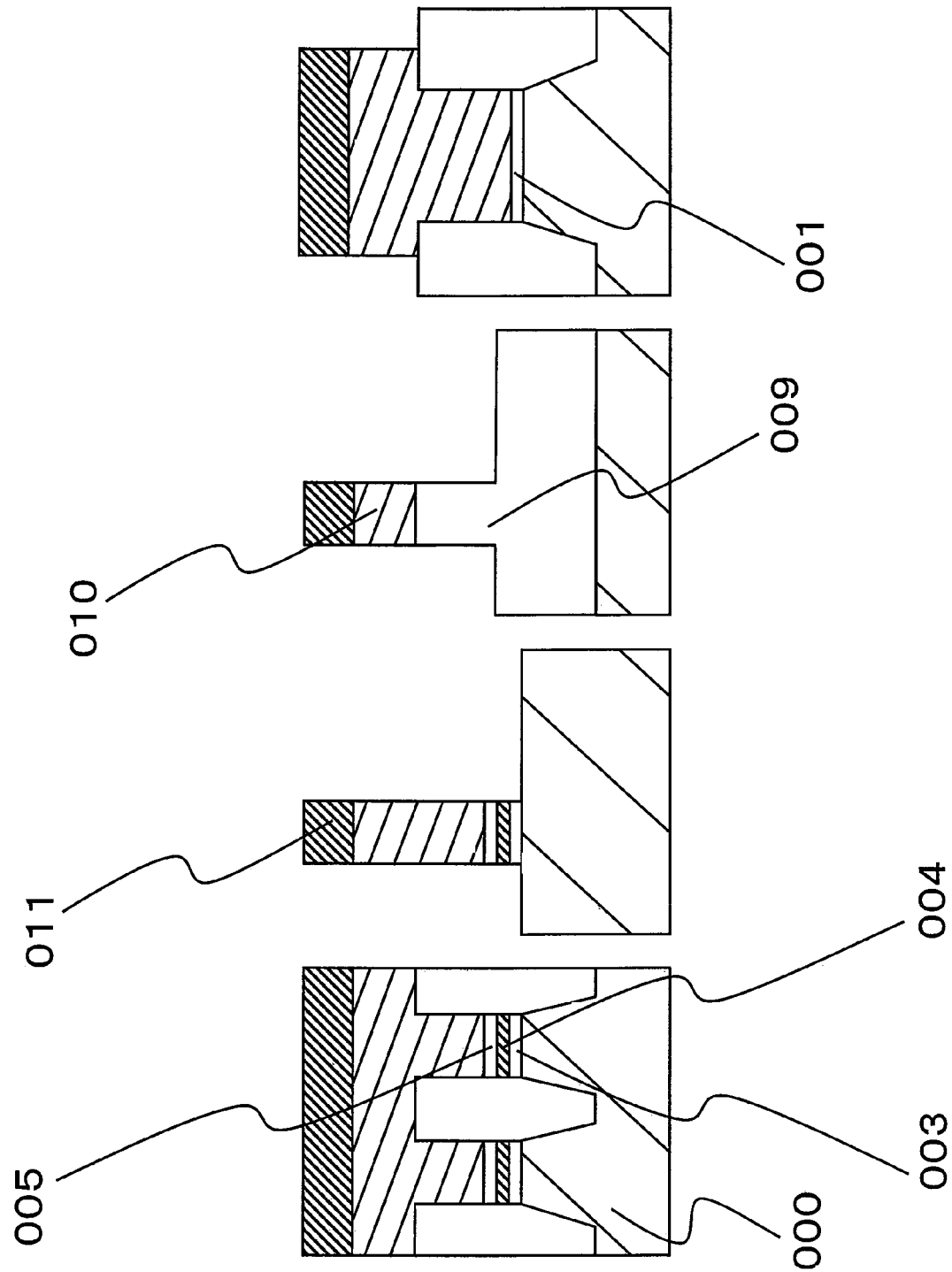
FIG. 19 is a cross-sectional view showing the manufacturing method of the nonvolatile semiconductor integrated storage device continued from FIG. 18.

Subsequently, after removing the silicon nitride film 007 and the silicon nitride film 004 in the peripheral circuit region by wet etching, a polysilicon film 010 for uniting the memory gate electrodes is deposited and further a silicon nitride film 011 and a silicon oxide film 012 are sequentially deposited. Owing to the polysilicon film 010, the memory gate electrodes of each of the memory cells are electrically connected even if the patterning of the memory gate electrodes is performed in the subsequent process. Also, in the peripheral circuit region, the polysilicon film 010 is formed on the element isolation insulating film (FIG. 17). Next, an organic material such as a photoresist 013 is deposited on the surface of the silicon substrate 000, and the patterns of the memory gate electrode and the gate electrode of the peripheral MOS transistor are transferred to the photoresist 013 (FIG. 18). Thereafter, the patterns are further transferred to the silicon oxide film 012, and the silicon nitride film 011, the polysilicon film 010 and the ONO film are dry-etched using the silicon oxide film 012 as a hard mask, thereby forming the memory gate electrode. At this time, the gate electrode of the peripheral MOS transistor is simultaneously processed (FIG. 19). Note that, in this step, the element isolation insulating film in the element isolation region, that is, the element isolation insulating film in the region where the polysilicon film 010 to be the memory gate electrode is not formed is also etched.

By this step, in the memory cell region, the ONO film in the region where the memory gate electrode is not formed is removed and the surface of the silicon substrate 000 is exposed in the element formation region. Meanwhile, in the element isolation region, the element isolation insulating film having a convex portion as shown in the cross section taken along the C-C' line in FIG. 19 is formed.

Figure 20:
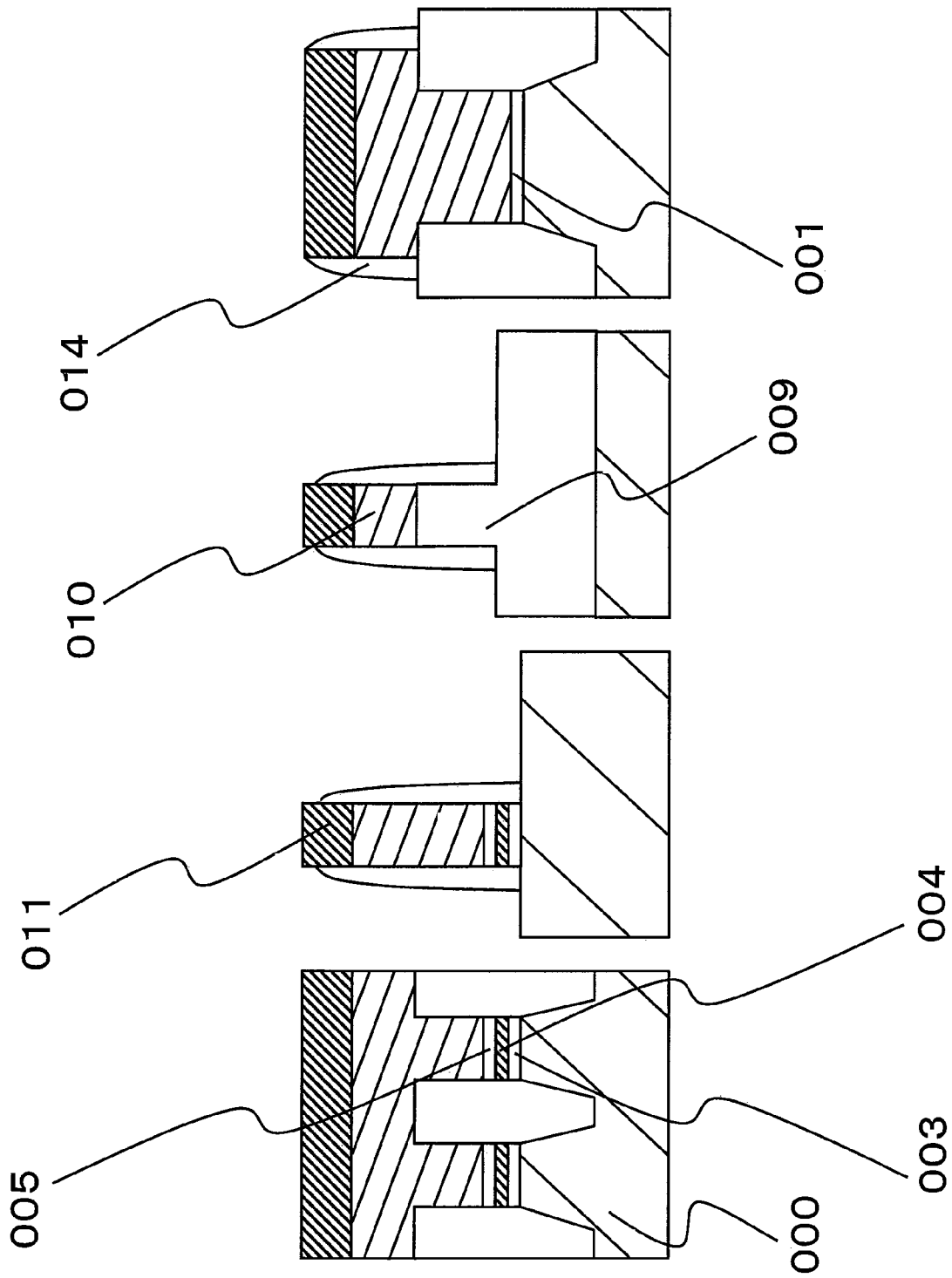
FIG. 20 is a cross-sectional view showing the manufacturing method of the nonvolatile semiconductor integrated storage device continued from FIG. 19.

Subsequently, sidewalls for insulating the memory gate electrode and the selection gate electrode are formed from a silicon oxide film 014 (FIG. 20). Then, after a silicon oxide film 015 to be the gate insulating film of the selection transistor is formed by the thermal oxidation, a polysilicon film 016 to be the gate electrode of the selection transistor is deposited and the polysilicon film 016 is planarized by CMP using the silicon nitride film 011 as an etching stopper (FIG. 21).

Figure 21:
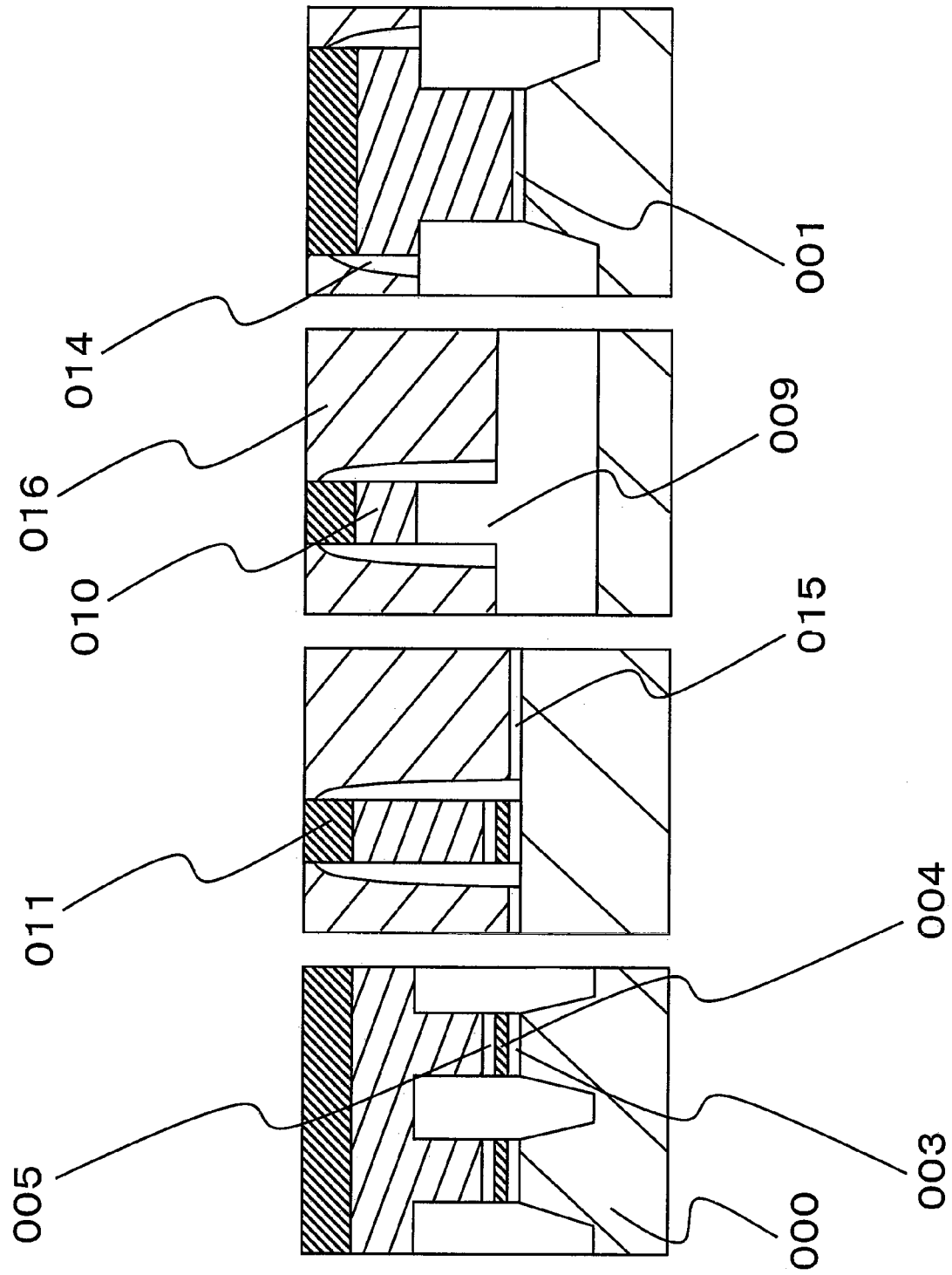
FIG. 21 is a cross-sectional view showing the manufacturing method of the nonvolatile semiconductor integrated storage device continued from FIG. 20.
Figure 22:
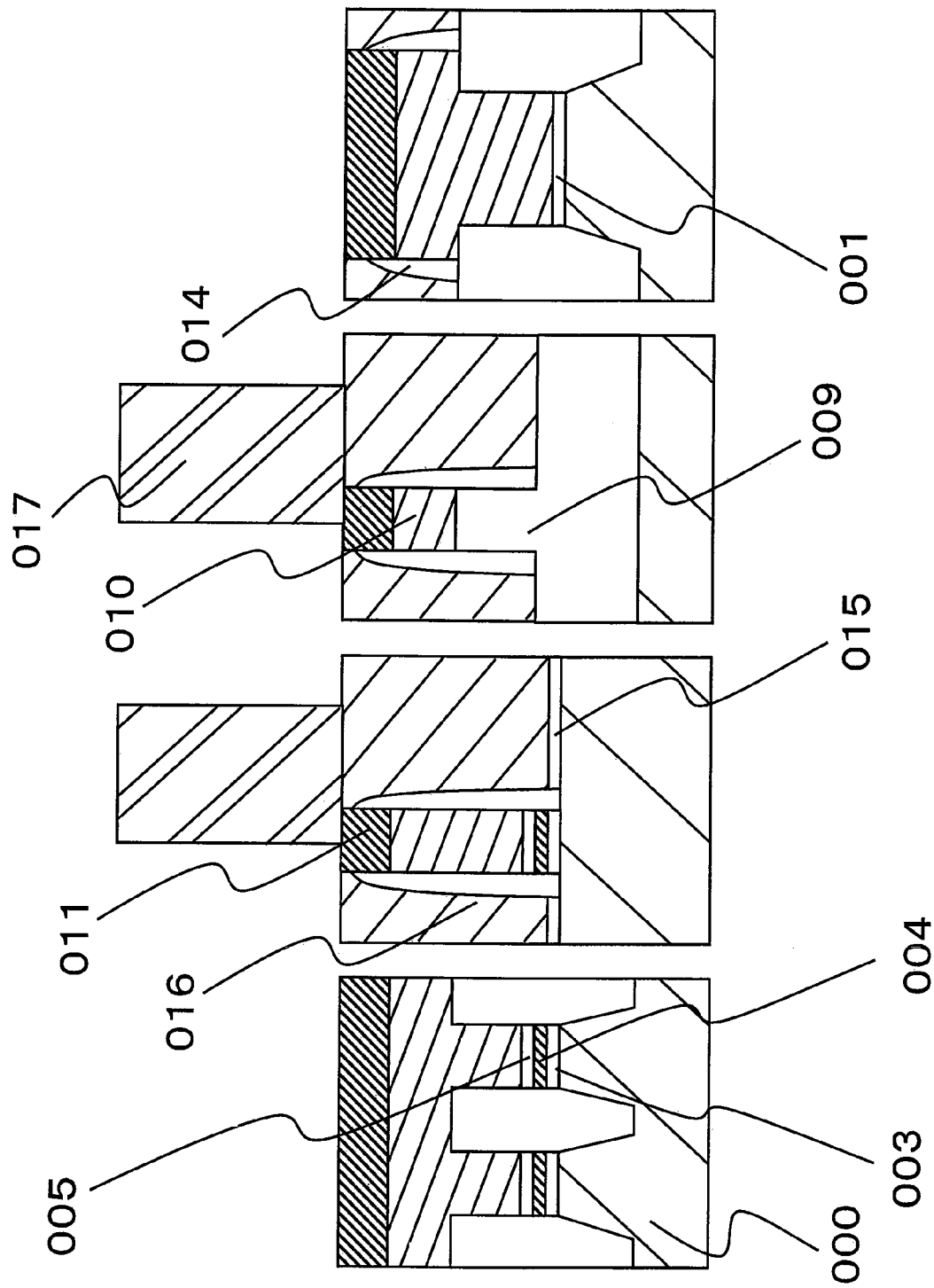
FIG. 22 is a cross-sectional view showing the manufacturing method of the nonvolatile semiconductor integrated storage device continued from FIG. 21.

As is apparent from FIG. 21, since the element isolation insulating film in the region where the memory gate electrode is not formed in the element isolation region has been etched in the previous process, the position of the bottom surface of the memory gate electrode is located at a position higher than that of the bottom surface of the polysilicon film 016 to be the selection gate electrode formed afterward. Next, in order to pattern the polysilicon film 016 to be the selection gate electrode, an organic material such as a photoresist 017 is deposited on the whole surface of the silicon substrate 000, and the pattern of the selection gate electrode is transferred to the photoresist 017 (FIG. 22).

Figure 23:
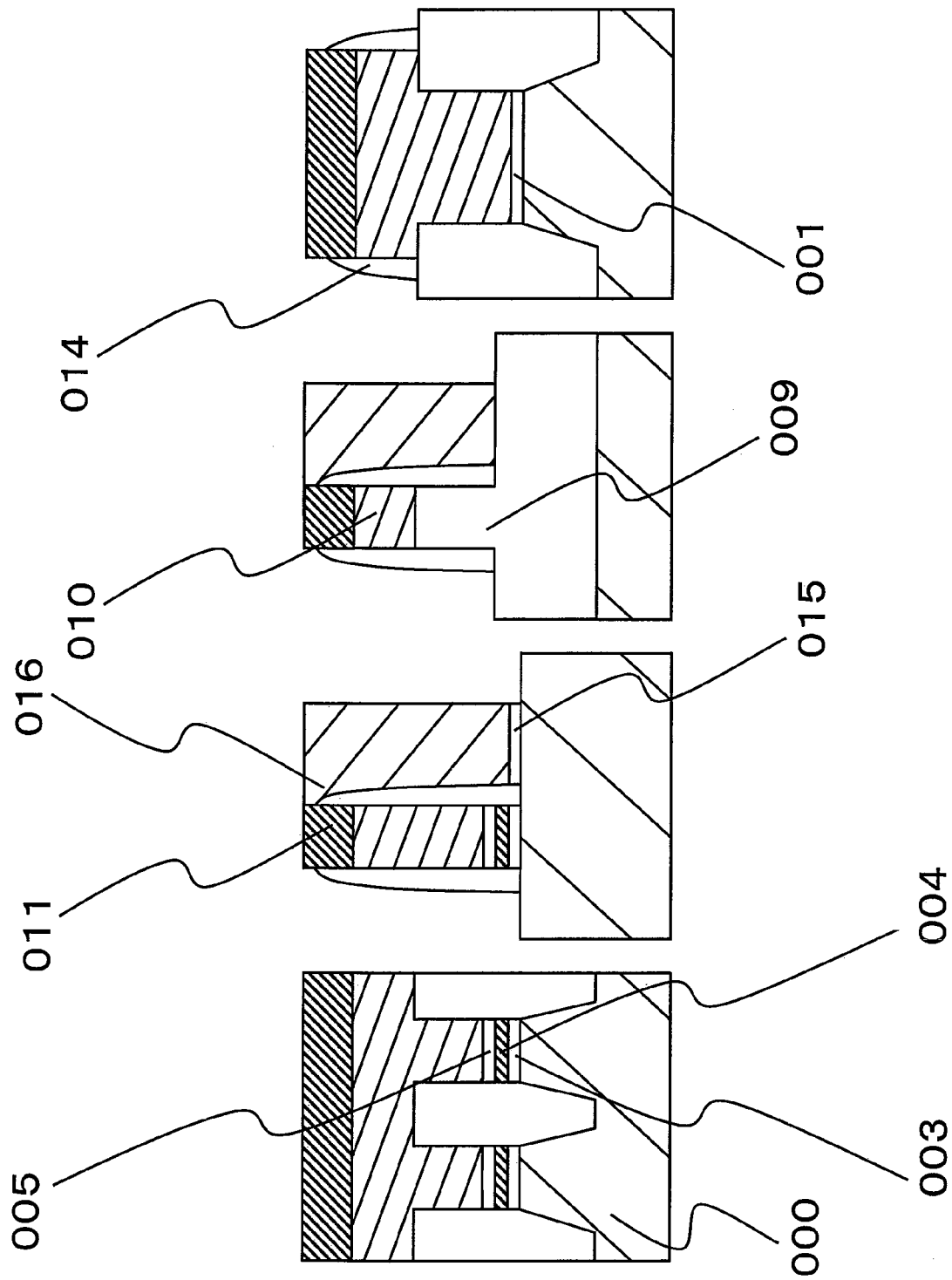
FIG. 23 is a cross-sectional view showing the manufacturing method of the nonvolatile semiconductor integrated storage device continued from FIG. 22.
Figure 24:
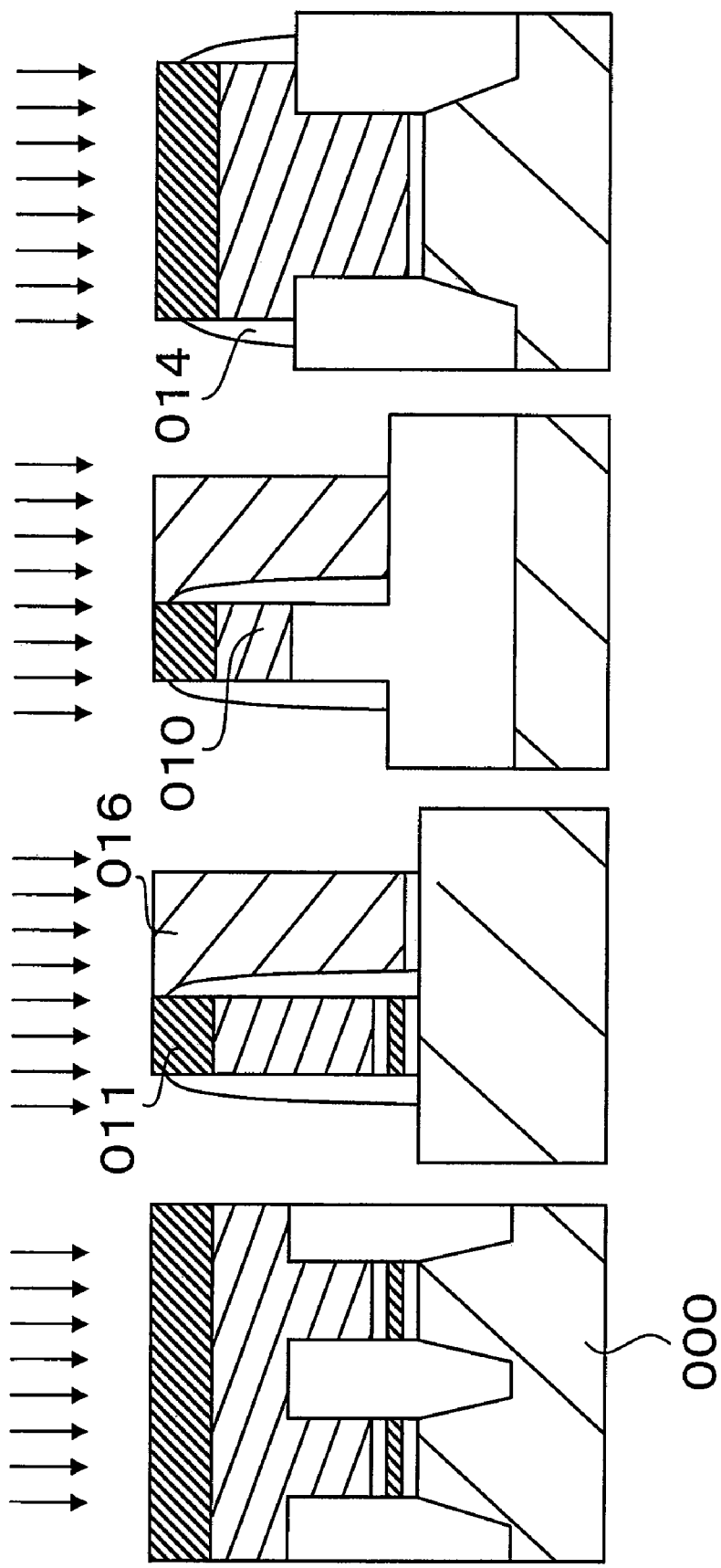
FIG. 24 is a cross-sectional view showing the manufacturing method of the nonvolatile semiconductor integrated storage device continued from FIG. 23.

Next, the selection gate electrode is formed using the photoresist 017 and the silicon nitride film 011 as a mask (FIG. 23). In this manner, the selection gate electrode adjacent to the memory gate electrode via the silicon oxide film 014 is formed.

Figure 25:
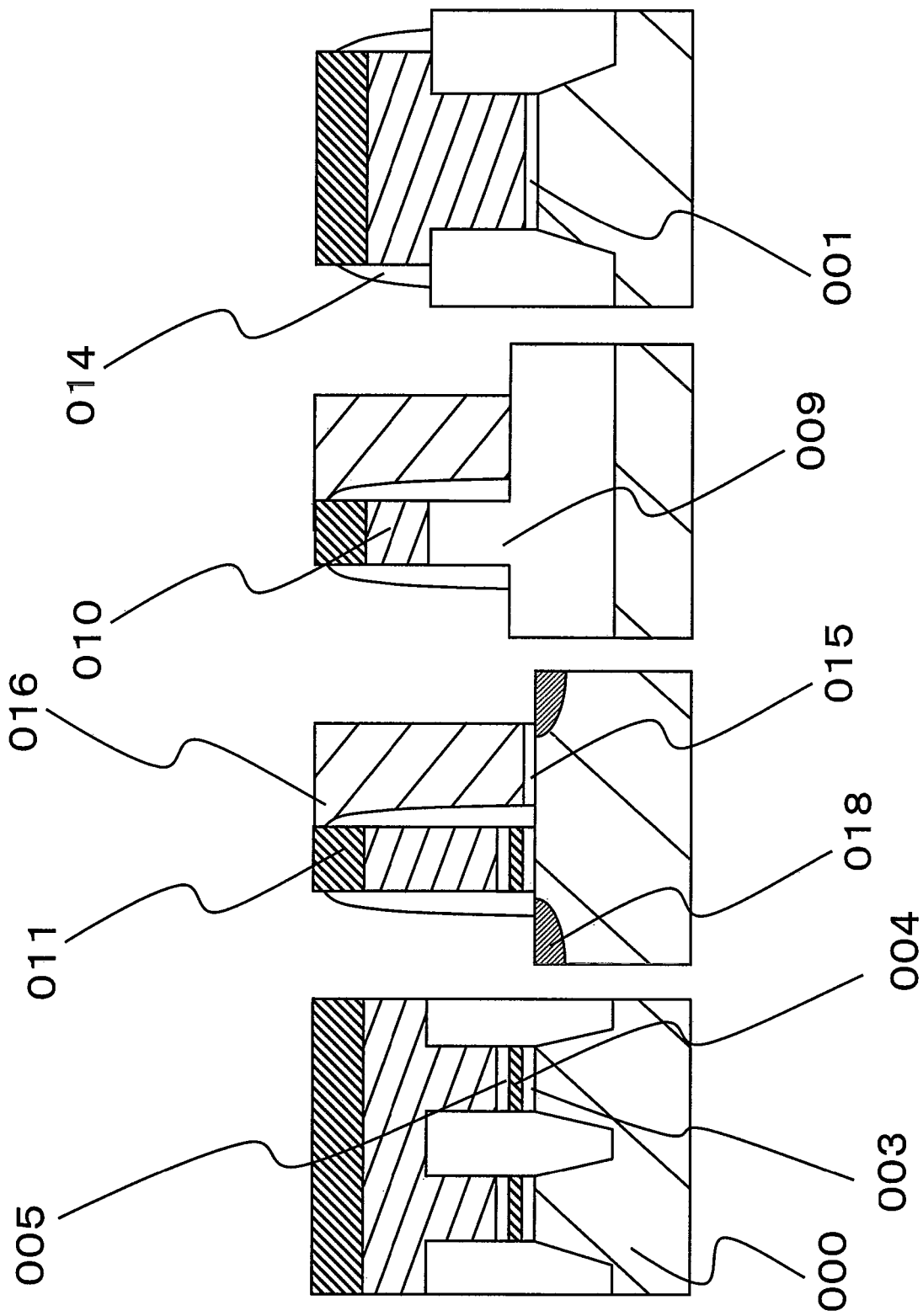
FIG. 25 is a cross-sectional view showing the manufacturing method of the nonvolatile semiconductor integrated storage device continued from FIG. 24.

Then, the ion implantation for forming high-concentration impurity regions to be the source electrodes and the drain electrodes of the p MOS and the n MOS is performed (FIG. 24) and diffusion layers 018 constituting the source electrodes and the drain electrodes are formed (FIG. 25). By this step, a pair of the source electrode and the drain electrode are formed so as to sandwich the memory gate electrode and the selection gate electrode. Further, though not shown, the source electrode and the drain electrode of the MOS transistor in the peripheral circuit region are simultaneously formed.

Figure 26:
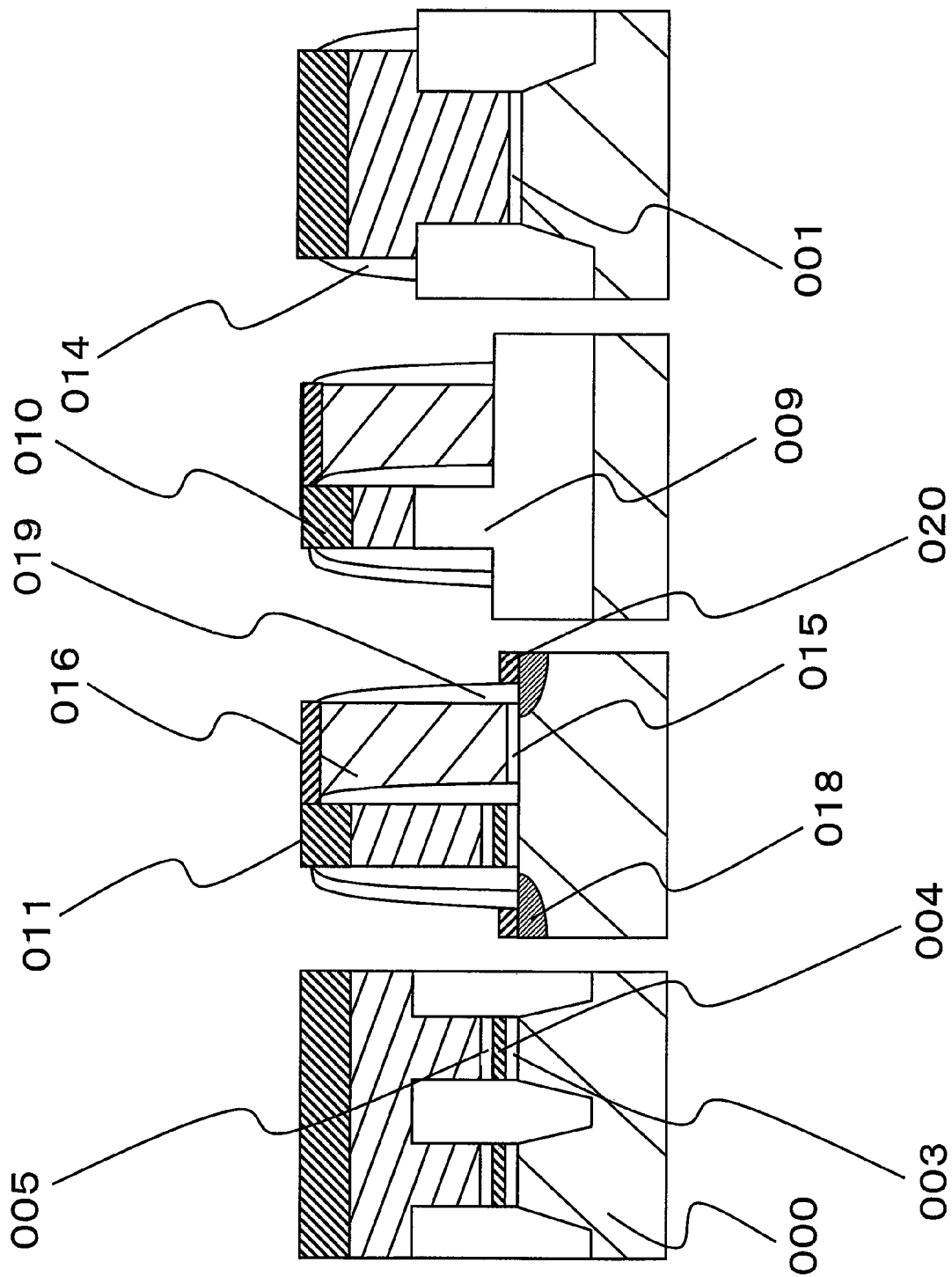
FIG. 26 is a cross-sectional view showing the manufacturing method of the nonvolatile semiconductor integrated storage device continued from FIG. 25.

Next, after forming the sidewalls from a silicon oxide film 019 on the sidewalls of the selection gate electrode and depositing a cobalt film on the selection gate electrode and the source electrode and the drain electrode of the memory cell, the cobalt film is silicided to form a cobalt silicide film 20. By this means, the resistance of the selection gate electrode, the source electrode and the drain electrode of the memory cell can be reduced (FIG. 26). Note that, if the resistance reduction is unnecessary, the step of forming a silicide film such as the cobalt silicide film 20 is not always necessary. Thereafter, though not shown, after depositing a wiring interlayer film, contact holes for connecting to the memory transistor, the selection transistor and the peripheral MOS transistor are formed. Subsequently, a metal film is deposited on the interlayer insulating film and patterned to form wirings. By this means, the nonvolatile semiconductor storage device is completed.

Figure 27:
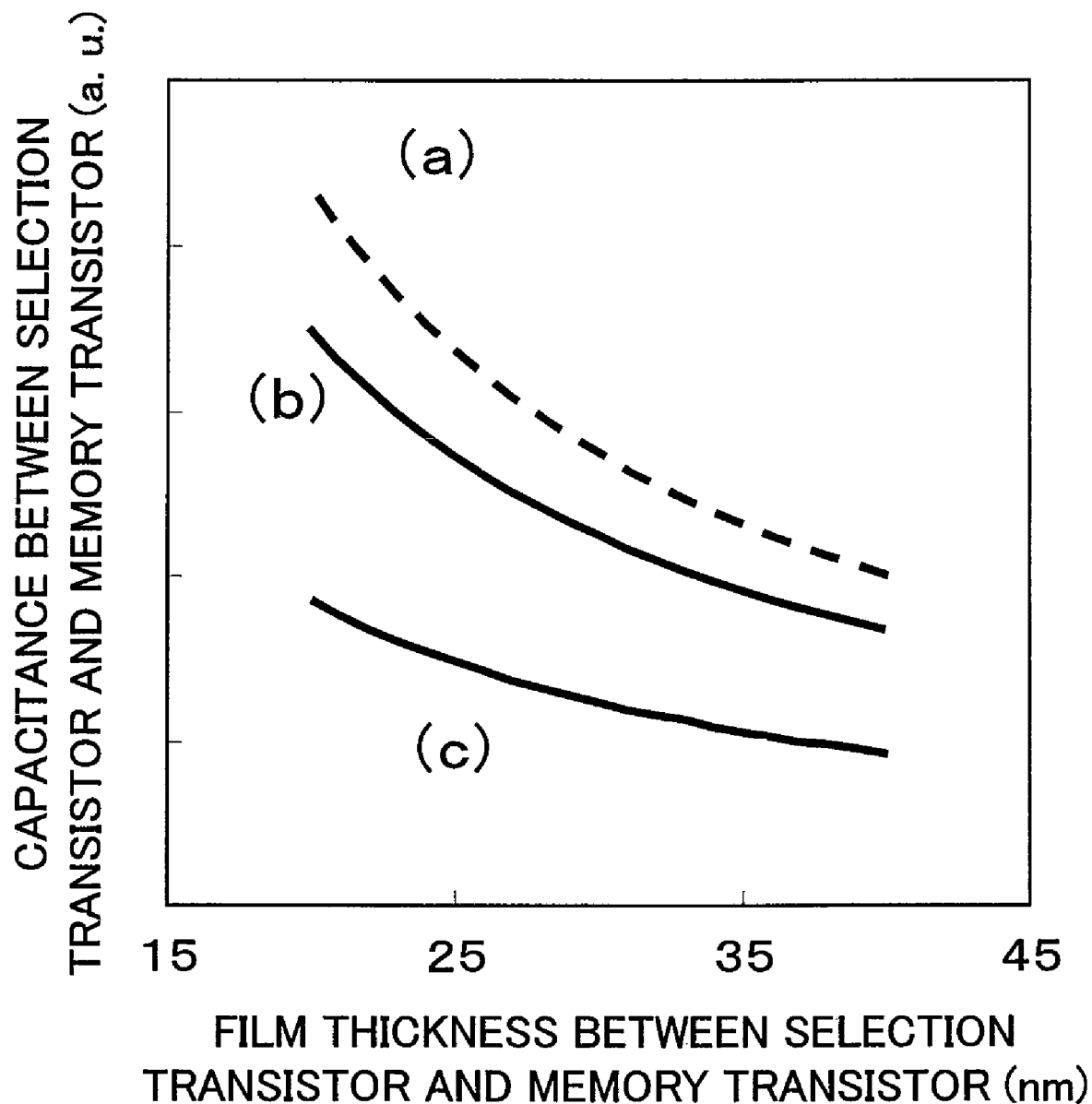
FIG. 27 is a diagram in which the capacitance between a selection transistor and a memory transistor in the first and third embodiments of the present invention is compared with that in a reference technology.
Figure 55:
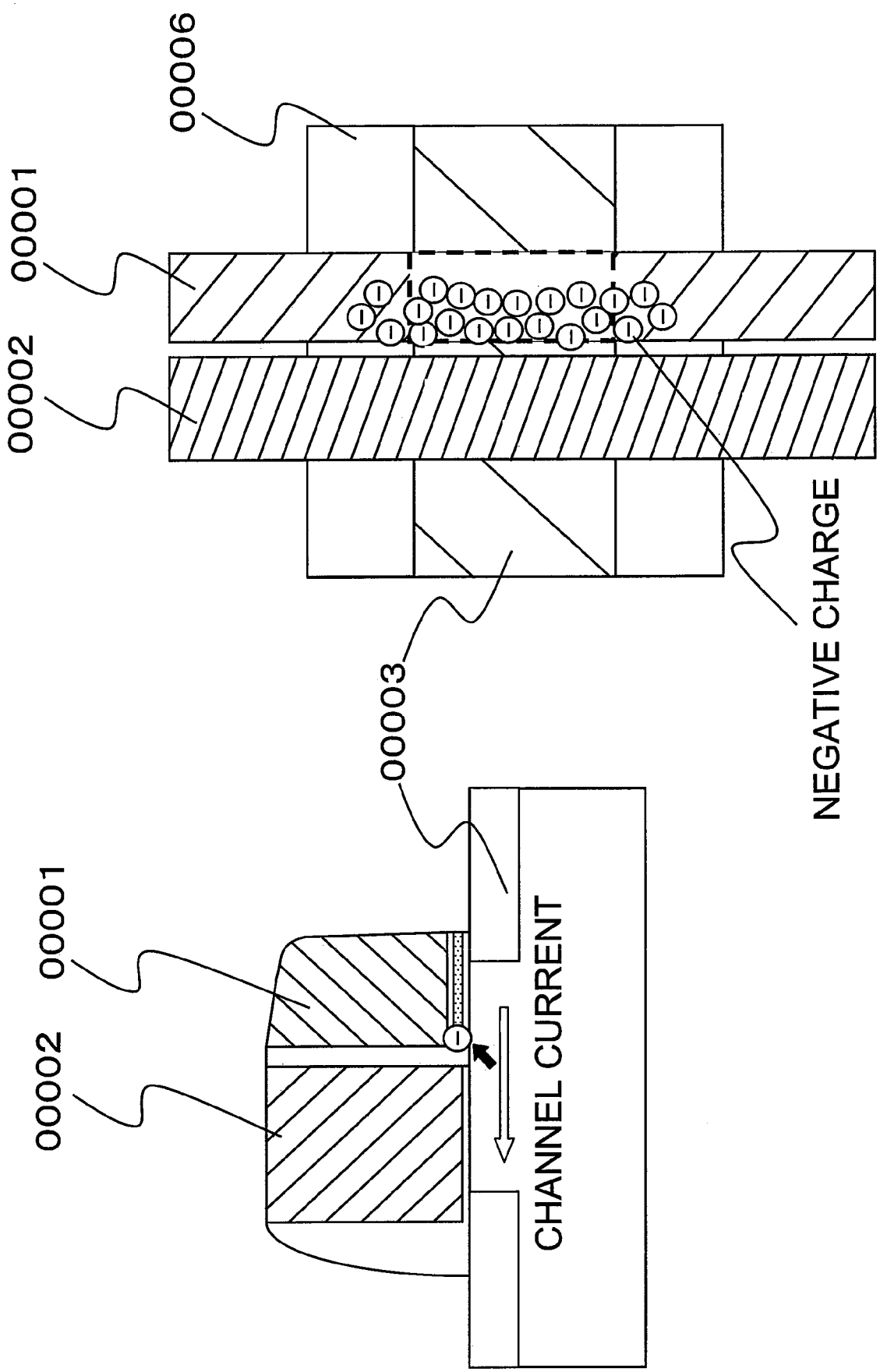
FIG. 55 is a diagram for describing the problem to be solved by the present invention.

FIG. 27 shows the dependence on the thickness of the insulating film formed between the gate electrodes of the selection transistor and the memory transistor with respect to the capacitance between the selection transistor and the memory transistor of the semiconductor storage device manufactured through the process described above. In FIG. 27, (a) represents the characteristics of a memory cell in which the silicon nitride film between the selection gate 00001 and the memory gate 00002 is removed and the silicon nitride film between the memory gate 00002 and the element isolation insulating film 00006 in the element isolation region is not removed as shown in FIG. 55, (b) represents the characteristics of the memory cell according to the first embodiment, and (c) represents the characteristics of the memory cell according to the third embodiment described later. Further, in order to verify the effect of the silicon nitride film, the memory cell, in which the influence on the capacitance value resulting from the overlapping amount of opposed surfaces of the memory gate 00002 and the selection gate 00001 in a horizontal direction in the element isolation region in (a) is suppressed by reducing the height of the uniting portion of the memory gate 00002 in the element isolation region, is used as the structure of (b).

In the memory cell according to the first embodiment, since the silicon nitride film in the element isolation region is removed in a self-alignment manner, compared with the memory cell structure of (a), the capacitance between the selection gate and the memory gate can be reduced. As a result, since the time constant of the selection transistor can be reduced, the memory operation speed can be improved.

Figure 28:
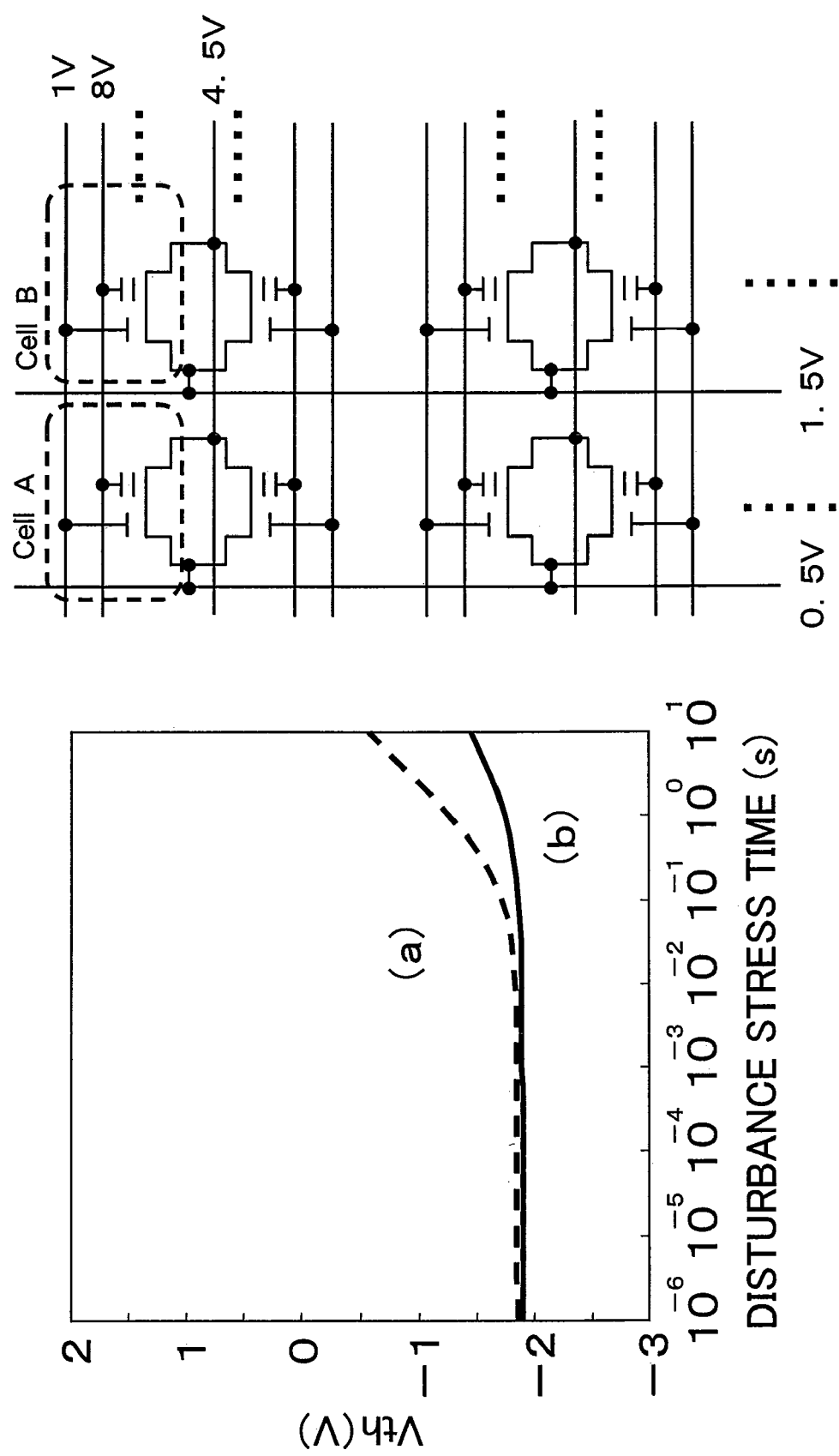
FIG. 28 is a diagram in which resistance to error writing in the first embodiment of the present invention is compared with that in a reference technology.

Further, FIG. 28 shows a circuit diagram and a graph of the disturbance resistance. In the graph, the resistance to the disturbance given to a cell B when writing voltage is applied to a cell A in the circuit diagram is shown, and (a) in the graph represents the characteristics of the memory cell having the same structure as (a) described above and (b) represents the characteristics of the memory cell according to the first embodiment.

In the structure of (a), since a silicon nitride film to be the charge trapping layer exists in the element isolation region, charges are injected to the silicon nitride film in the element isolation region in the writing and erasing operations of the memory cell. Further, GIDL is increased due to the electric field from the charges present in the silicon nitride film in the element isolation region and the disturbance occurs as shown in FIG. 28. In the memory cell according to the first embodiment, since no silicon nitride film is formed in the element isolation region and charges are not trapped therein, the electric field is weakened, and as a result, the disturbance resistance is improved. According to the present invention, since the margin to the disturbance can be reduced and intervals between the threshold distributions of the memory cells can be narrowed, it is preferable when the memory cell is designed to have a multi-valued structure.

The contents of the present invention will be summarized as follows. That is, since the charge trapping layer is not formed in the element isolation region, even when the writing operation and the erasing operation of information using hot electrons and hot holes are performed, charges are not injected into the element isolation region at all, and the disturbance resistance can be improved.

Also, since the charge trapping layer is not formed in the element isolation region, the charges trapped in the charge trapping layer in the element formation region are not diffused in the element isolation region and the disturbance resistance can be improved.

Further, since a silicon nitride film serving as the charge trapping layer and having a relative permittivity higher than that of a silicon oxide film is not formed in the element isolation region, the capacitance between the memory gate electrode and the selection gate electrode can be reduced, and the operation speed of the memory can be increased.

Also, the present invention provides a process of forming the memory gate electrode formed of two polysilicon films and a structure in which the memory gates of each memory cell are united by the second polysilicon film of the memory gate electrode. Accordingly, in the present invention, the position of the bottom surface of the memory gate electrode of the second polysilicon film to be the uniting portion in the element isolation region can be located at the position higher than the position of the bottom surface of the selection gate electrode in the element isolation region. Therefore, the overlapping amount of the memory gate electrode and the selection gate electrode in the horizontal direction in the element isolation region can be reduced compared with the conventional structure. Consequently, since the capacitance per unit area in the opposed surfaces of the memory gate electrode and the selection gate electrode in the element isolation region can be made lower than the capacitance per unit area in the opposed surfaces in the element formation region, the capacitance between the memory gate electrode and the selection gate electrode can be reduced, and thus, the operation speed of the memory cell can be increased. Note that this effect can be obtained even when hot electrons or hot holes are not used in the method of writing and erasing information.

Further, in the present invention, the step of forming the trenches for the element isolation region, the step of forming the element isolation insulating film, the step of embedding the element isolation insulating film, and the step of processing the memory gate electrode and the gate electrode of the peripheral MOS transistor are performed simultaneously in the memory array region and the peripheral circuit region. Therefore, the reduction in the number of process steps or the number of masks can be achieved, and thus, the process cost can be reduced.

Second Embodiment

Figure 29:
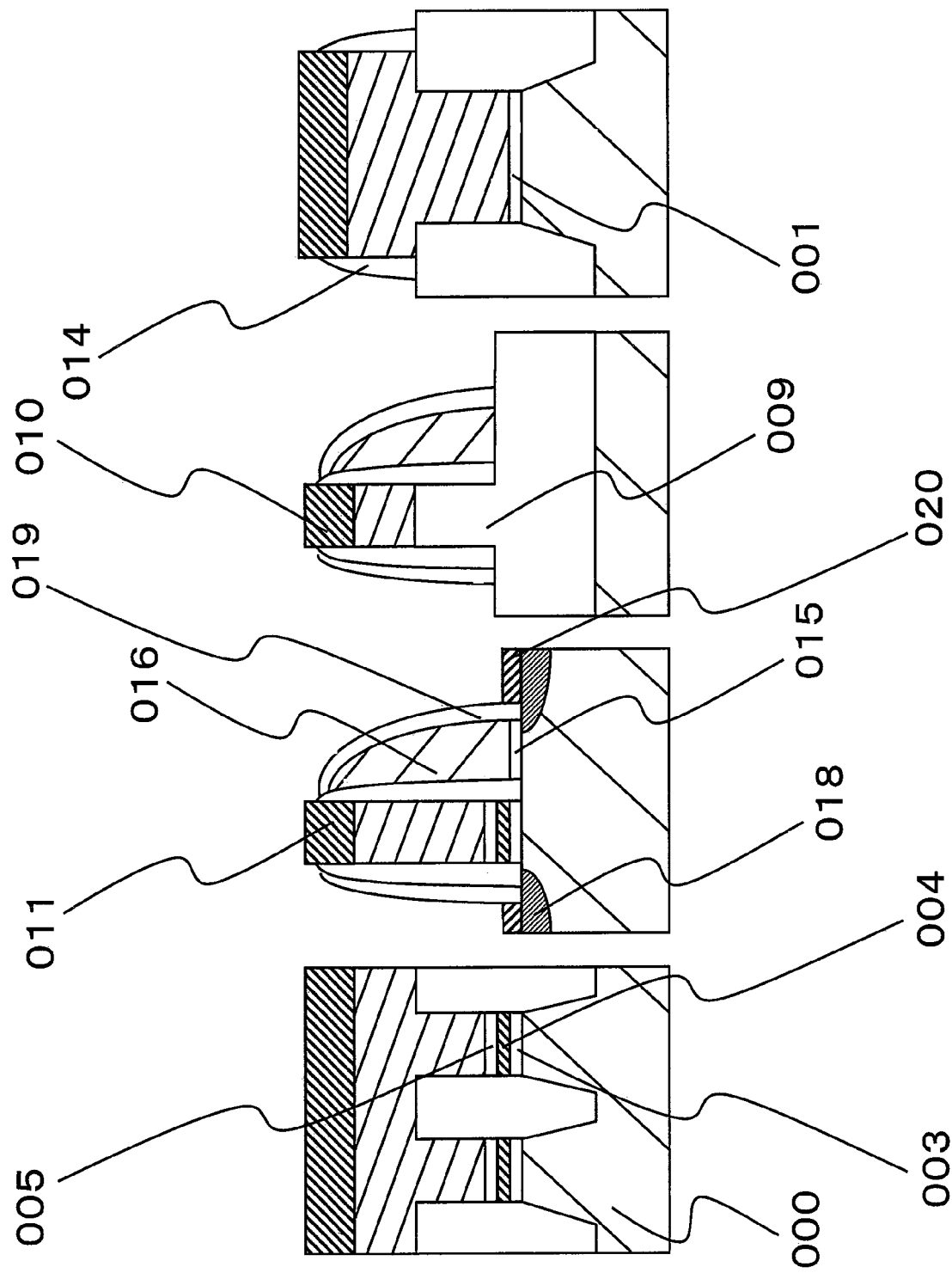
FIG. 29 is a cross-sectional view showing the principal part of the regions including a memory cell and a peripheral circuit of a nonvolatile semiconductor integrated storage device according to a second embodiment of the present invention.

FIG. 29 is a cross-sectional view showing a nonvolatile semiconductor integrated storage device according to the second embodiment. The difference between the memory cell structure of the second embodiment and that of the first embodiment lies in that the selection gate electrode 016 is formed by the sidewall process. By forming the selection gate electrode 016 as the sidewall, the effect of reducing the memory cell area can be achieved in addition to those of the first embodiment.

Third Embodiment

Figure 30:
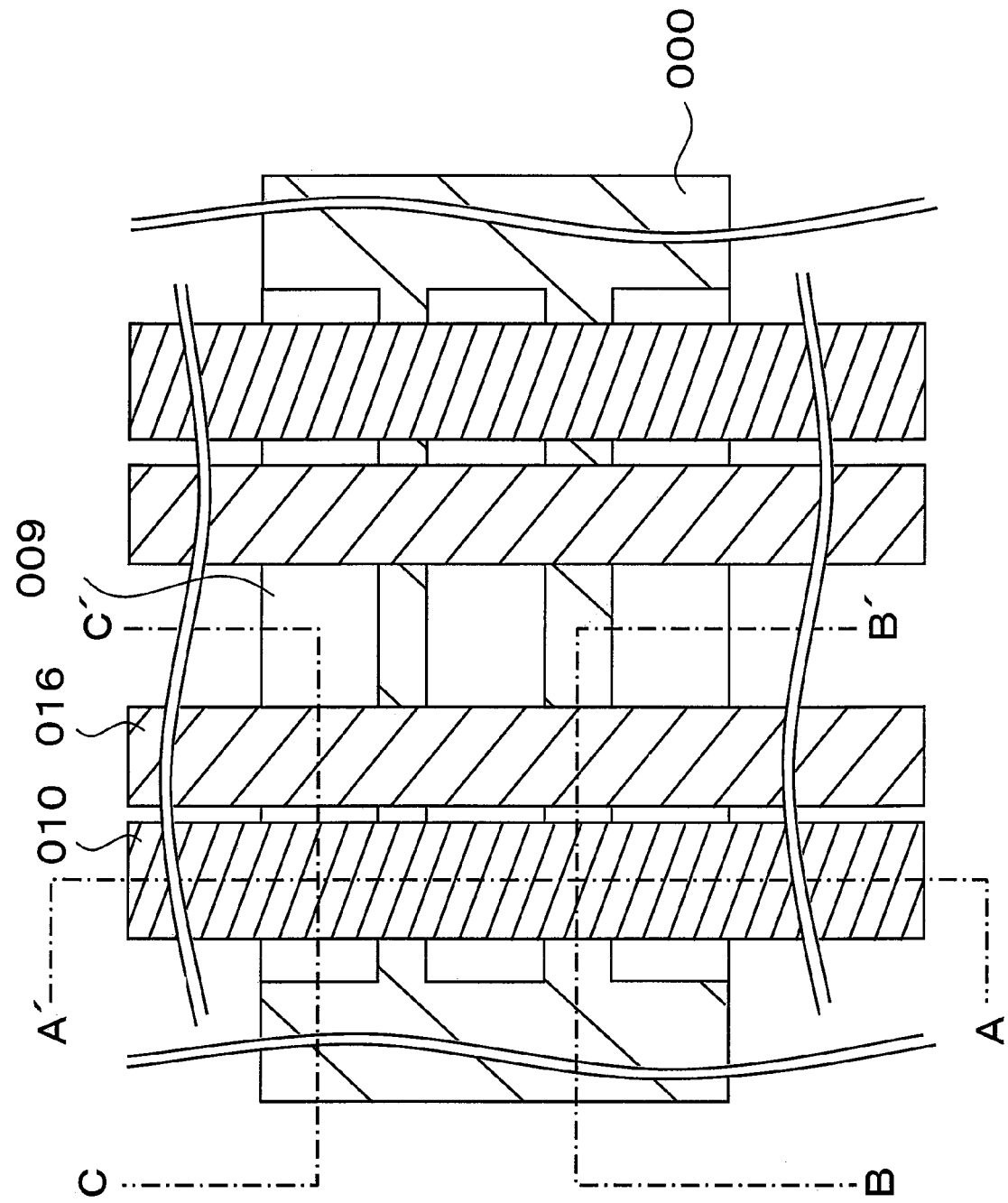
FIG. 30 is a plan view showing the principal part of a memory cell region of a nonvolatile semiconductor integrated storage device according to a third embodiment of the present invention.
Figure 31:
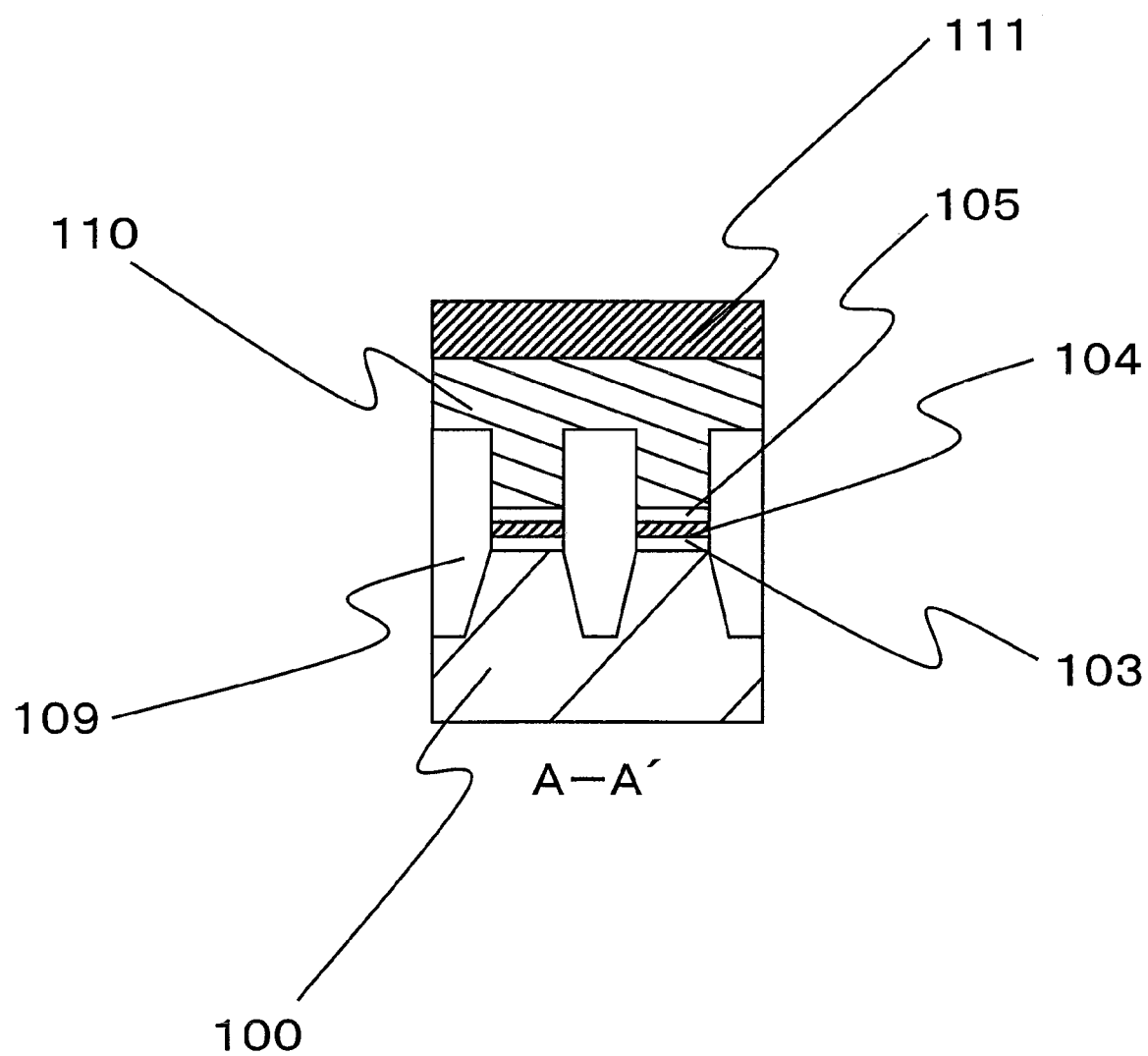
FIG. 31 is a cross-sectional view taken along the line A-A' in FIG. 30.
Figure 32:
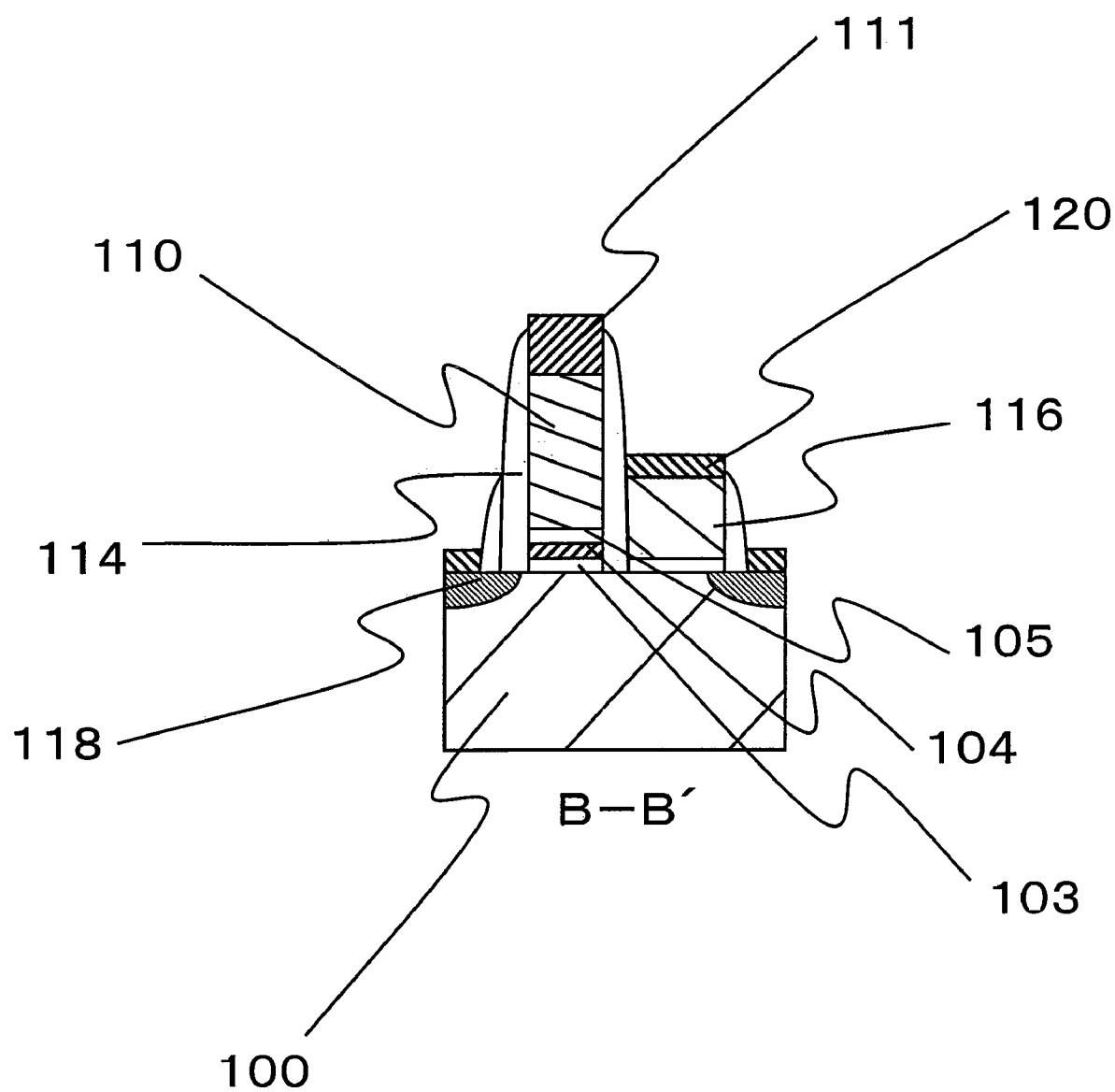
FIG. 32 is a cross-sectional view taken along the line B-B' in FIG. 30.
Figure 33:
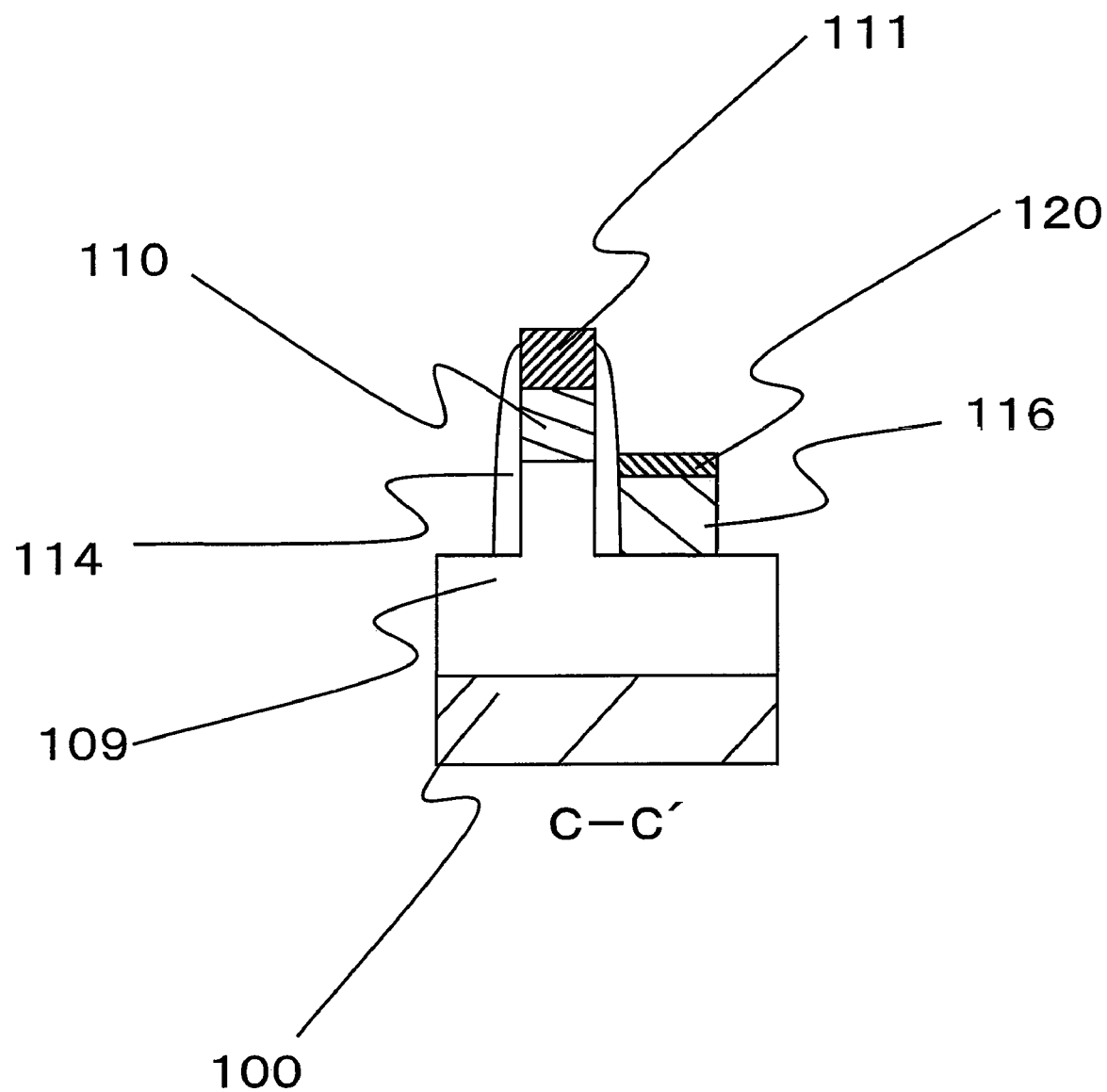
FIG. 33 is a cross-sectional view taken along the line C-C' in FIG. 30.
Figure 34:
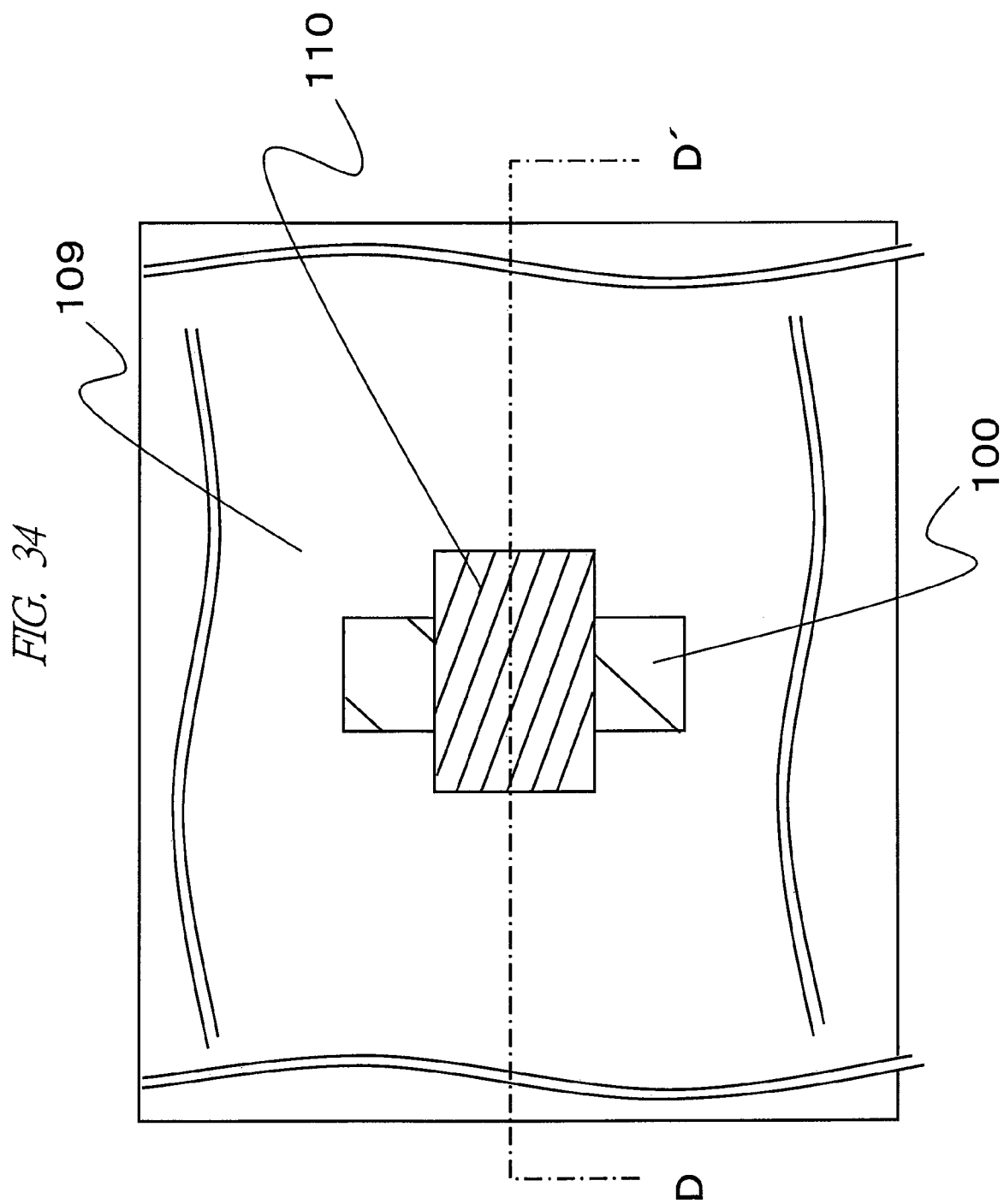
FIG. 34 is a plan view showing the principal part of a peripheral circuit region of the nonvolatile semiconductor integrated storage device according to the third embodiment of the present invention.
Figure 35:
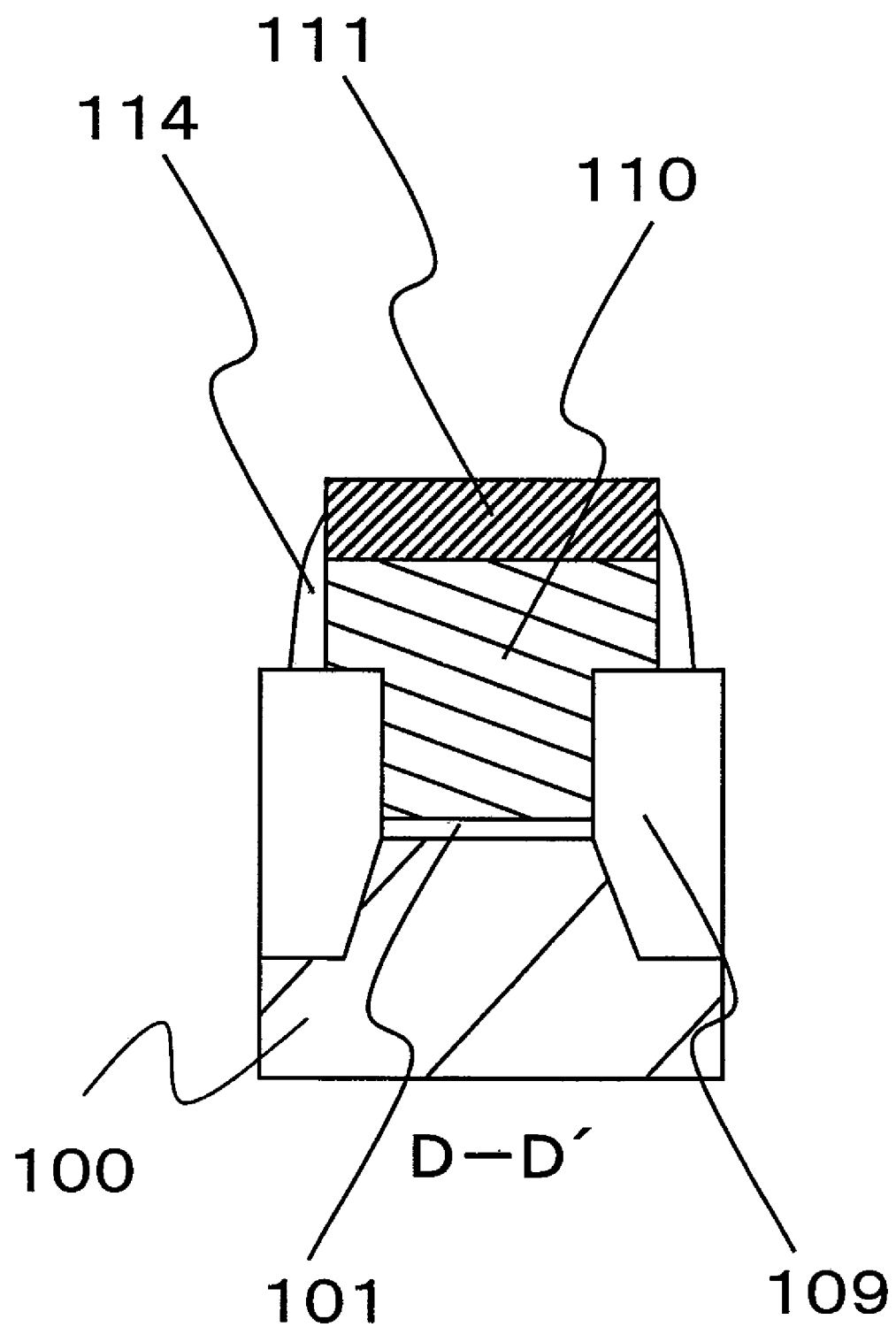
FIG. 35 is a cross-sectional view taken along the line D-D' in FIG. 34.

FIG. 30 is a plan view of a part of a semiconductor substrate showing an example of a nonvolatile semiconductor storage device according to the third embodiment in the same manner as FIG. 4 of the first embodiment described above. FIG. 31, FIG. 32 and FIG. 33 are cross-sectional views of the semiconductor substrate each taken along the lines A-A', B-B' and C-C' in FIG. 30. Also, FIG. 34 is a plan view showing an example of the peripheral circuit region of the same device, and FIG. 35 is a cross-sectional view taken along the line D-D' in FIG. 34. More specifically, the regions represented by the lines A-A', B-B' and C-C' correspond to the cross-sectional views of the memory cell region and the region represented by the line D-D' corresponds to the cross-sectional view of the peripheral circuit region. The difference between the third embodiment and the first embodiment lies in that the memory gate electrodes are united by the polysilicon film at a position higher than the upper surface of the selection gate electrode in the element isolation region. Accordingly, the capacitance between the selection transistor and the memory transistor can be further reduced compared with the first embodiment, and the operation speed can be further increased.

FIG. 36 to FIG. 41 are partial cross-sectional views of a semiconductor substrate showing a manufacturing method of the nonvolatile semiconductor storage device according to the third embodiment. In the figures showing the manufacturing method, the description will be made separately for each of the memory cell region and the peripheral circuit region. The lines A-A' to D-D' correspond to the lines A-A' to D-D' in FIG. 30 and FIG. 34. Note that, since the process from FIG. 10 to FIG. 20 is the same as that of the first embodiment, the description thereof is omitted here.

Figure 36:
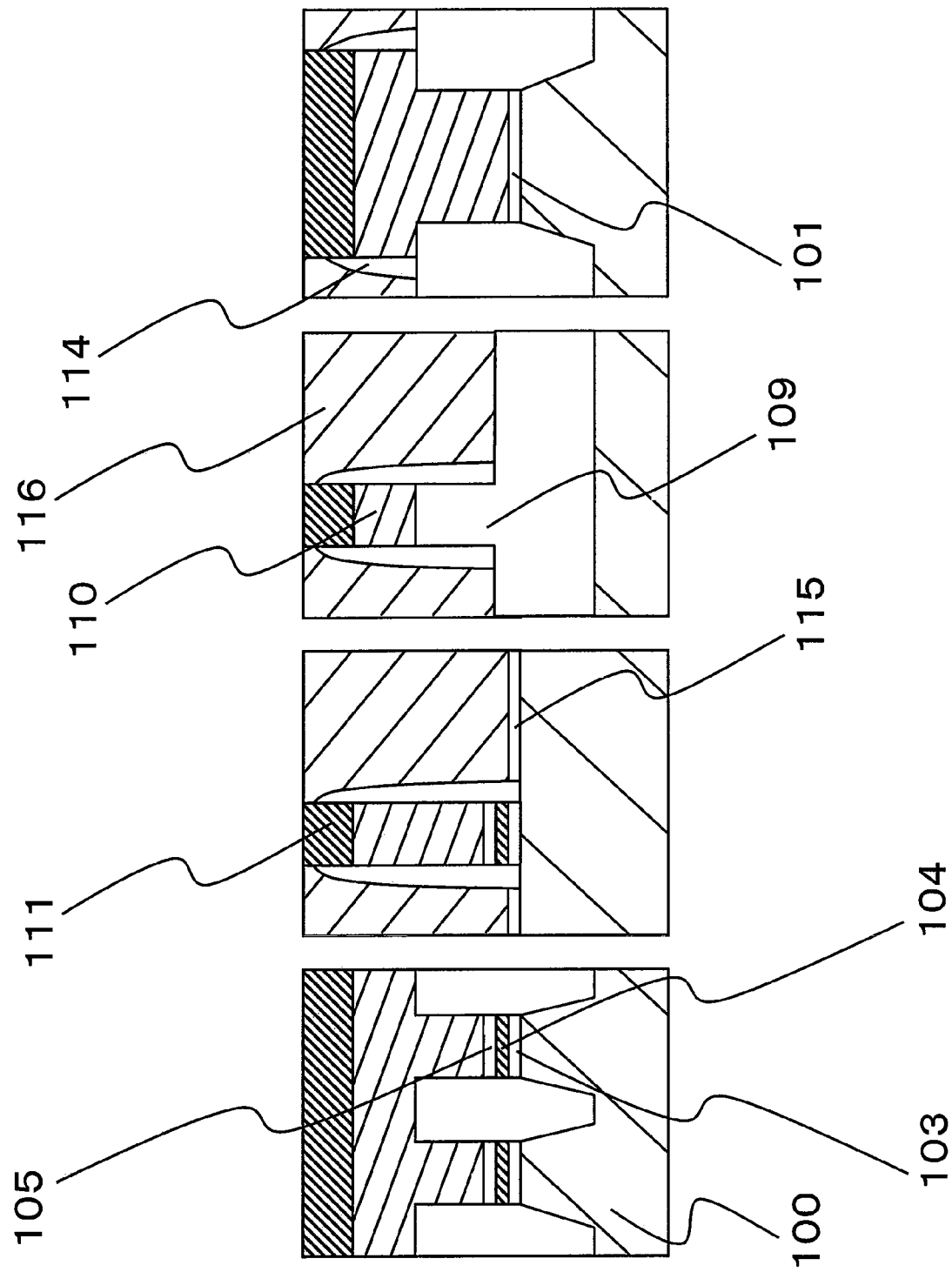
FIG. 36 is a cross-sectional view showing a manufacturing method in the regions including a memory cell and a peripheral circuit of the nonvolatile semiconductor integrated storage device according to the third embodiment of the present invention.
Figure 37:
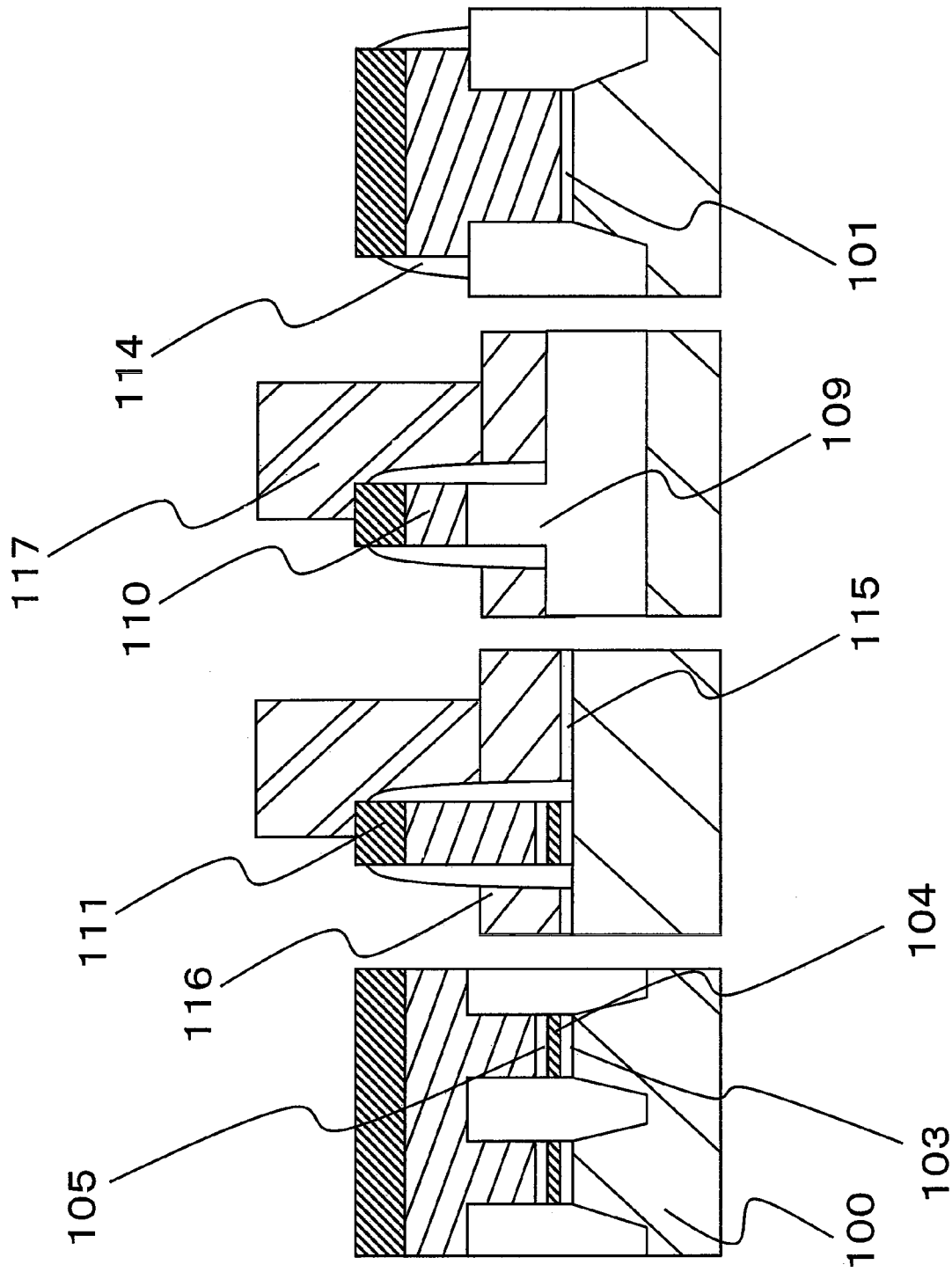
FIG. 37 is a cross-sectional view showing the manufacturing method of the nonvolatile semiconductor integrated storage device continued from FIG. 36.
Figure 38:
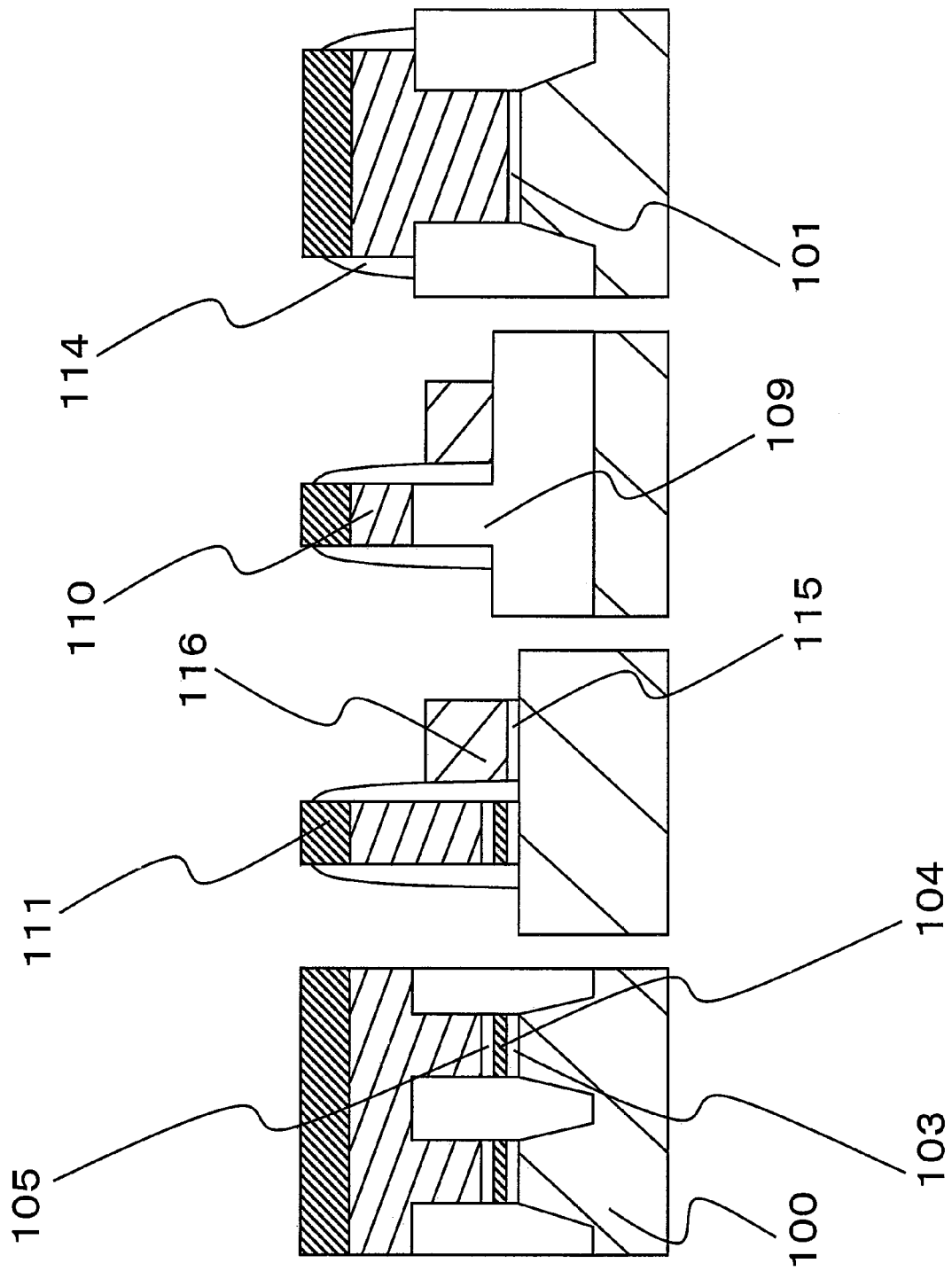
FIG. 38 is a cross-sectional view showing the manufacturing method of the nonvolatile semiconductor integrated storage device continued from FIG. 37.
Figure 39:
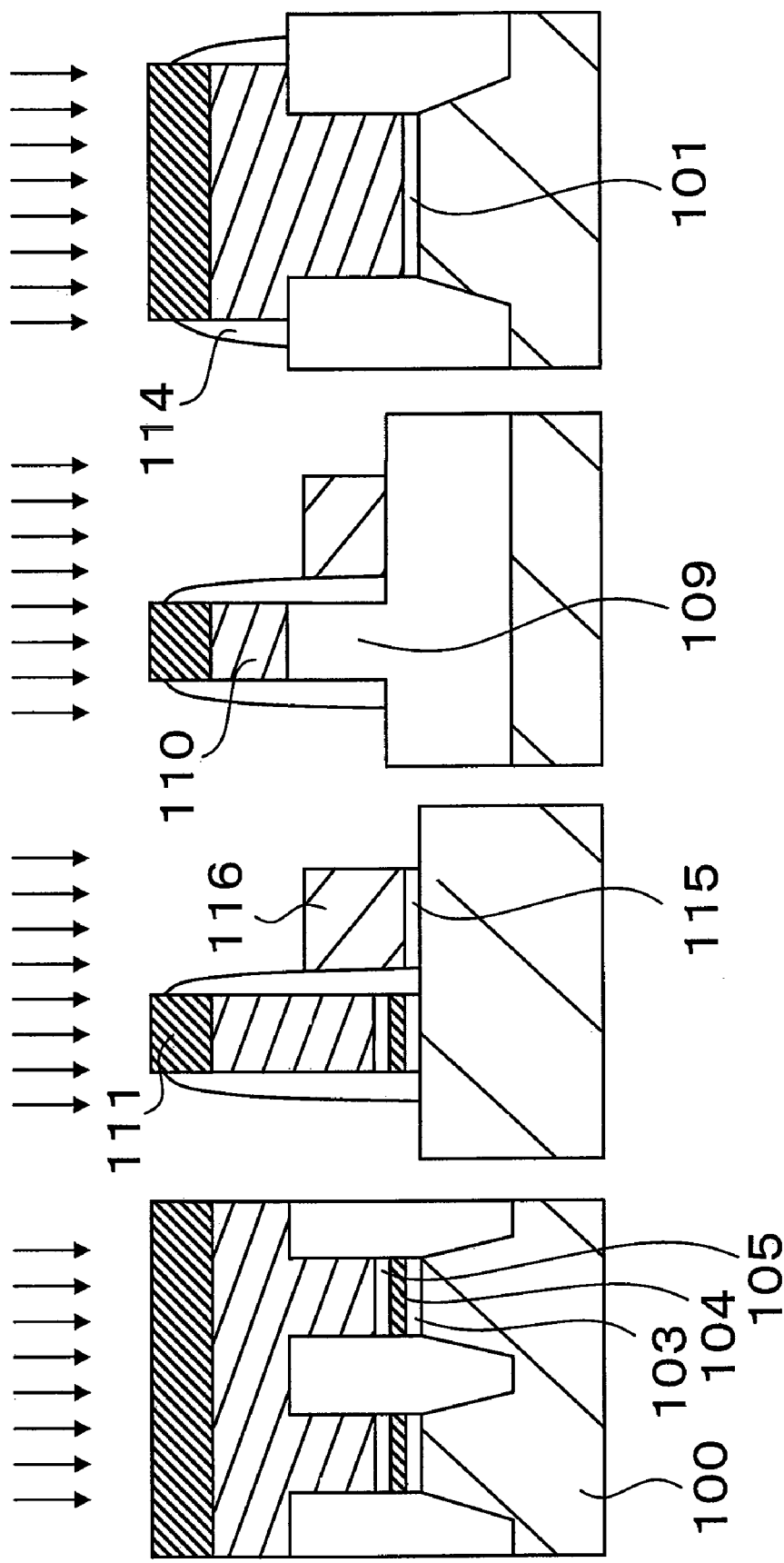
FIG. 39 is a cross-sectional view showing the manufacturing method of the nonvolatile semiconductor integrated storage device continued from FIG. 38.

The step continued from that of FIG. 20 is shown in FIG. 36 and FIG. 36 corresponds to FIG. 21. Then, after forming the structure shown in FIG. 36, a polysilicon film 116 is etched back so that the position of the upper surface of the polysilicon film 116 to be the selection gate electrode is located at a position lower than that of the bottom surface of a polysilicon film 110 which unites the memory gate electrodes (FIG. 37). By this means, the overlapping amount of the memory gate electrode and the selection gate electrode in the horizontal direction in the element isolation region can be eliminated, and the capacitance between the memory gate electrode and the selection gate electrode can be reduced. Further, a photoresist 117 for patterning the selection gate electrode is deposited and the photoresist 117 is patterned into the pattern of the selection gate electrode.

Figure 40:
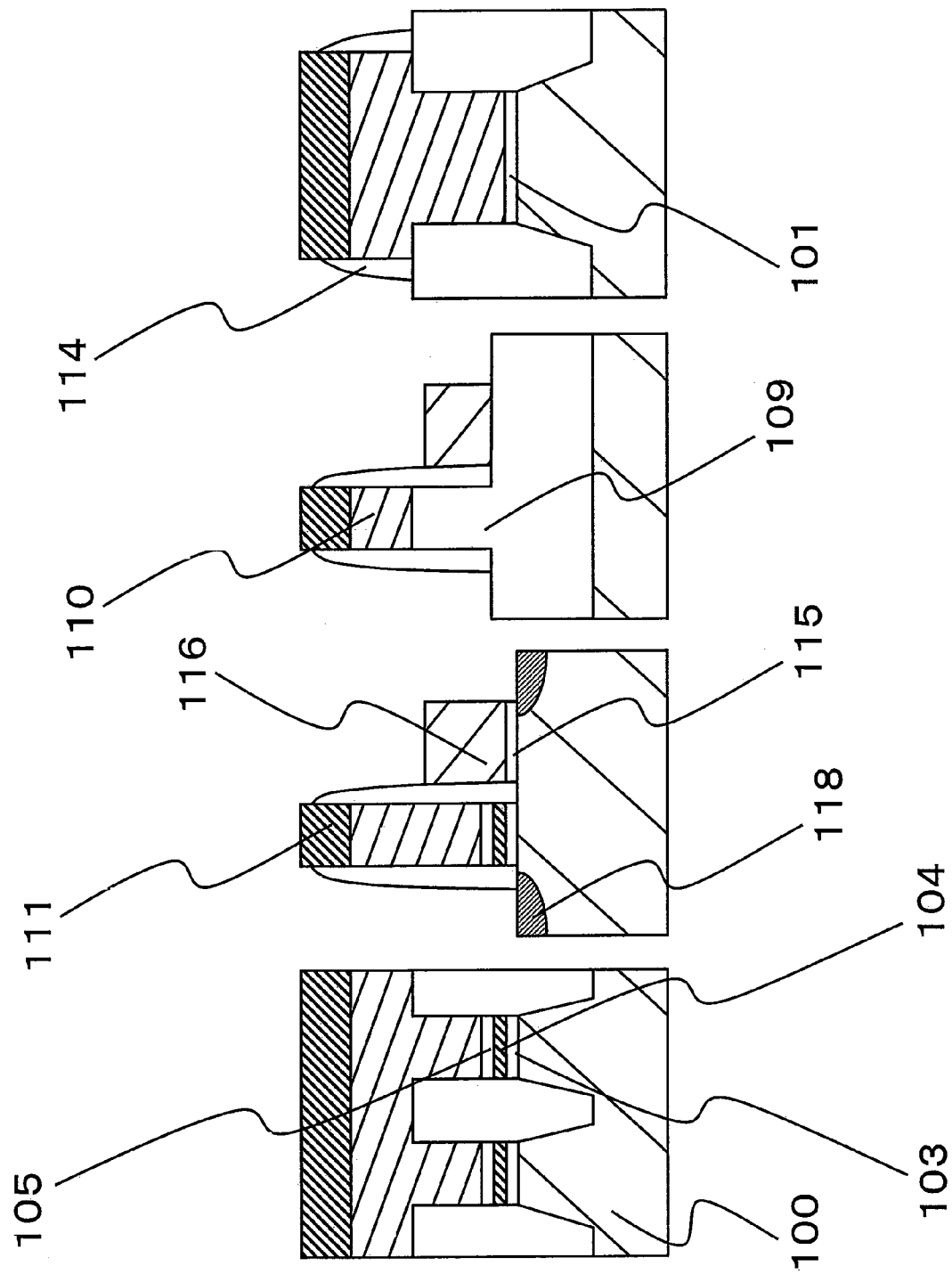
FIG. 40 is a cross-sectional view showing the manufacturing method of the nonvolatile semiconductor integrated storage device continued from FIG. 39.
Figure 41:
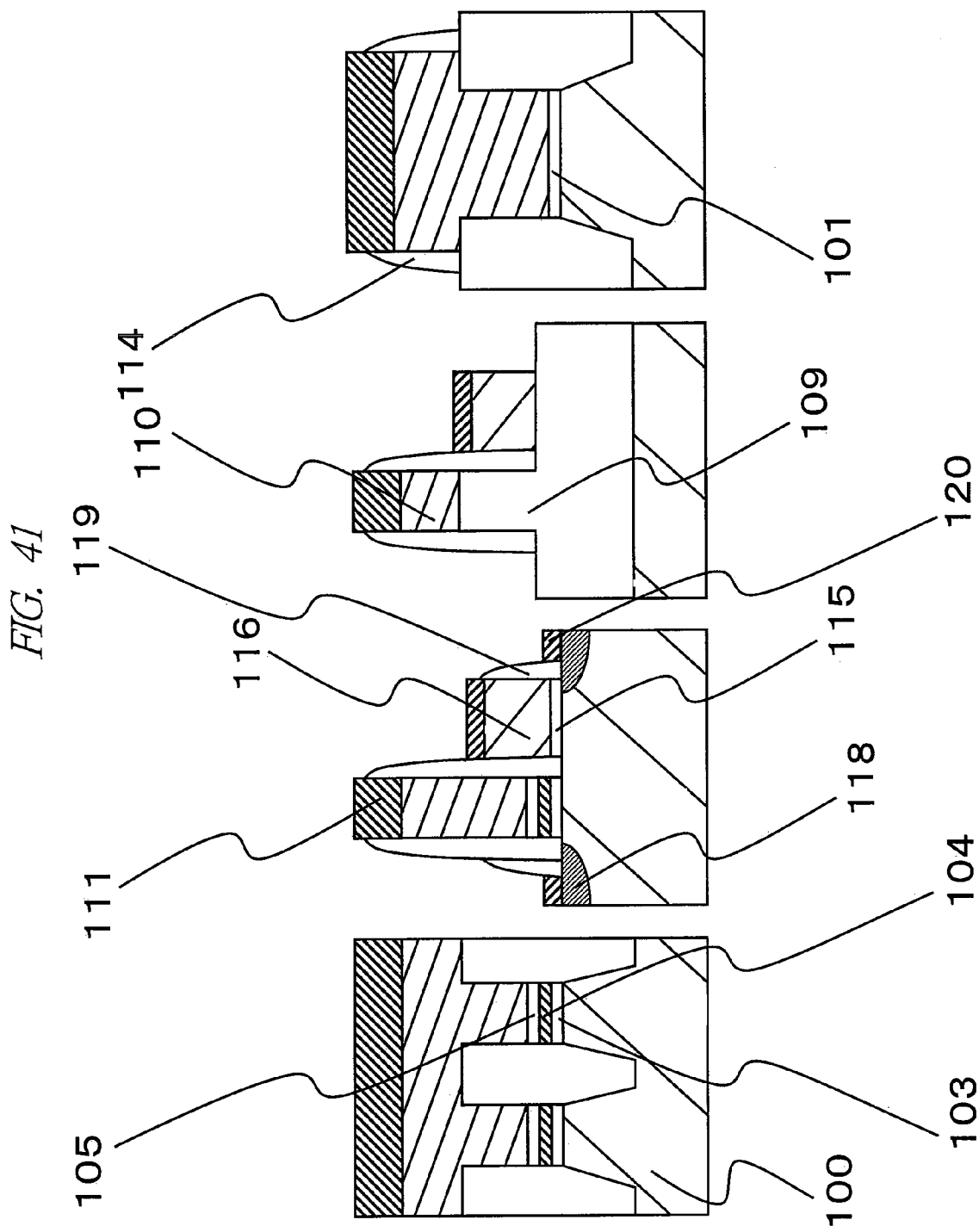
FIG. 41 is a cross-sectional view showing the manufacturing method of the nonvolatile semiconductor integrated storage device continued from FIG. 40.

Next, after processing the polysilicon film 116 into the shape of the selection gate electrode with using the photoresist 117 as a mask (FIG. 38), the ion implantation to form high-concentration impurity regions to be the source electrodes and the drain electrodes of the p MOS and the n MOS is performed (FIG. 39) and diffusion layers 118 are formed (FIG. 40). Subsequently, sidewalls are formed from a silicon oxide film 119 on the sidewalls of the selection gate electrode, and the selection gate electrode and the diffusion layers 118 are silicided with cobalt (FIG. 41).

Thereafter, though not shown, after depositing a wiring interlayer film, contact holes for connecting to the memory transistor, the selection transistor and the peripheral MOS transistor are formed. Subsequently, a metal film is deposited on the interlayer insulating film and patterned to form wirings. By this means, the nonvolatile semiconductor storage device is completed.

FIG. 27 shows the dependence on the thickness of the insulating film formed between the selection transistor and the memory transistor of the semiconductor storage device with respect to the capacitance between the selection transistor and the memory transistor of the semiconductor storage device manufactured through the process of the third embodiment, in which the memory cell of the third embodiment (c) is compared with the memory cell represented by (a) and the memory cell of the first embodiment (b). Note that the memory cell in which the position of the bottom surface of the memory gate is located at a position having almost equal height to the position of the upper surface of the selection gate electrode is used as the memory cell (c). As is apparent from FIG. 27, the capacitance between the gate electrodes can be further reduced compared with the memory cell (b). As described above, in the memory cell according to the third embodiment, compared with the memory cell according to the first embodiment, the position of the bottom surface of the memory gate electrode is designed to be located at a position equal to or higher than that of the upper surface of the selection gate electrode in the element isolation region. Accordingly, the capacitance between the gate electrodes can be further reduced and the time constant of the selection transistor can be further reduced. Therefore, the memory operation speed can be improved.

As described above, according to the present invention, the highly-reliable nonvolatile semiconductor integrated storage device capable of achieving high-speed operation can be provided.

Fourth Embodiment

Figure 42:
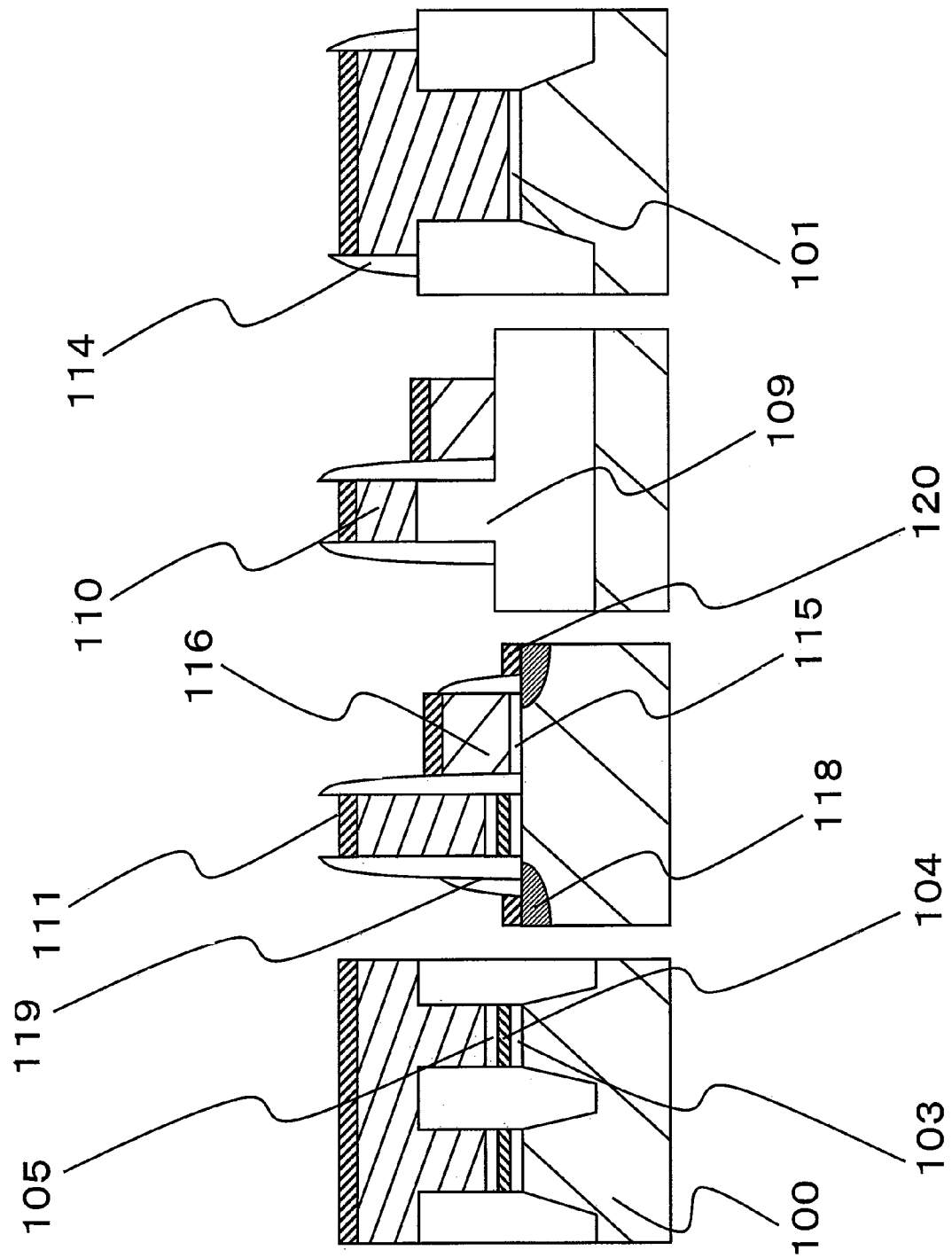
FIG. 42 is a cross-sectional view showing the principal part of the regions including a memory cell and a peripheral circuit of a nonvolatile semiconductor integrated storage device according to a fourth embodiment of the present invention.

FIG. 42 is a cross-sectional view showing a nonvolatile semiconductor integrated storage device according to the fourth embodiment. The difference between the memory cell structure according to the fourth embodiment and the memory cell structure according to the first and third embodiments lies in that the memory gate electrode is also silicided.

With respect to the manufacturing method, in FIG. 41, after removing the silicon nitride film 111 on the memory gate electrode by wet etching, the memory gate electrode is silicided with cobalt. By the cobalt silicidation, the resistance of the memory gate electrode can be reduced and the operation speed can be further increased compared with the third embodiment. Note that this method can be applied also to the first embodiment and the same effect can be obtained.

Fifth Embodiment

Figure 43:
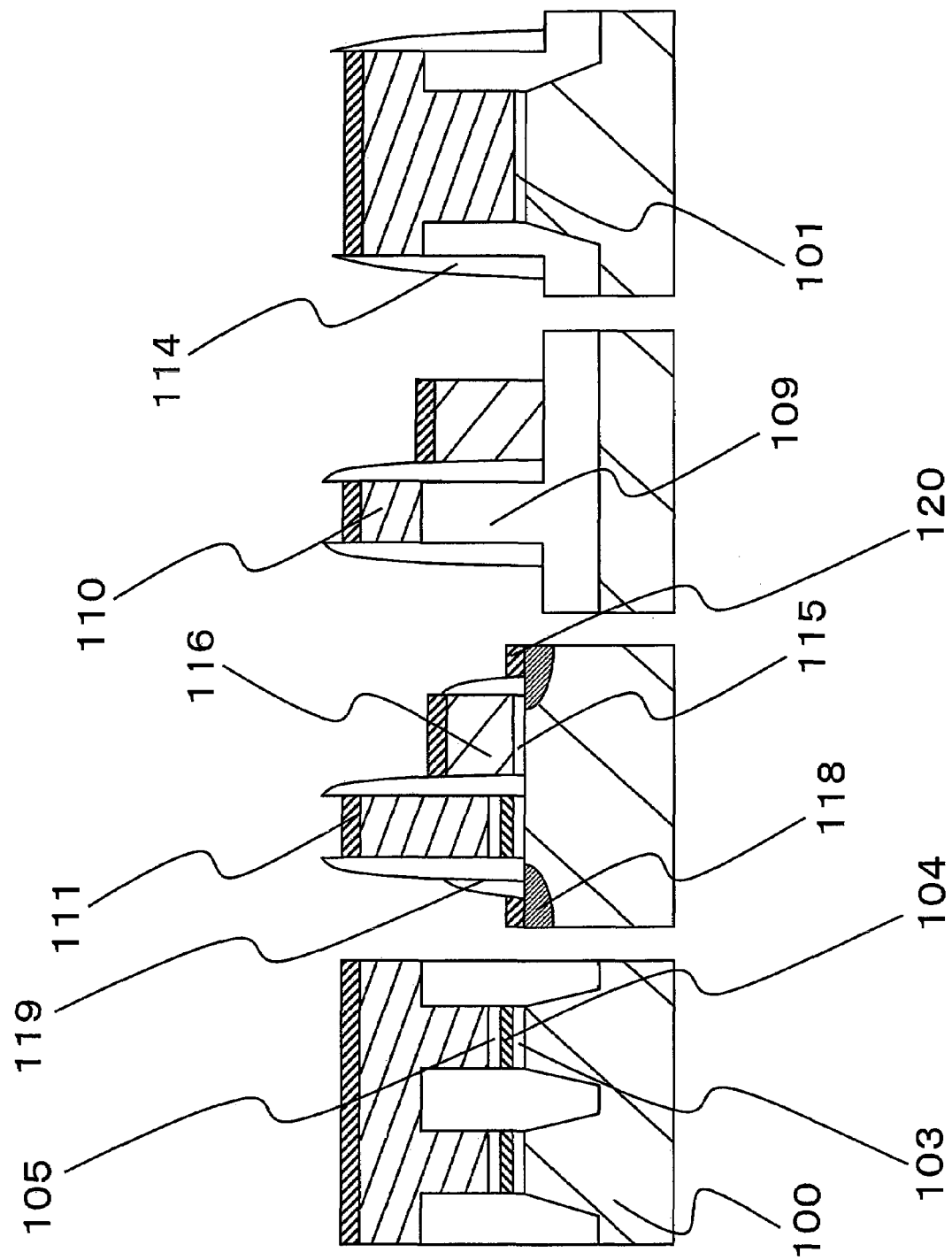
FIG. 43 is a cross-sectional view showing the principal part of the regions including a memory cell and a peripheral circuit of a nonvolatile semiconductor integrated storage device according to a fifth embodiment of the present invention.
Figure 44:
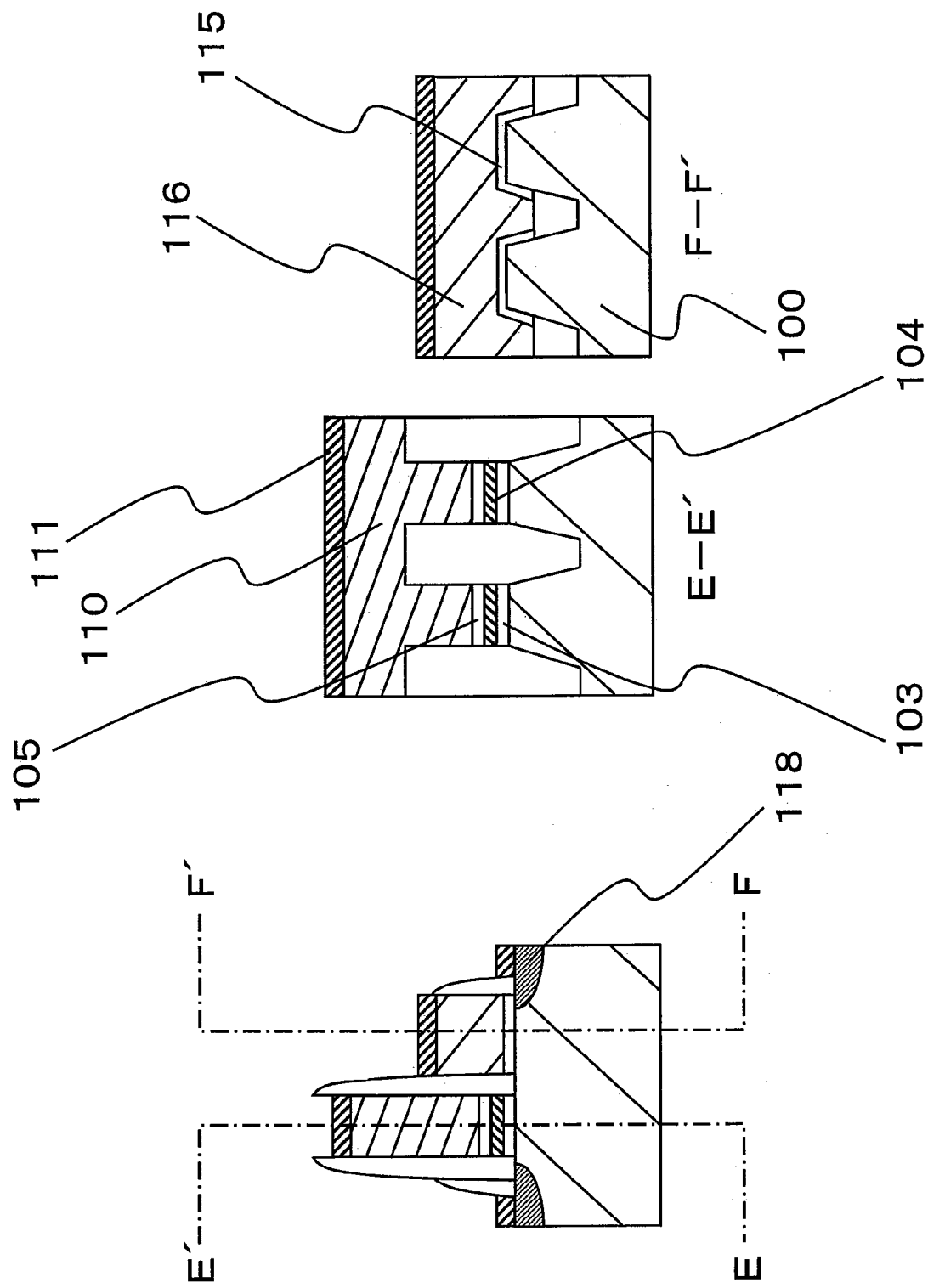
FIG. 44 is a cross-sectional view showing the principal part of the memory cell of the nonvolatile semiconductor integrated storage device according to the fifth embodiment of the present invention.

FIG. 43 is a cross-sectional view showing a nonvolatile semiconductor integrated storage device according to the fifth embodiment. FIG. 44 shows cross-sectional views taken along the lines E-E' and F-F' in the leftmost cross-sectional view (cross section taken along the line B-B') of FIG. 44. The difference between the memory cell structure of the fifth embodiment and that of the third embodiment lies in that the selection transistor is formed to have the Fin structure. More specifically, the selection transistor has the structure in which not only the upper-surface region but also the side-surface region of the element formation region can be used as the channel of the selection transistor.

The formation method thereof will be described. First, after forming the sidewalls from the silicon oxide film 014 on the sidewalls of the memory transistor in FIG. 20, the silicon oxide film 009 in the element isolation region is etched deeper than the upper surface of the silicon substrate 000, whereby the side surfaces of the element formation region are exposed and the element formation region is formed to have a convex portion. Thereafter, the device can be manufactured through the similar process continued from FIG. 21. Note that, although the process of forming the selection gate electrode of the third embodiment has been described in FIG. 44, this method can be applied also to the memory cells of the first and second embodiments and further to the memory cell of the fourth embodiment. In this case, in addition to the effects of the first, second, third and fourth embodiments, the effect increasing the current of the memory cell can be achieved because the side-surface regions of the element formation region can be used as the channel.

Sixth Embodiment

Figure 45:
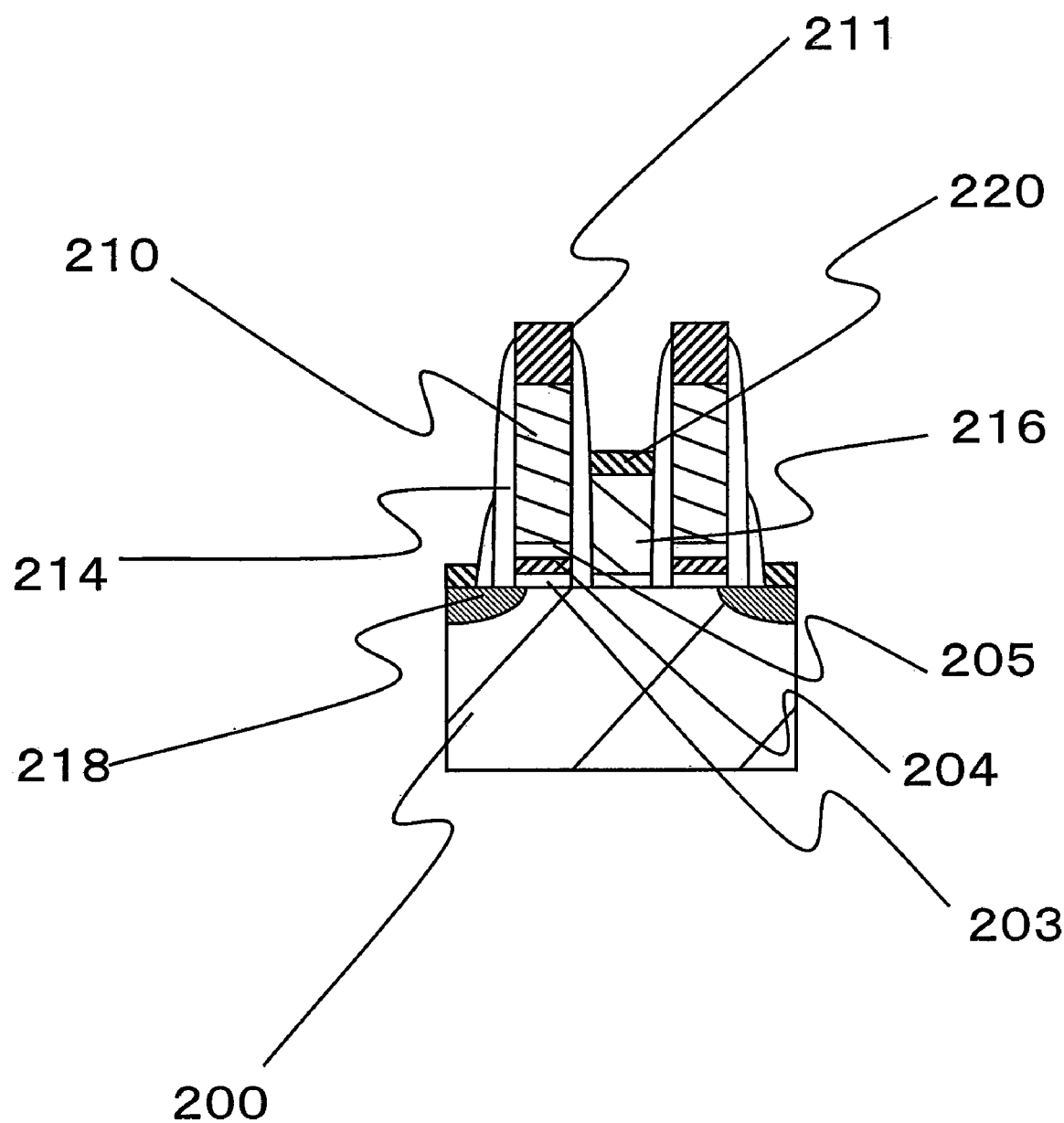
FIG. 45 is a cross-sectional view showing the principal part of a memory cell of a nonvolatile semiconductor integrated storage device according to a sixth embodiment of the present invention.

FIG. 46 to FIG. 54 are partial cross-sectional views showing the manufacturing method of a nonvolatile semiconductor storage device according to the sixth embodiment. The difference between the memory cell structure of the sixth embodiment and that of the first embodiment lies in that the so-called TWIN MONOS structure in which memory transistors are present on both sides of the selection transistor is employed as shown in FIG. 45. Hereinafter, the manufacturing method thereof will be described. Note that, since the process up to FIG. 17 is the same as that of the first embodiment, the description thereof is omitted here.

Figure 46:
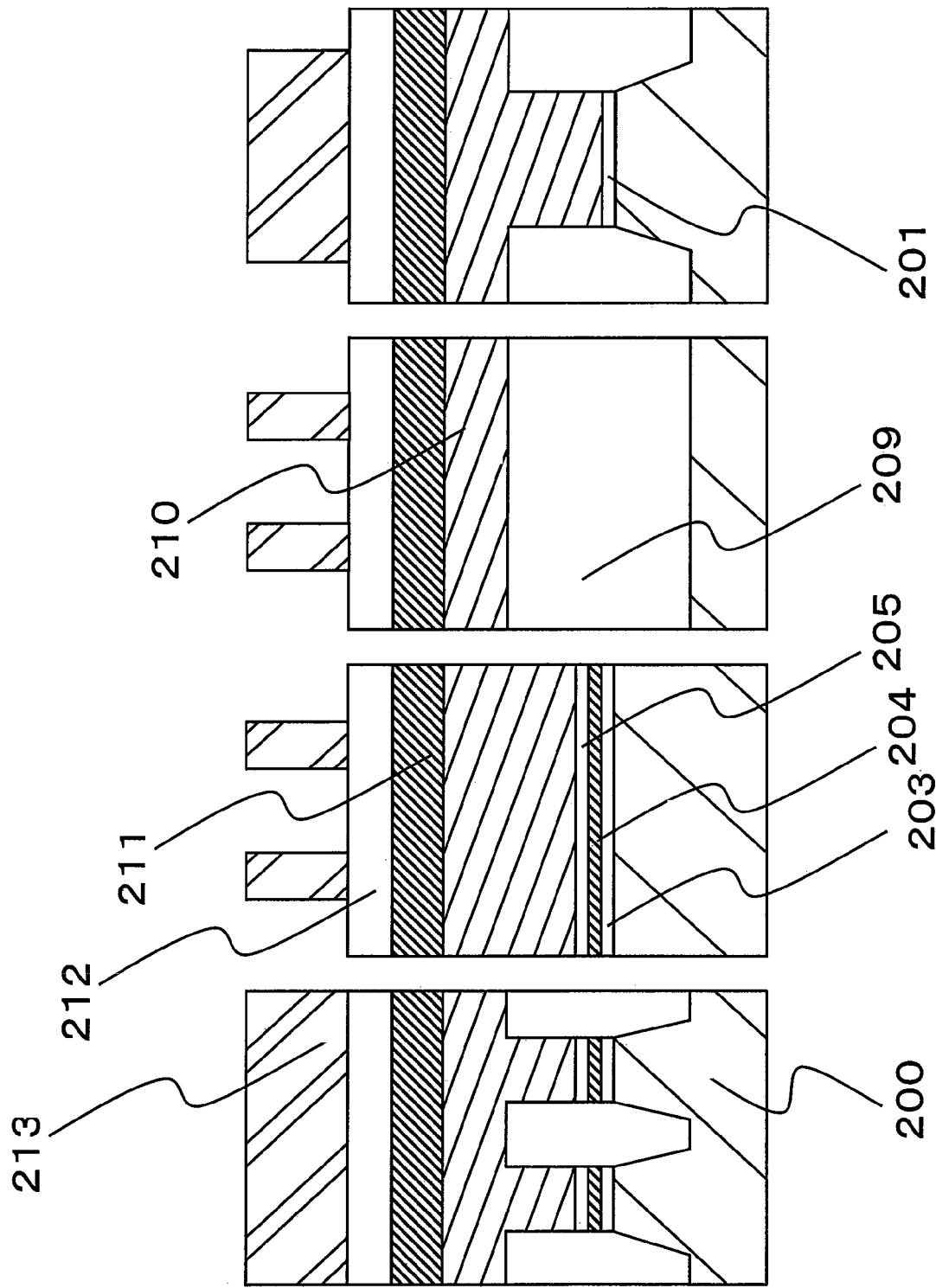
FIG. 46 is a cross-sectional view showing a manufacturing method in the regions including a memory cell and a peripheral circuit of the nonvolatile semiconductor integrated storage device according to the sixth embodiment of the present invention.

First, after the step shown in FIG. 17, a photoresist 213 is deposited on a silicon oxide film 212 and the patterns of the memory gate electrode are transferred to the photoresist 213 so as to have the patterns of the memory gate electrode (FIG. 46). In the sixth embodiment, in order to dispose two memory gate electrodes in one memory cell, the photoresist 213 is patterned so that the intervals between the patterns are set to about 160 to 200 nm.

Figure 47:
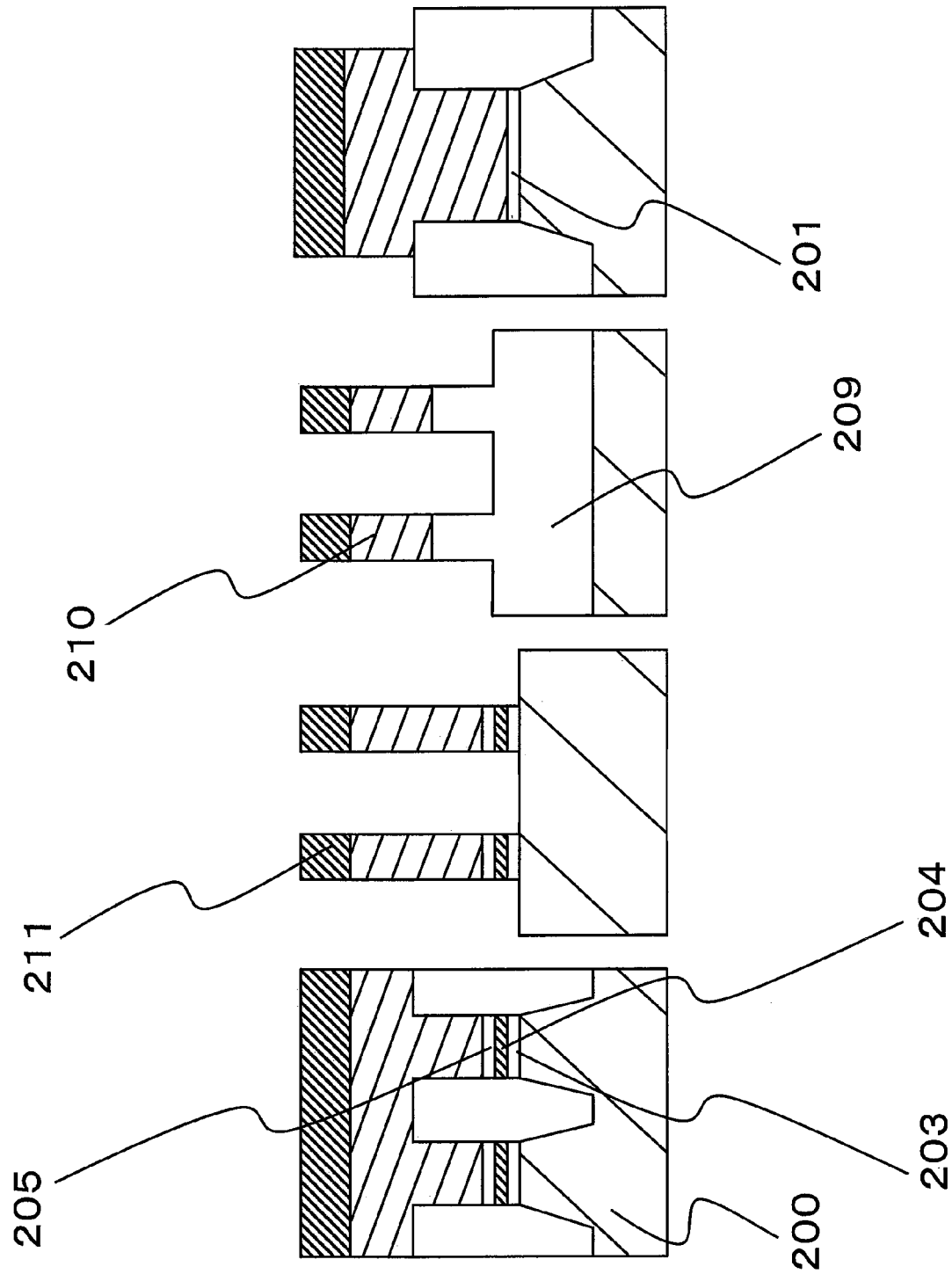
FIG. 47 is a cross-sectional view showing the manufacturing method of the nonvolatile semiconductor integrated storage device continued from FIG. 46.
Figure 48:
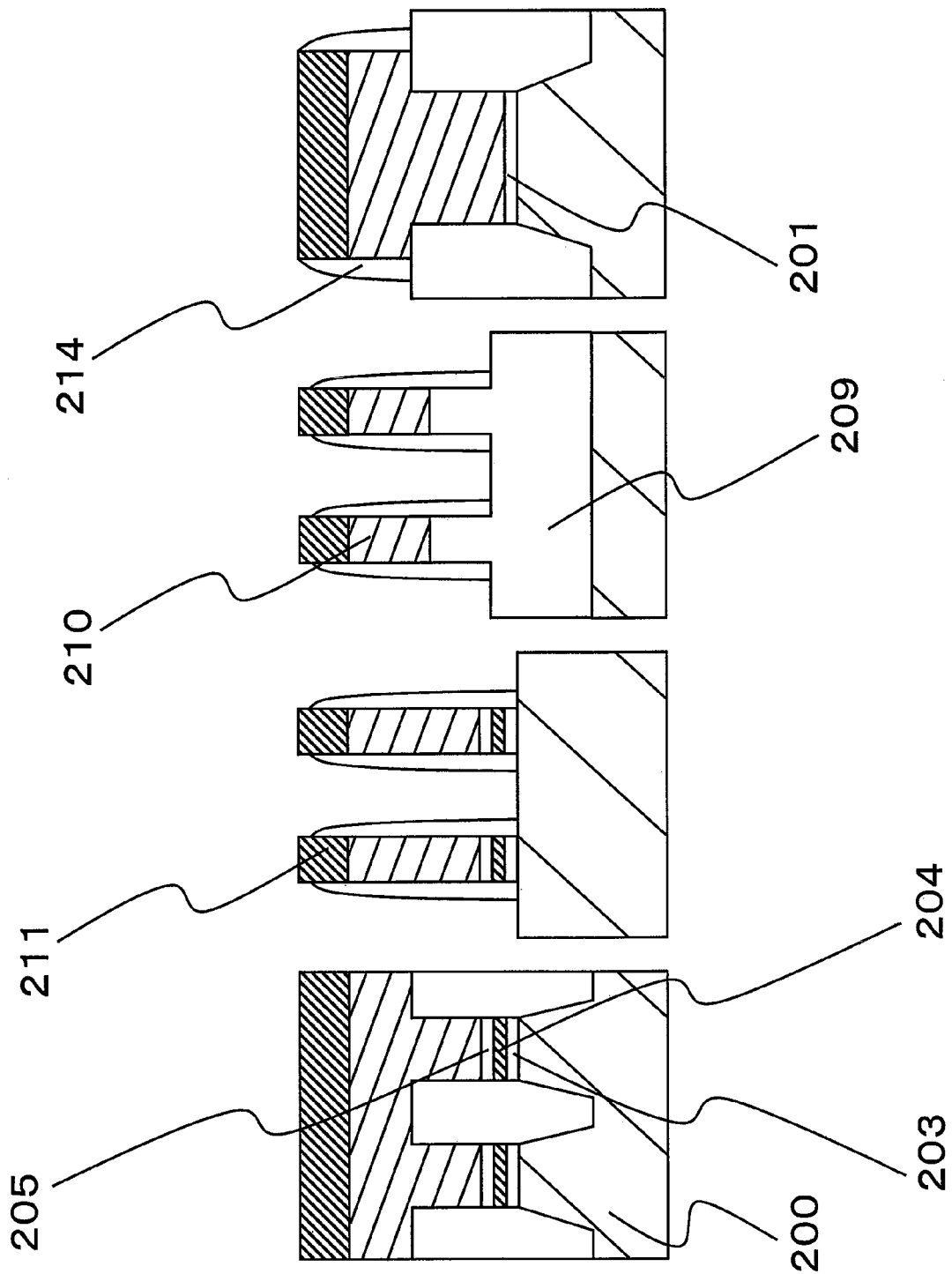
FIG. 48 is a cross-sectional view showing the manufacturing method of the nonvolatile semiconductor integrated storage device continued from FIG. 47.
Figure 49:
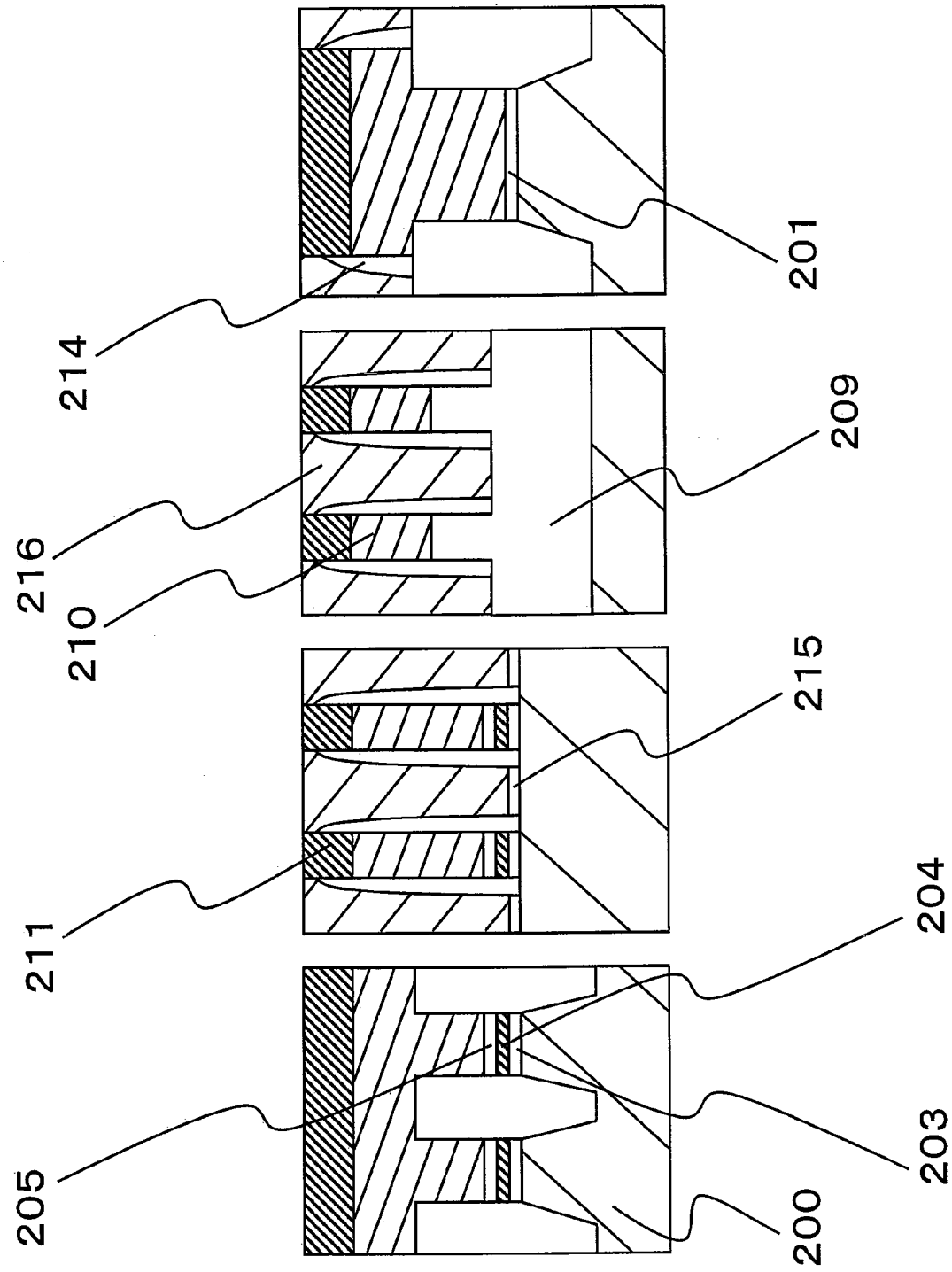
FIG. 49 is a cross-sectional view showing the manufacturing method of the nonvolatile semiconductor integrated storage device continued from FIG. 48.
Figure 50:
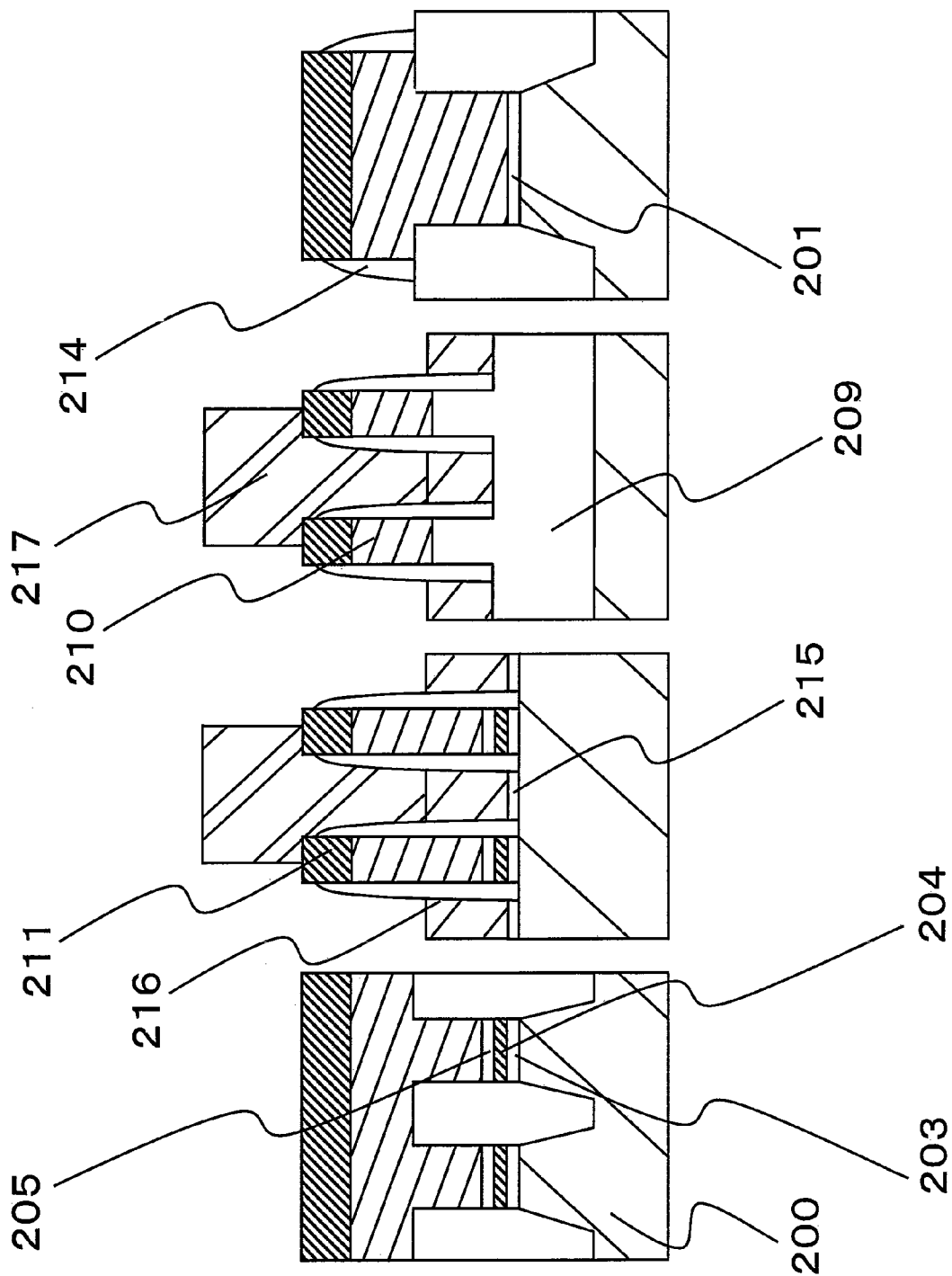
FIG. 50 is a cross-sectional view showing the manufacturing method of the nonvolatile semiconductor integrated storage device continued from FIG. 49.
Figure 51:
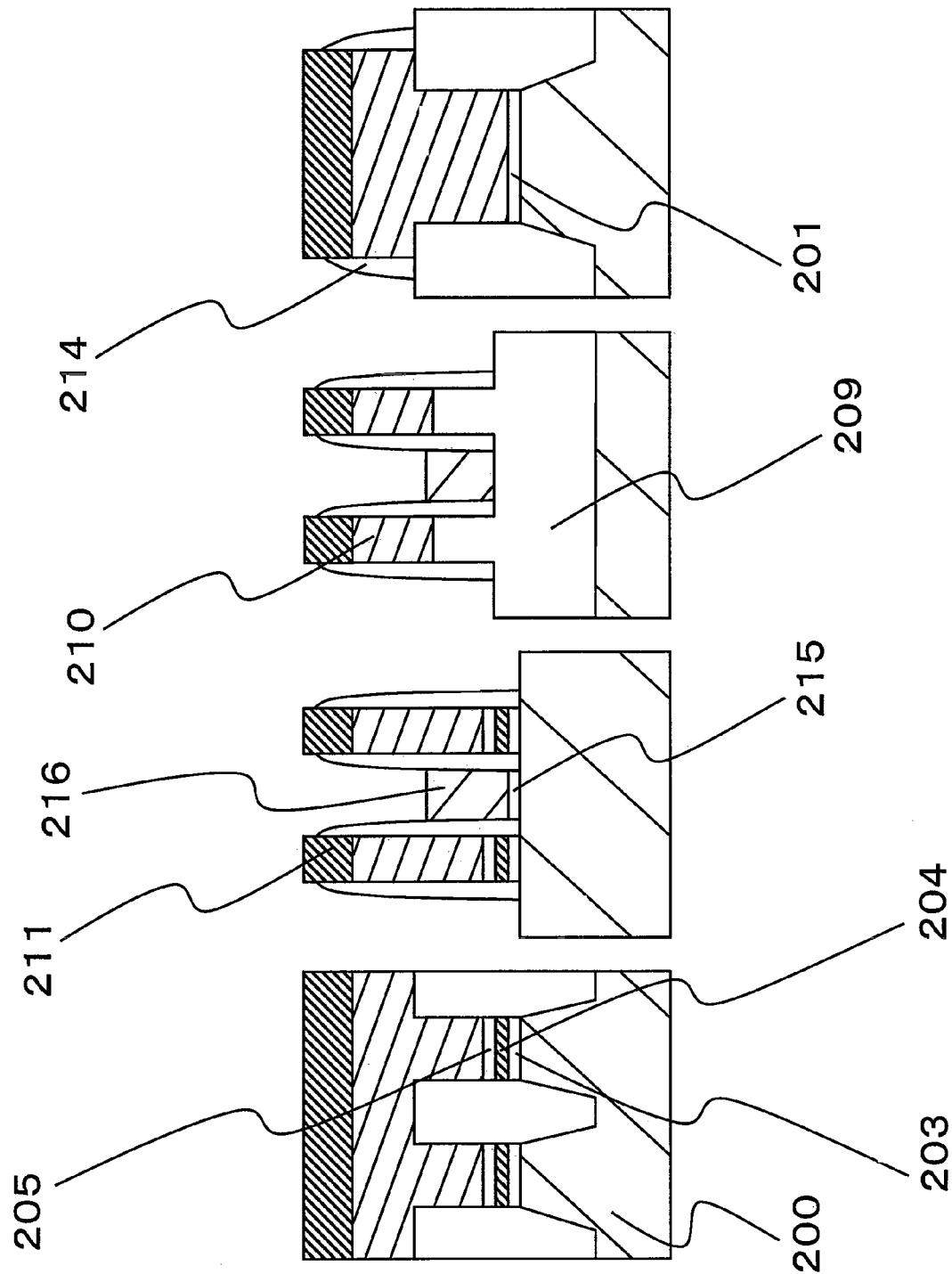
FIG. 51 is a cross-sectional view showing the manufacturing method of the nonvolatile semiconductor integrated storage device continued from FIG. 50.
Figure 52:
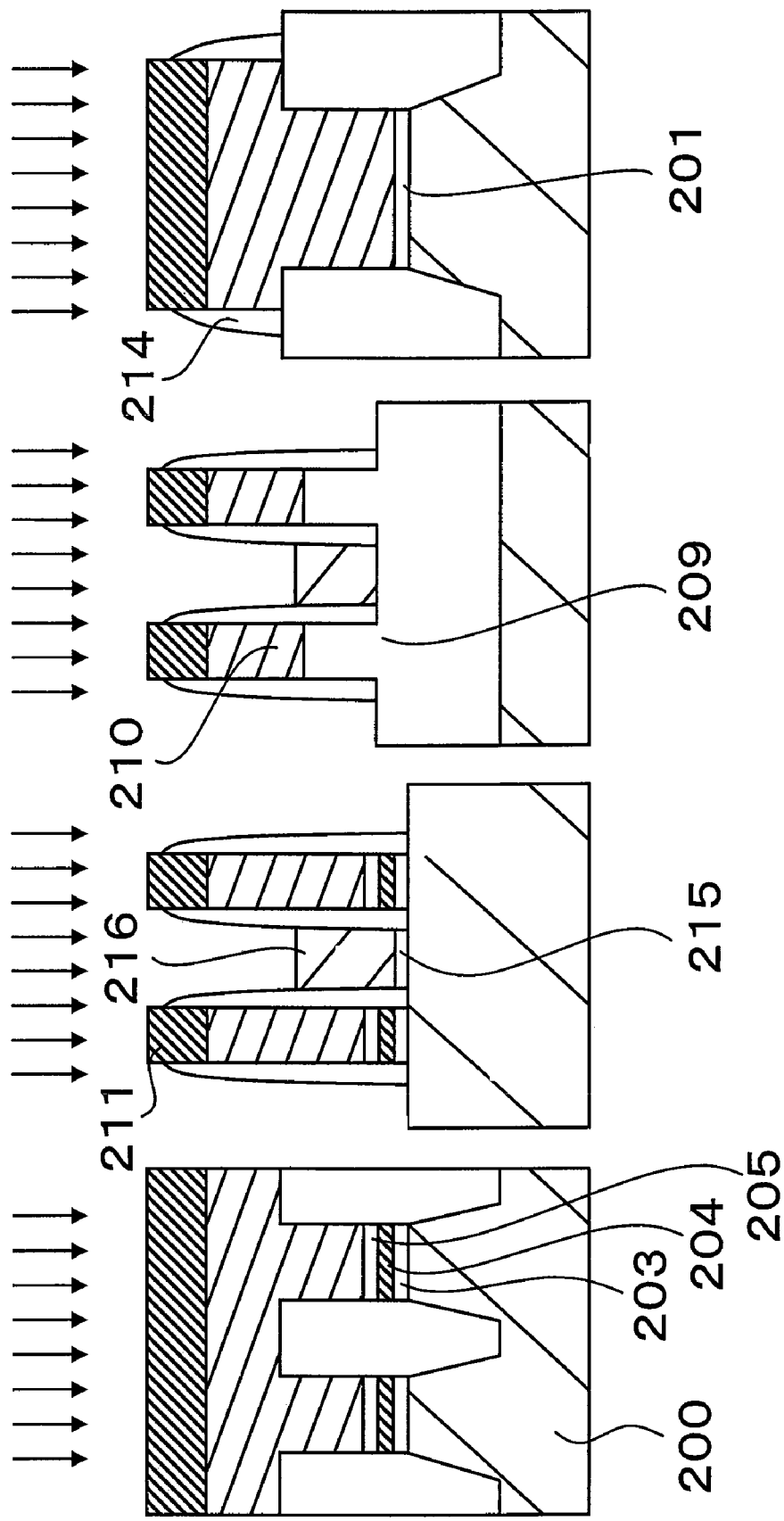
FIG. 52 is a cross-sectional view showing the manufacturing method of the nonvolatile semiconductor integrated storage device continued from FIG. 51.

Next, the memory gate electrode and the gate electrode of the peripheral MOS transistor are patterned, and the dry etching using the silicon oxide film 212 as a mask is performed to form both the gate electrodes (FIG. 47). At this time, the silicon oxide film 212 is appropriately removed. Subsequently, the sidewalls for insulating the memory transistor and the selection transistor are formed from a silicon oxide film 214 (FIG. 48). Then, after forming a silicon oxide film 215 to be the gate insulating film of the selection transistor by thermal oxidation, a polysilicon film 216 to be the gate electrode of the selection transistor is deposited and then planarized by CMP (FIG. 49). Next, after a polysilicon film 216 to be the selection gate electrode is etched back to the position lower than the upper surface of the polysilicon film 210 which unites the memory gate electrodes, the selection gate electrode is patterned (FIG. 50).

Figure 53:
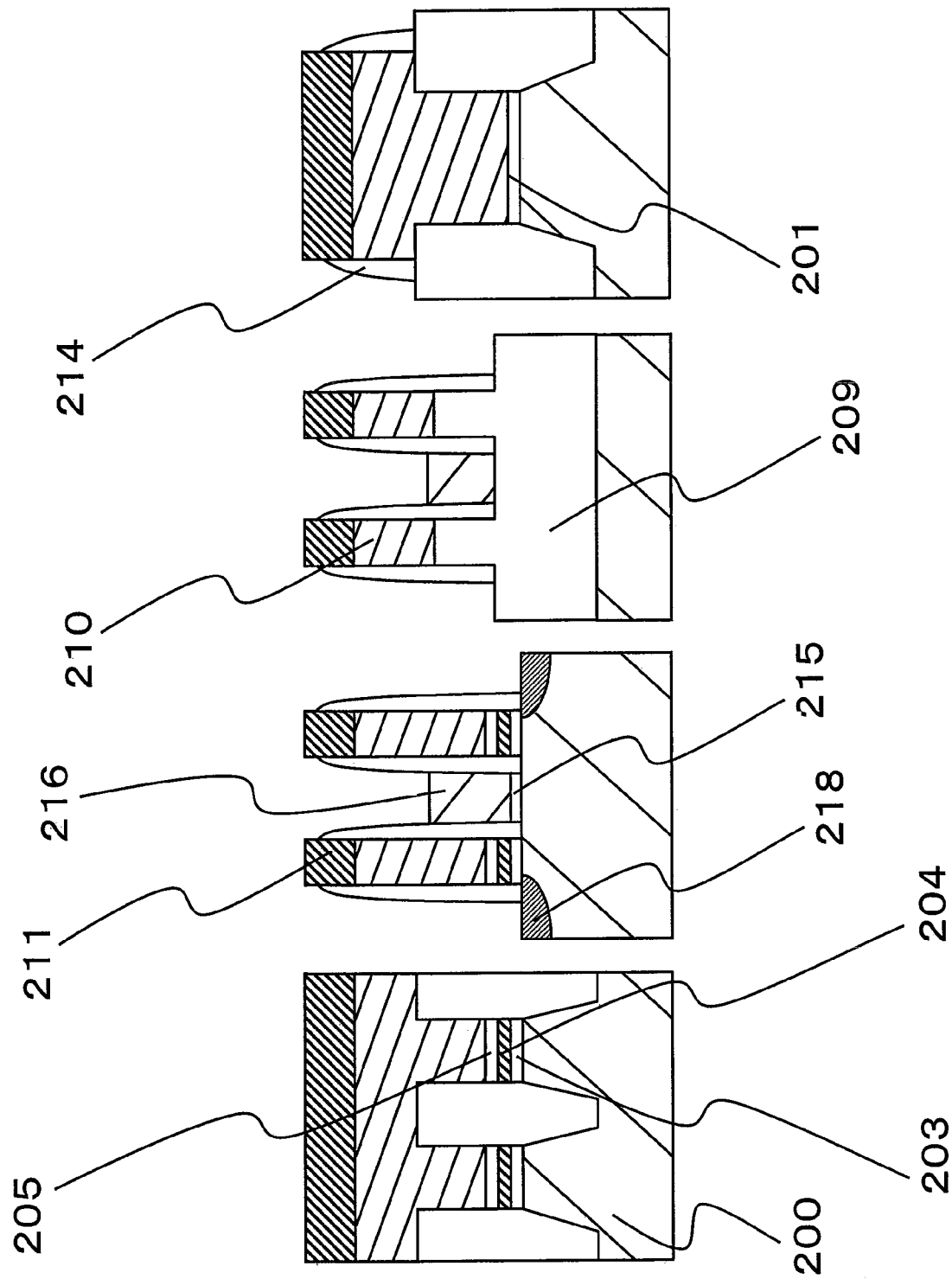
FIG. 53 is a cross-sectional view showing the manufacturing method of the nonvolatile semiconductor integrated storage device continued from FIG. 52.
Figure 54:
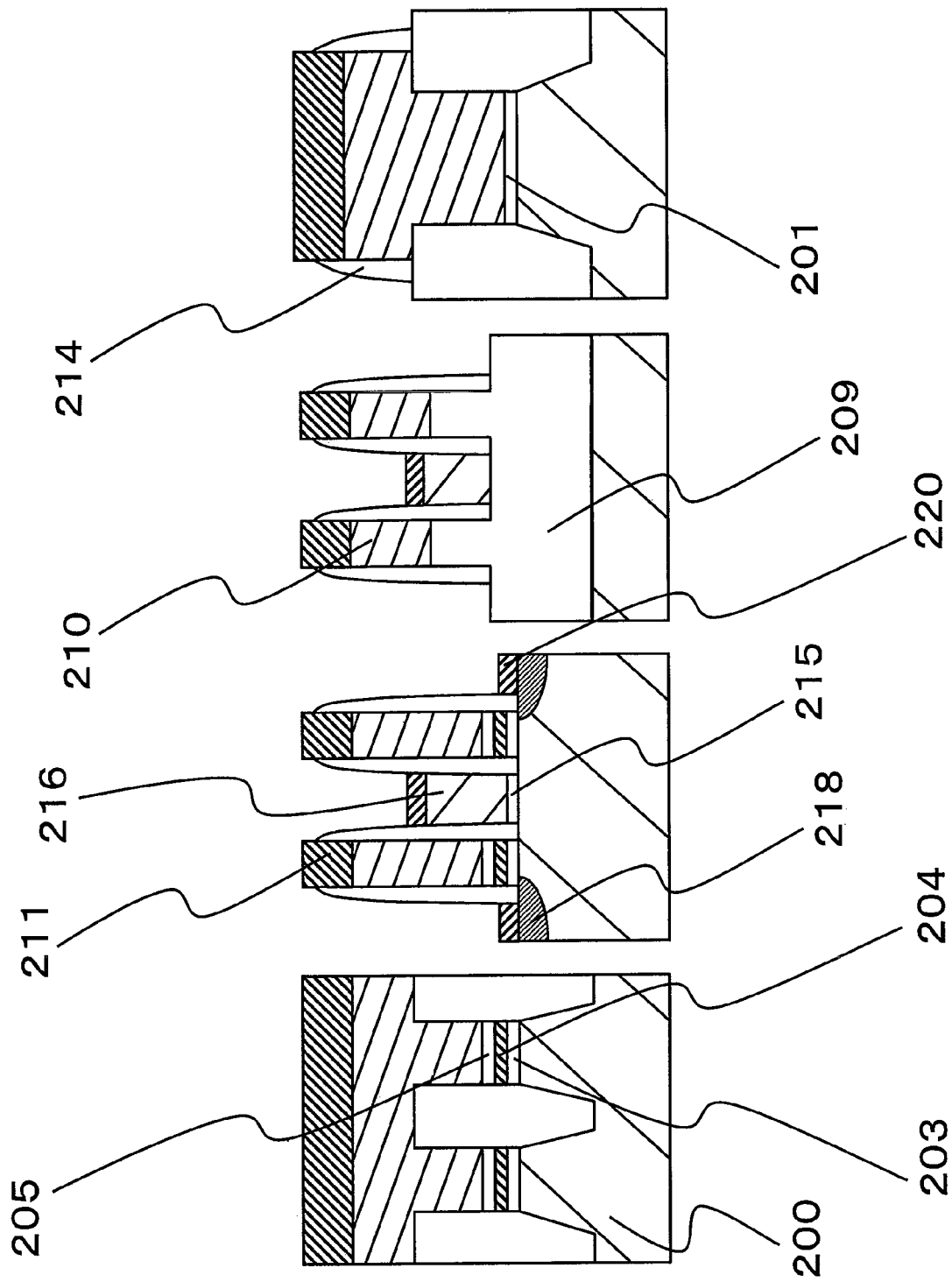
FIG. 54 is a cross-sectional view showing the manufacturing method of the nonvolatile semiconductor integrated storage device continued from FIG. 53.

Next, after forming the selection gate electrode (FIG. 51), ion implantation for forming high-concentration impurity regions to be the source regions and the drain regions of the n MOS and the p MOS is performed (FIG. 52) to form diffusion layers 218 (FIG. 53). Thereafter, the selection gate electrode and the diffusion layers 218 are silicided with cobalt (FIG. 54). Thereafter, though not shown, after depositing a wiring interlayer film, contact holes for connecting to the memory transistor, the selection transistor and the peripheral MOS transistor are formed. Subsequently, a metal film is deposited on the interlayer insulating film and patterned to form wirings. By this means, the nonvolatile semiconductor storage device is completed. Further, though not shown, by removing the silicon nitride film on the gate electrodes of the two memory transistors by wet etching in the same manner as that shown in FIG. 42 in the fourth embodiment, the memory gate electrode can be silicided. Further, by intentionally etching the silicon oxide film to be the element isolation region deeply when processing the memory transistor as shown in FIG. 43 and FIG. 44 in the fifth embodiment, the selection transistor can be formed to have the Fin structure. Also, needless to say, since the charge trapping layer formed between both memory gate electrodes and the element isolation insulating film in the element isolation region is removed, the same effect as that of first embodiment can be achieved. Therefore, also in the sixth embodiment, similar to the first to fifth embodiments, since the operation speed of the memory can be increased, and at the same time, the disturbance resistance of the memory cell can be improved, the high-performance semiconductor integrated storage device can be provided.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although the gate electrodes are formed of a polysilicon film in the present invention, the material of the gate electrode is not limited to a polysilicon film, and the gate electrode can be formed of a conductive material film. ¥082 The nonvolatile semiconductor storage device according to the present invention can be suitably used as a storage device for an embedded microcomputer applied to in-vehicle systems and home appliances and a storage device for compact mobile information devices such as a mobile PC and a digital still camera.

What is claimed is:

1. A nonvolatile semiconductor storage device, comprising:
a plurality of element isolation regions formed in a semiconductor substrate and extending in a first direction;
an element formation region formed between the plurality of element isolation regions;
a pair of semiconductor regions to be a source and a drain formed in the element formation region;
a first gate electrode extending in a second direction which intersects with the first direction;
a second gate electrode extending in the second direction; and
a charge trapping layer formed between the semiconductor substrate and the first gate electrode,
wherein the first gate electrode is adjacent to the second gate electrode in the first direction,
wherein the first gate electrode and the second gate electrode are formed between the pair of semiconductor regions,
wherein the charge trapping layer is formed only in a region where the element formation region and the first gate electrode intersect,
wherein information is written or erased by injecting hot electrons or hot holes into the charge trapping layer, and
wherein capacitance per unit area in opposed surfaces of the first gate electrode and the second gate electrode in the element isolation region is smaller than a capacitance per unit area in opposed surfaces of the first gate electrode and the second gate electrode in the element formation region.

2. The nonvolatile semiconductor storage device according to claim 1,
wherein a position of a bottom surface of the first gate electrode in the element isolation region is located at a position higher than that of a bottom surface of the second gate electrode in the element isolation region.

3. The nonvolatile semiconductor storage device according to claim 2,
wherein the position of the bottom surface of the first gate electrode in the element isolation region is located at a position equal to or higher than that of an upper surface of the second gate electrode in the element isolation region.

4. The nonvolatile semiconductor storage device according to claim 1,
wherein the first gate electrode and the second gate electrode are adjacent to each other via an insulating film, and
no charge trapping layer is present in the insulating film.

5. The nonvolatile semiconductor storage device according to claim 1,
wherein a bottom surface of the second gate electrode in the element isolation region is located at a position lower than an upper surface of the semiconductor substrate.

6. The nonvolatile semiconductor storage device according to claim 1, further comprising:
a third gate electrode extending in the second direction; and
a charge trapping layer formed between the semiconductor substrate and the third gate electrode,
wherein the third gate electrode is adjacent to the second gate electrode in the first direction on an opposite side of the first gate electrode,
the third gate electrode is formed between the pair of semiconductor regions, and
the charge trapping layer is formed only in a region where the element formation region and the first gate electrode intersect and in a region where the element formation region and the third gate electrode intersect.

7. A nonvolatile semiconductor storage device, comprising:
a plurality of element isolation regions formed in a semiconductor substrate and extending in a first direction;

an element formation region formed between the plurality of element isolation regions;

a pair of semiconductor regions to be a source and a drain formed in the element formation region;

a first gate electrode extending in a second direction which intersects with the first direction;

a second gate electrode extending in the second direction; and a charge trapping layer formed between the semiconductor substrate and the first gate electrode, wherein the first gate electrode is adjacent to the second gate electrode in the first direction, wherein the first gate electrode and the second gate electrode are formed between the pair of semiconductor regions, wherein the charge trapping layer is formed only in a region where the element formation region and the first gate electrode intersect, wherein a position of a bottom surface of the first gate electrode in the element isolation region is located at a position higher than that of a bottom surface of the second gate electrode in the element isolation region, and wherein capacitance per unit area in opposed surfaces of the first gate electrode and the second gate electrode in the element isolation region is smaller than a capacitance per unit area in opposed surfaces of the first gate electrode and the second gate electrode in the element formation region.

8. The nonvolatile semiconductor storage device according to claim 7, wherein the position of the bottom surface of the first gate electrode in the element isolation region is located at a position equal to or higher than that of an upper surface of the second gate electrode in the element isolation region.

9. The nonvolatile semiconductor storage device according to claim 7, wherein the first gate electrode and the second gate electrode are adjacent to each other via an insulating film, and no charge trapping layer is present in the insulating film.

10. The nonvolatile semiconductor storage device according to claim 7, wherein a bottom surface of the second gate electrode in the element isolation region is located at a position lower than an upper surface of the semiconductor substrate.

11. The nonvolatile semiconductor storage device according to claim 7, further comprising:

a third gate electrode extending in the second direction; and a charge trapping layer formed between the semiconductor substrate and the third gate electrode, wherein the third gate electrode is adjacent to the second gate electrode in the first direction on an opposite side of the first gate electrode, the third gate electrode is formed between the pair of semiconductor regions, and the charge trapping layer is formed only in a region where the element formation region and the first gate electrode intersect and in a region where the element formation region and the third gate electrode intersect.

12. A nonvolatile semiconductor storage device, comprising:

a plurality of element isolation regions formed in a semiconductor substrate and extending in a first direction;

an element formation region formed between the plurality of element isolation regions;

a pair of semiconductor regions to be a source and a drain formed in the element formation region;

a first gate electrode extending in a second direction which intersects with the first direction;

a second gate electrode extending in the second direction; and a charge trapping layer formed between the semiconductor substrate and the first gate electrode, wherein a capacitance per unit area in opposed surfaces of the first gate electrode and the second gate electrode in the element isolation region is smaller than a capacitance per unit area in opposed surfaces of the first gate electrode and the second gate electrode in the element formation region.

13. A nonvolatile semiconductor storage device, comprising:

a plurality of element isolation regions formed in a semiconductor substrate and extending in a first direction;

an element formation region formed between the plurality of element isolation regions;

a pair of semiconductor regions to be a source and a drain formed in the element formation region;

a first gate electrode extending in a second direction which intersects with the first direction;

a second gate electrode extending in the second direction; and a charge trapping layer formed between the semiconductor substrate and the first gate electrode, wherein a capacitance per unit area in opposed surfaces of the first gate electrode and the second gate electrode in the element isolation region is smaller than a capacitance per unit area in opposed surfaces of the first gate electrode and the second gate electrode in the element formation region.

\* \* \* \* \*